US010593756B2

(12) United States Patent
Pillarisetty et al.

(10) Patent No.: US 10,593,756 B2
(45) Date of Patent: Mar. 17, 2020

(54) QUANTUM DOT ARRAY DEVICES

(71) Applicant: Intel Corporation, Santa Clara, CA (US)

(72) Inventors: Ravi Pillarisetty, Portland, OR (US); Jeanette M. Roberts, North Plains, OR (US); David J. Michalak, Portland, OR (US); Zachary R. Yoscovits, Beaverton, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/314,779

(22) PCT Filed: Aug. 12, 2016

(86) PCT No.: PCT/US2016/046674
§ 371 (c)(1),
(2) Date: Jan. 2, 2019

(87) PCT Pub. No.: WO2018/031027
PCT Pub. Date: Feb. 15, 2018

(65) Prior Publication Data
US 2019/0206991 A1    Jul. 4, 2019

(51) Int. Cl.
*H01L 29/06* (2006.01)
*H01L 29/165* (2006.01)
(Continued)

(52) U.S. Cl.
CPC .......... *H01L 29/0673* (2013.01); *B82Y 10/00* (2013.01); *H01L 29/12* (2013.01);
(Continued)

(58) Field of Classification Search
CPC . H01L 29/0673; H01L 29/122; H01L 29/125; H01L 29/127; H01L 29/42372;
(Continued)

(56) References Cited

U.S. PATENT DOCUMENTS 7,830,695 B1 * 11/2010 Moon ................ G01R 33/1284
257/14
2001/0013628 A1    8/2001 Tyagi et al.
(Continued)

FOREIGN PATENT DOCUMENTS

WO    2018031027 A1    2/2018
WO    2018057017 A1    3/2018

OTHER PUBLICATIONS

International Search Report and Written Opinion in International Patent Application No. PCT/US2016/053608 dated May 31, 2017, 8 pages.
(Continued)

*Primary Examiner* — David C Spalla
(74) *Attorney, Agent, or Firm* — Patent Capital Group

(57) ABSTRACT

Disclosed herein are quantum dot devices, as well as related computing devices and methods. For example, in some embodiments, a quantum dot device may include: a quantum well stack including a quantum well layer; a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and a second gate disposed above the quantum well stack, wherein the second gate extends between at least two of the first gates spaced apart in the first dimension, and the second gate extends between at least two of the first gates spaced apart in the second dimension.

20 Claims, 34 Drawing Sheets

(51) Int. Cl.
    *H01L 29/423*     (2006.01)
    *H01L 29/66*     (2006.01)
    *H01L 29/76*     (2006.01)
    *H01L 29/778*     (2006.01)
    *H01L 29/12*     (2006.01)
    *H01L 29/82*     (2006.01)
    *B82Y 10/00*     (2011.01)

(52) U.S. Cl.
    CPC .......... *H01L 29/127* (2013.01); *H01L 29/165* (2013.01); *H01L 29/423* (2013.01); *H01L 29/42376* (2013.01); *H01L 29/66* (2013.01); *H01L 29/66977* (2013.01); *H01L 29/7613* (2013.01); *H01L 29/7782* (2013.01); *H01L 29/82* (2013.01)

(58) Field of Classification Search
    CPC ............. H01L 29/4238; H01L 29/6697; H01L 29/72376
    See application file for complete search history.

(56) References Cited

U.S. PATENT DOCUMENTS

| | | | |
|---|---|---|---|
| 2002/0179897 A1* | 12/2002 | Eriksson ................ | B82Y 10/00 257/14 |
| 2003/0011659 A1 | 1/2003 | Ramaswami et al. | |
| 2004/0175881 A1 | 9/2004 | Forbes et al. | |
| 2009/0173936 A1 | 7/2009 | Bunyk | |
| 2012/0306011 A1 | 12/2012 | Lotfi et al. | |
| 2013/0087766 A1 | 4/2013 | Schenkel et al. | |
| 2013/0264617 A1 | 10/2013 | Joshi et al. | |
| 2015/0187766 A1 | 7/2015 | Basker et al. | |
| 2019/0130298 A1* | 5/2019 | Pioro-Ladriere ..... | H01L 29/122 |
| 2019/0206993 A1 | 7/2019 | Pillarisetty et al. | |
| 2019/0252377 A1* | 8/2019 | Clarke .................. | G06N 10/00 |

OTHER PUBLICATIONS

International Search Report and Written Opinion issued in PCT/US2016/046674 dated May 12, 2017; 9 pages.
"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010; Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110.(2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

(56) References Cited

OTHER PUBLICATIONS

"Single-electron Transistors fabricated with sidewall spacer patterning," Park et al., Superlattices and Microstructures 34 (2003) 231-239.

"Single-electron Transistors with wide operating temperature range," Dubuc et al., Applied Physics Letters 90, 113104 (2007) pp. 113104-1 through 3.

"Single-shot read-out of an individual electron spin in a quantum dot," Elzerman et al., Nature, vol. 430, Jul. 22, 2004, pp. 431-435.

"Suspending superconducting qubits by silicon micromachining," Chu et al., Department of Applied Physics, Yale University, Jun. 10. 2016, 10 pages.

"Single-charge tunneling in ambipolar silicon quantum dots," Müller, Filipp, Dissertation, University of Twente, Jun. 19, 2015, 148 pages.

"An addressable quantum dot qubit with fault-tolerant control-fidelity," Veldhorst et al., Nature Nanotechnology vol. 9, Dec. 2014, pp. 981-985.

\* cited by examiner

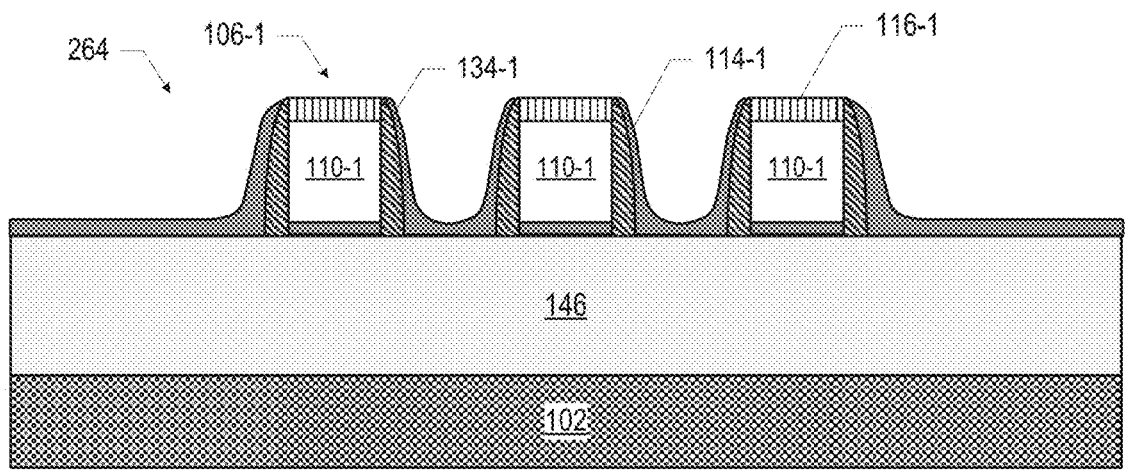
FIG. 41
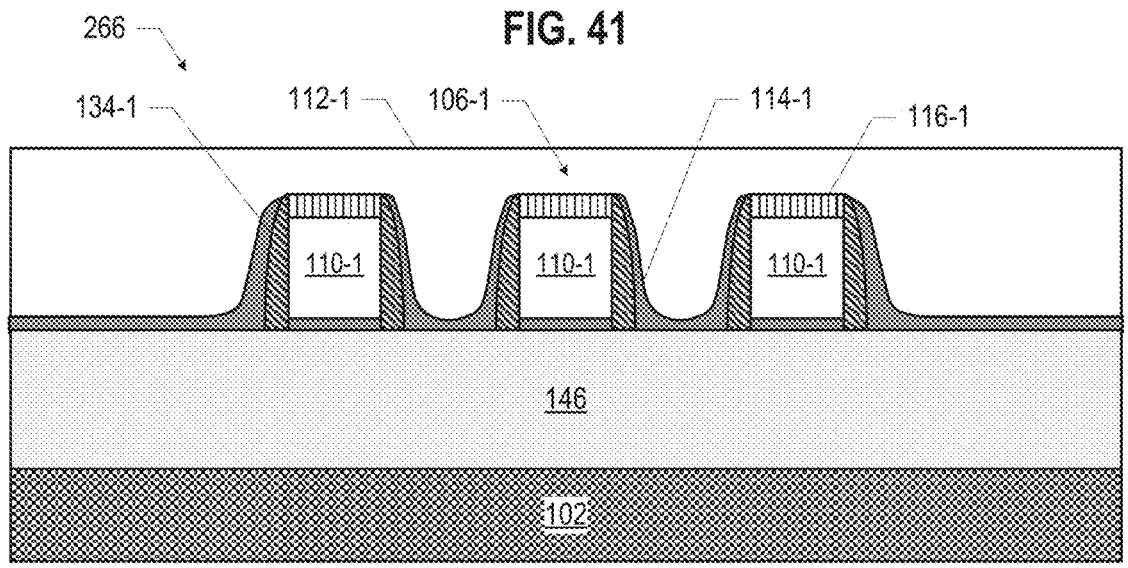
FIG. 42
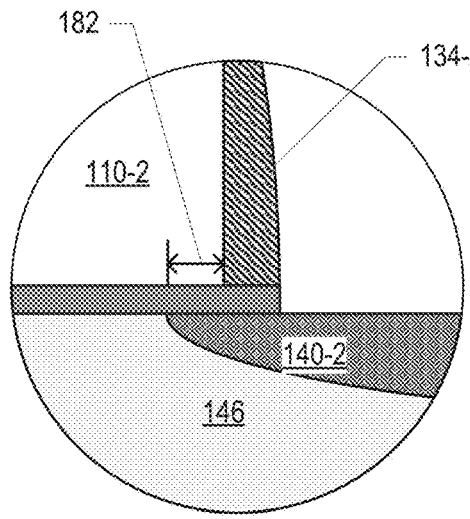 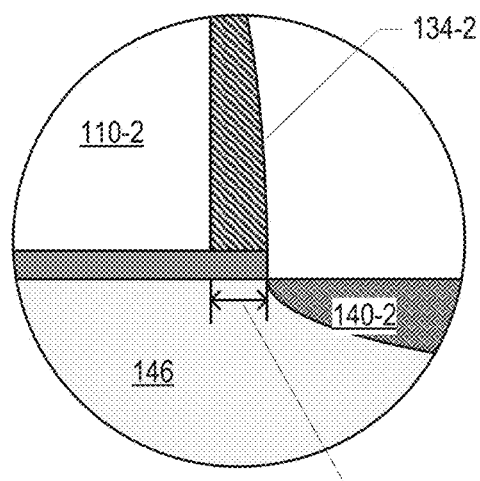
FIG. 43  FIG. 44

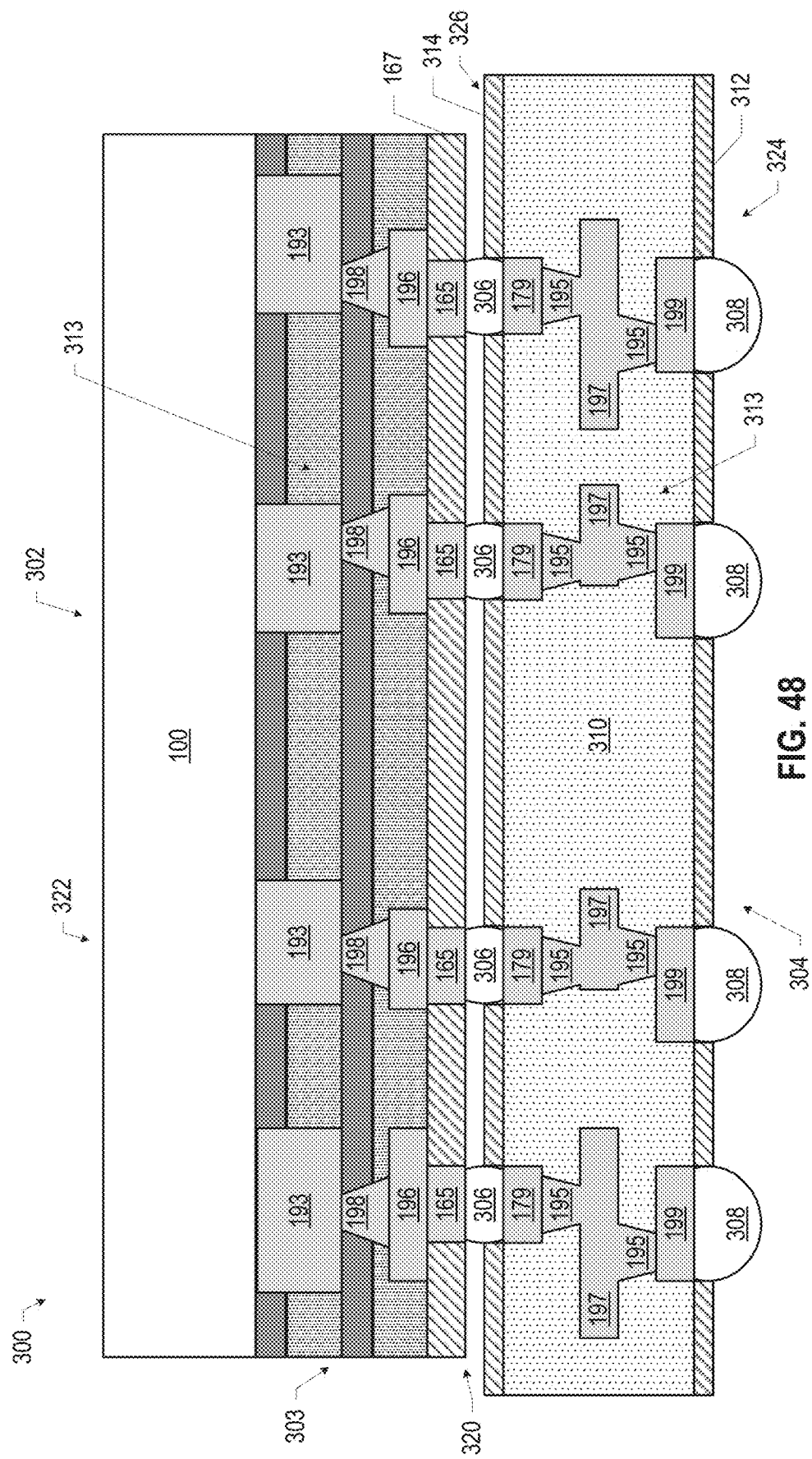

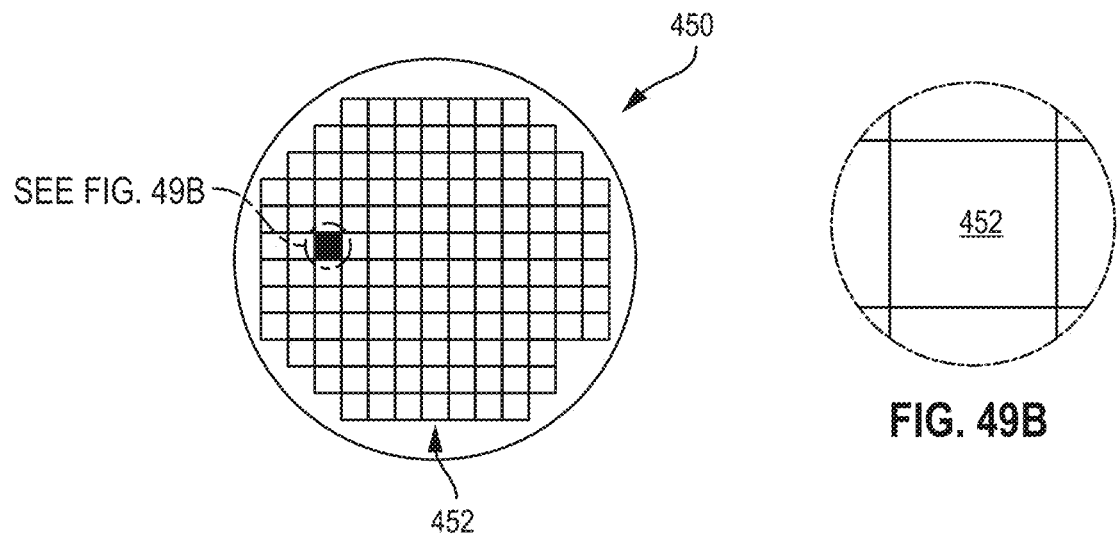
FIG. 49A
FIG. 49B
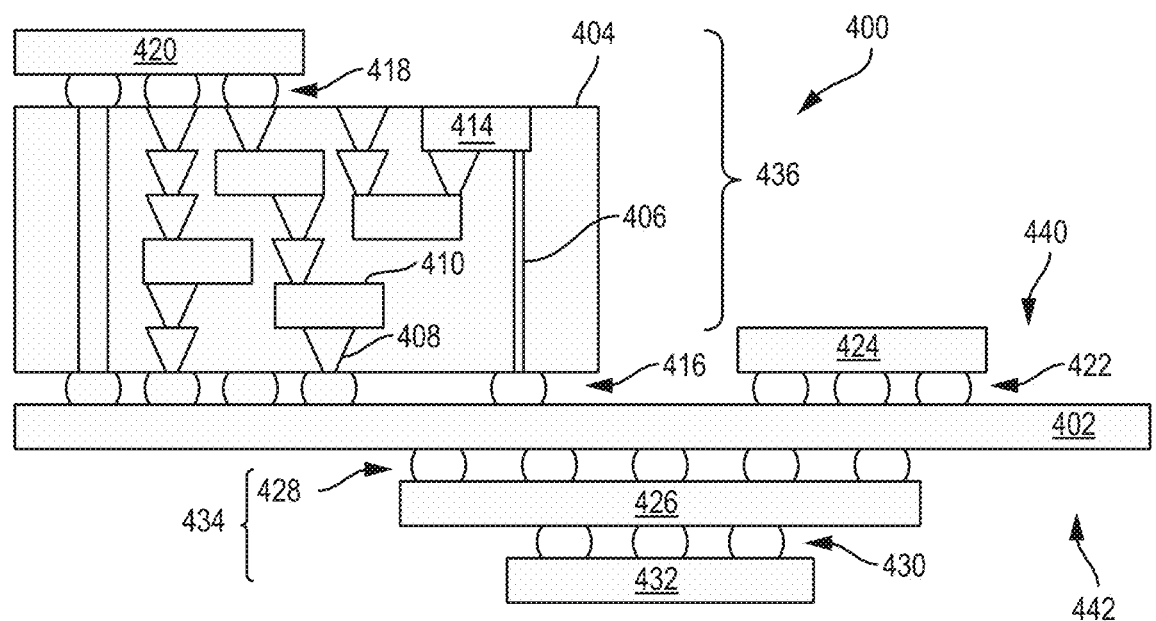
FIG. 50

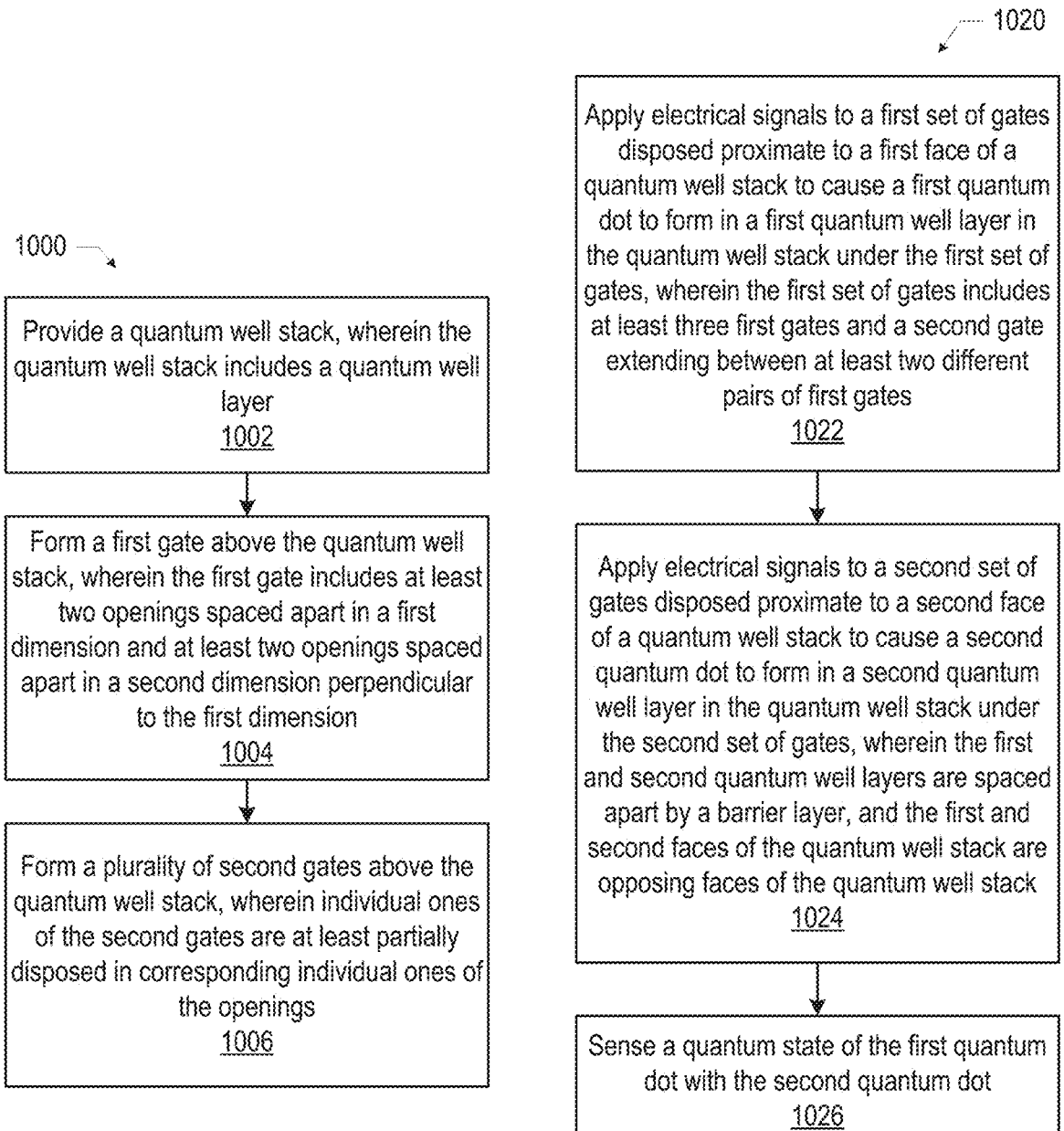

1040

Provide electrical signals to a plurality of first gates disposed above a quantum well stack including a quantum well layer, wherein at least two of the first gates are spaced apart in a first dimension above the quantum well stack, at least two of the first gates are spaced apart in a second dimension above the quantum well stack, and the first and second dimensions are perpendicular
1042

Provide electrical signals to a second gate disposed above the quantum well stack, wherein the second gate extends between at least two of the first gates spaced apart in the first dimension, and the second gate extends between at least two of the first gates spaced apart in the second dimension, wherein the electrical signals provided to the plurality of first gates and to the second gate cause at least one quantum dot to form in the quantum well layer
1044

FIG. 53

QUANTUM DOT ARRAY DEVICES

CROSS-REFERENCE TO RELATED APPLICATION

This application is a national stage application under 35 U.S.C. § 371 of PCT International Application Ser. No. PCT/US2016/046674, filed on Aug. 12, 2016 and entitled "Quantum Dot Array Devices," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 38-42 illustrate various alternative stages in the manufacture of a quantum dot device, in accordance with various embodiments.

FIGS. 43-44 illustrate detail views of various embodiments of a doped region in a quantum dot device.

FIG. 48 is a cross-sectional view of a quantum dot device package, in accordance with various embodiments.

FIGS. 49A and 49B are top views of a wafer and dies that may include any of the quantum dot devices disclosed herein.

FIG. 50 is a cross-sectional side view of a device assembly that may include any of the quantum dot devices disclosed herein.

FIG. 51 is a flow diagram of an illustrative method of manufacturing a quantum dot device, in accordance with various embodiments.

FIGS. 52-53 are flow diagrams of illustrative methods of operating a quantum dot device, in accordance with various embodiments.

DETAILED DESCRIPTION

Figure 1:
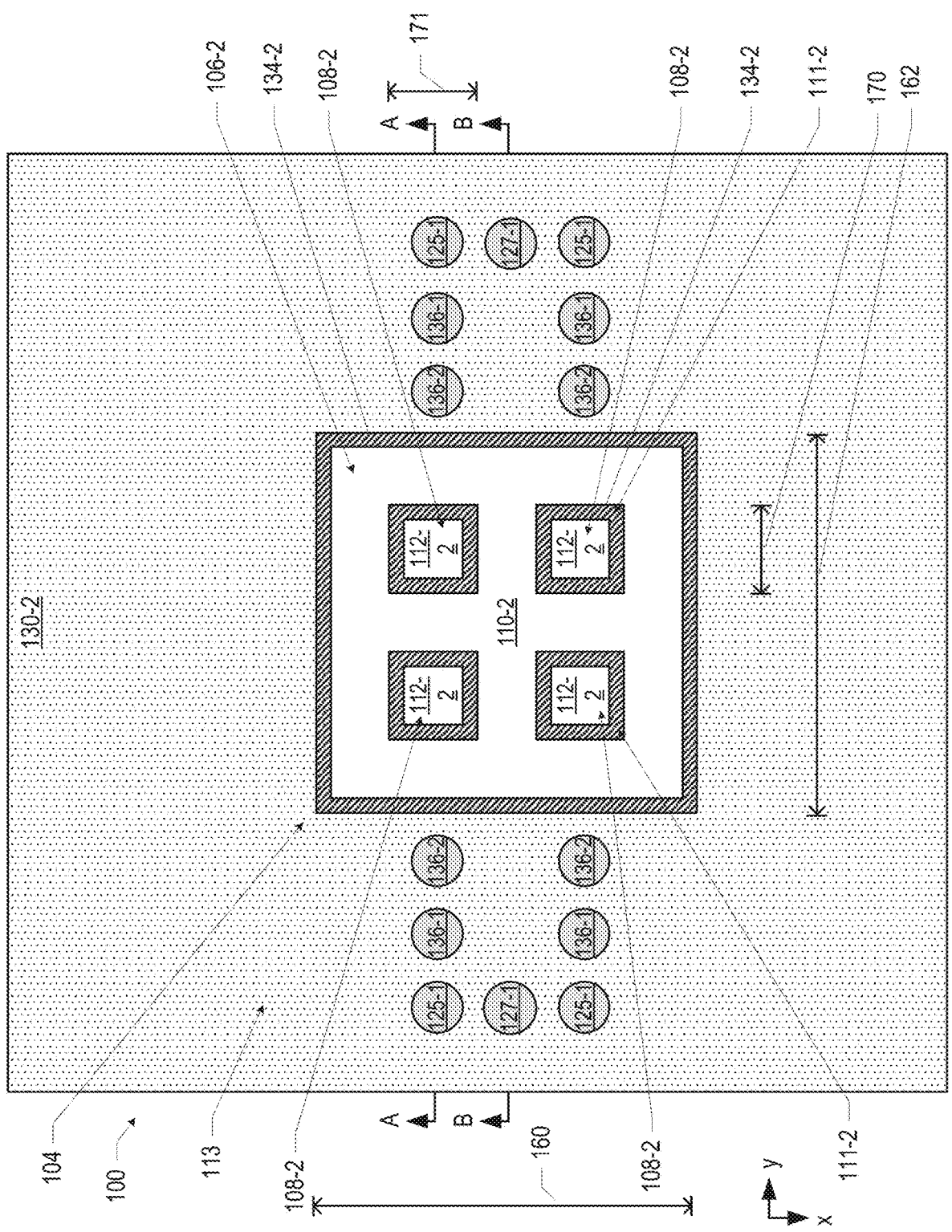
FIGS. 1-4 are cross-sectional views of a quantum dot device, in accordance with various embodiments.

Disclosed herein are quantum dot devices, as well as related computing devices and methods. For example, in some embodiments, a quantum dot device may include: a quantum well stack including a quantum well layer; a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and a second gate disposed above the quantum well stack, wherein the second gate extends between at least two of the first gates spaced apart in the first dimension, and the second gate extends between at least two of the first gates spaced apart in the second dimension.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 2:
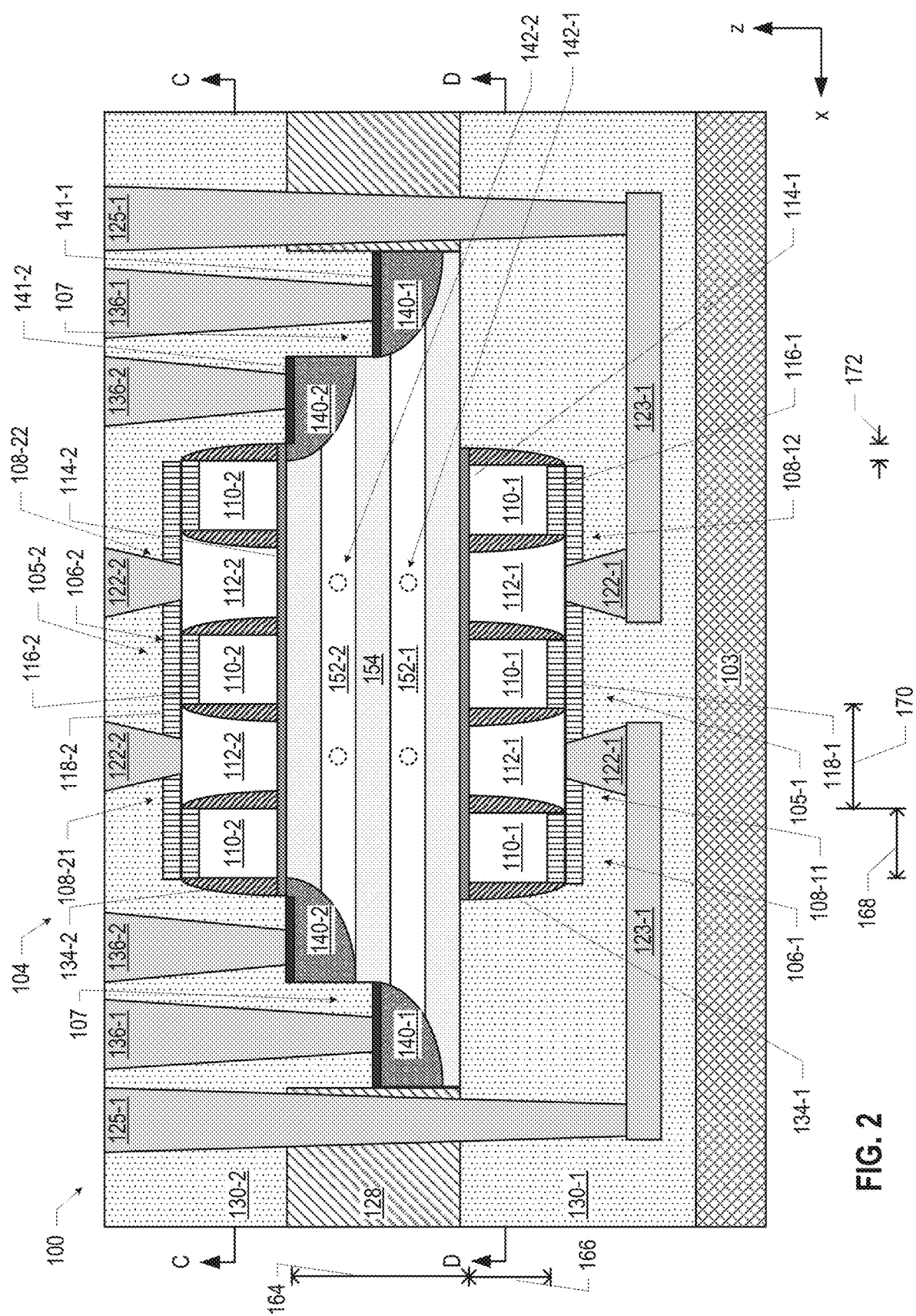
Figure 3:
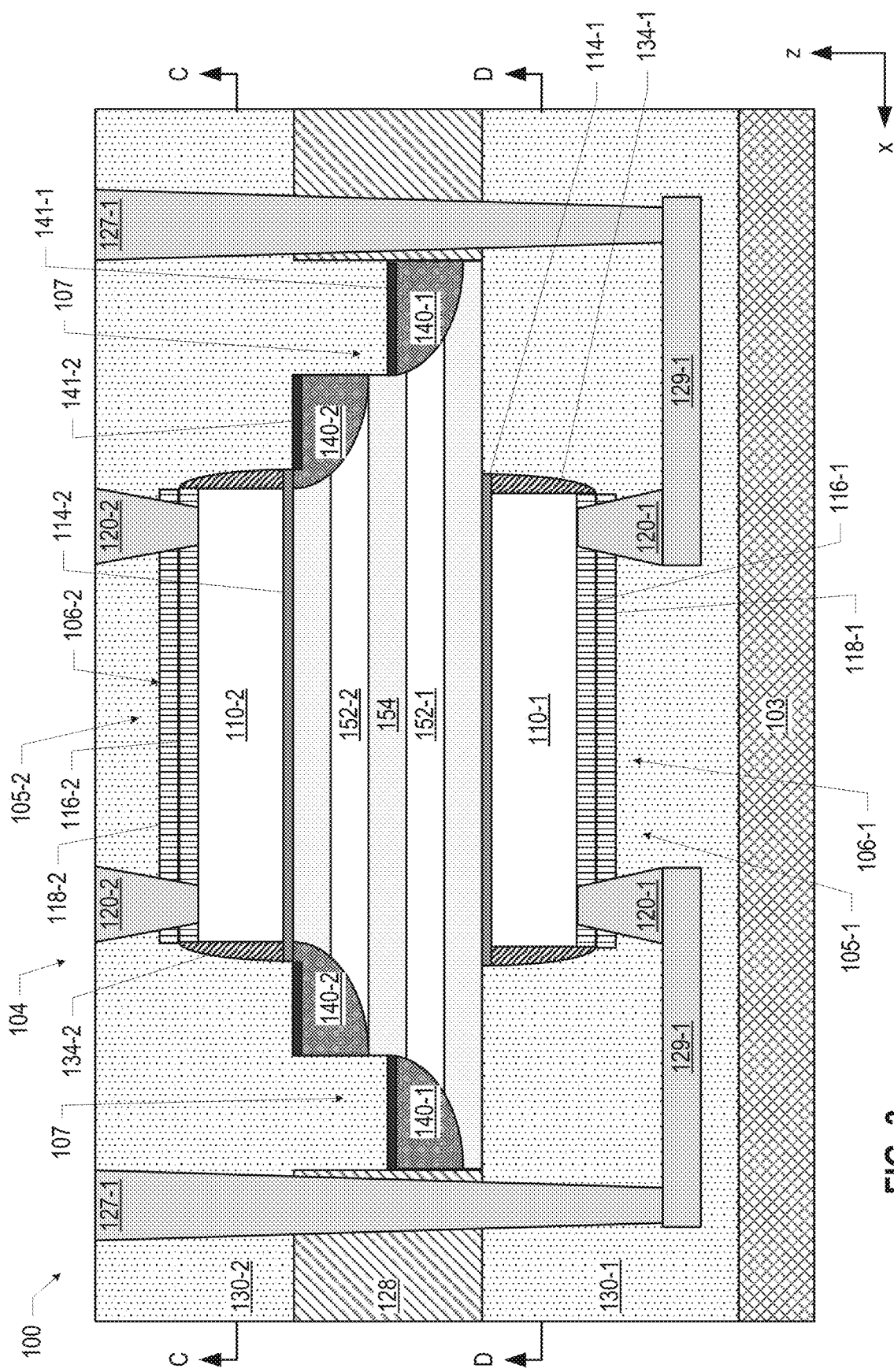
Figure 4:
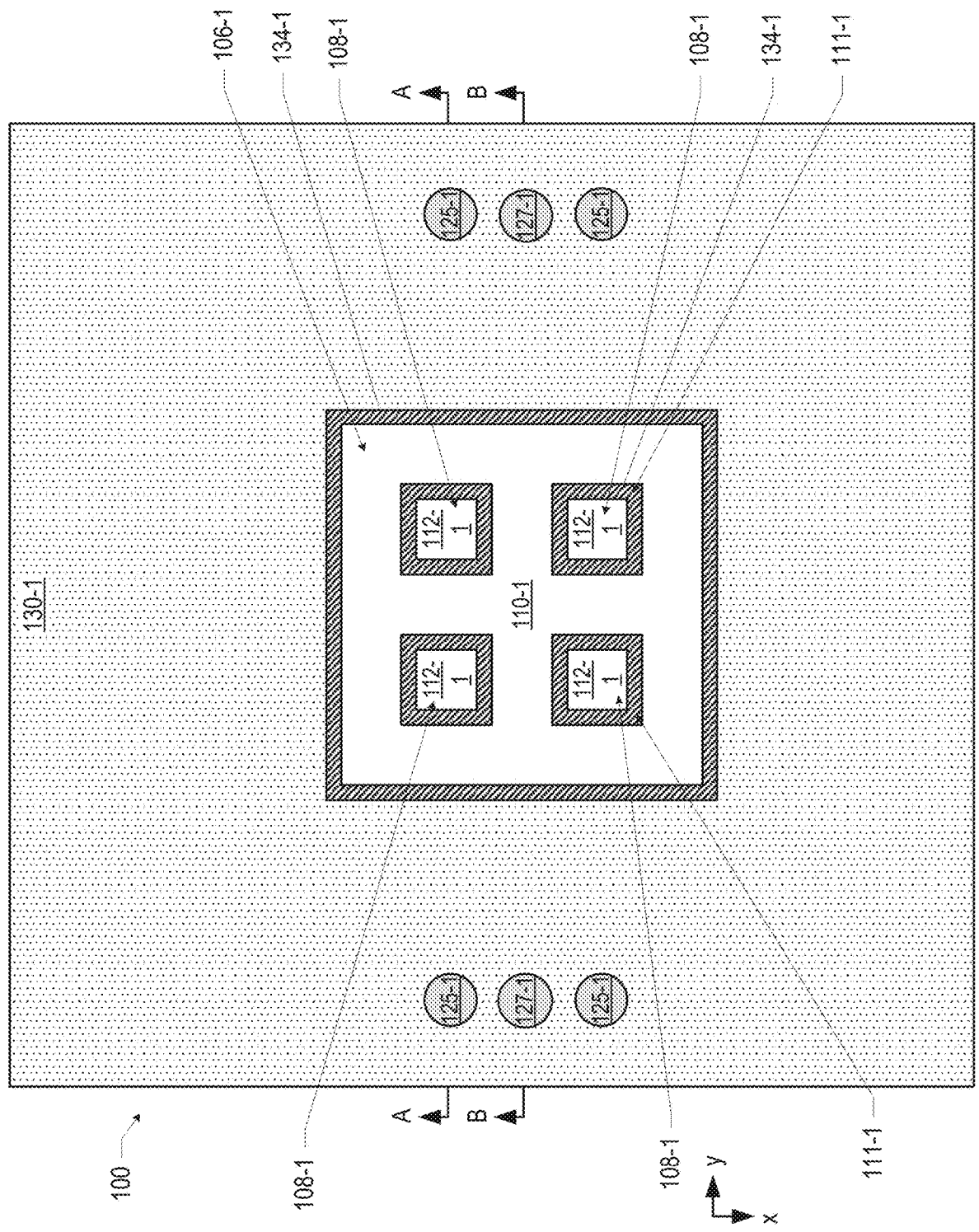

FIGS. 1-4 are cross-sectional views of a quantum dot device 100, in accordance with various embodiments. In particular, FIG. 2 illustrates the quantum dot device 100 taken along the section A-A of FIGS. 1 and 4 and FIG. 3 illustrates the quantum dot device 100 taken along the section B-B of FIGS. 1 and 4 (while FIG. 1 illustrates the quantum dot device 100 taken along the section C-C of FIGS. 2 and 3, and FIG. 4 illustrates the quantum dot device taken along the section D-D of FIGS. 2 and 3). FIGS. 1 and 4 may be considered "top" cross-sectional views and FIGS. 2 and 3 may be considered "side" cross-sectional views, although as noted above, such descriptions are used to facilitate the discussion and are not intended to restrict the application of disclosed embodiments.

The quantum dot device 100 may include one or more quantum dot formation regions 104 spaced apart by insulating material 128 (e.g., silicon oxide). Although only a single quantum dot formation region 104 is shown in FIGS. 1-4, this is simply for ease of illustration, and more than one quantum dot formation region 104 may be included in the quantum dot device 100 (e.g., as discussed below with reference to FIG. 37). The quantum dot formation regions 104 may include a quantum well stack 146, which may include one or more quantum well layers 152. In the embodiment illustrated in FIGS. 1-4, the quantum well stack 146 includes two quantum well layers, 152-1 and 152-2, but in some embodiments (as discussed further herein), the quantum well stack 146 may include one quantum well layer 152 or three or more quantum well layers 152. In the embodiment illustrated in FIGS. 1-4, the quantum well layer 152-1 and the quantum well layer 152-2 are spaced apart by a barrier layer 154. Examples of quantum well stacks 146 are discussed in detail below with reference to FIGS. 35-36. The quantum dot device 100 may, in some embodiments, include a support 103 to provide mechanical support for the quantum dot device 100 (e.g., in the form of a carrier or other structure). In some embodiments, the quantum dot device 100 may not include a support 103.

As noted above, each of the quantum dot formation regions 104 may include one or more quantum well layers 152. The quantum well layers 152 included in the quantum dot formation regions 104 may be arranged normal to the z-direction, and may provide layers in which a two-dimensional electron gas (2DEG) may form to enable the generation of a quantum dot during operation of the quantum dot device 100, as discussed in further detail below. The quantum well layers 152 themselves may provide a geometric constraint on the z-location of quantum dots in the quantum dot formation regions 104. To control the x-location and the y-location of quantum dots in the quantum dot formation regions 104, voltages may be applied to gates disposed on the quantum dot formation regions 104 to adjust the energy profile along the quantum dot formation regions 104 in the x-direction and the y-direction and thereby constrain the x-location and y-location of quantum dots within quantum wells (discussed in detail below with reference to the gates 106/108). The dimensions of the quantum dot formation regions 104 may take any suitable values. The x-length 160 and the y-length 162, for example, may depend on the number and arrangement of gates included in the quantum dot formation region 104. In some embodiments, the z-length 164 of the quantum well stack 146 included in a quantum dot formation region 104 may be between 200 and 400 nanometers (e.g., between 250 and 350 nanometers, or equal to 300 nanometers). Insulating material and conductive pathways may be present in the peripheral region 113 around a quantum dot formation region 104, as discussed in detail below.

Multiple gates may be disposed in each of the quantum dot formation regions 104. In particular, a first set of gates 105-1 may be disposed at the "bottom" of each quantum dot formation region 104, and a second set of gates 105-2 may be disposed at the "top" of each quantum dot formation region 104. In the embodiment illustrated in FIGS. 1-4, the first set of gates 105-1 includes a gate 106-1 and four gates 108-1, and the second set of gates 105-2 includes a gate 106-2 and four gates 108-2. This particular number of gates is simply illustrative, and any suitable number and arrangement of gates may be used. For example, a set of gates 105 may include three or more gates 108, arranged in any desired arrangement (e.g., as vertices of triangles or other polygons, in a rectangular or other array, in an irregular arrangement on the quantum well stack 146, etc.). Additionally, as discussed below with reference to FIG. 37, multiple quantum dot formation regions 104 may be included in a quantum dot device 100, as desired.

As shown in FIGS. 1-4, the gate 108-11 may be disposed in an opening 111-1 in the gate 106-1, and the gate 108-12 may be disposed in a different opening 111-1 in the gate 106-1. The gates 106-2, 108-21, and 108-22 (of the set of gates 105-2) are arranged along the quantum well stack 146 analogously to the arrangement of the gates 106-1, 108-11, and 108-12 (of the set of gates 105-1). References to a "gate 106" herein may refer to any of the gates 106, while reference to a "gate 108" herein may refer to any of the gates 108. Reference to the "gates 108-1" herein may refer to any of the gates 108 of the first set of gates 105-1 (and analogously for the "gates 108-2").

A set of gates 105 may include multiple gates 108 that include at least one pair of gates spaced apart from each other in a first dimension (e.g., spaced apart from each other in the x-dimension), and at least one pair of gates spaced apart from each other in a second dimension perpendicular to the first dimension (e.g., spaced apart from each other in the y-dimension). A two-dimensional regular array of spaced-apart gates 108 is one example of such an arrangement (e.g., as illustrated in FIGS. 1-4), but many others exist (e.g., an irregular array or other distribution). These pairs may share a gate; for example, three gates may satisfy this description if arranged accordingly. In the embodiment illustrated in FIGS. 1-4, the gates 108 in a set 105 are spaced apart by intervening portions of the gate 106 in the set 105; in other embodiments, other materials or structures may be disposed between pairs of gates 108 in a set 105.

In the embodiment illustrated in FIGS. 1 and 4, from a top view, the gate metal 110 of the gates 106 may be shaped substantially as a "grid" having openings 111 in which the gate metal 112 of the gates 108 are at least partially disposed. Such a grid may have one or more cross-shaped portions (between a set of four adjacent openings 111) and a perimeter portion (extending around the collection of openings 111). As noted elsewhere herein, the gate metal 110 of the gates 106 may be patterned in any suitable way to define the location and shape of the gates 106 and the locations and shapes of the gates 108. In some embodiments, the gate 106-1 may be a mirror image of the gate 106-2 around the quantum well stack 146; in other embodiments, the gate 106-1 may not be a mirror image of the gate 106-2. Similarly, the gates 108-1 may be a mirror image of the gates 108-2 around the quantum well stack 146; in other embodiments, the gates 108-1 may not be a mirror image of the gates 108-2.

Each of the gates 106/108 may include a gate dielectric 114 (e.g., the gate dielectric 114-1 for the gates 106-1/108-1, and the gate dielectric 114-2 for the gates 106-2/108-2). In the embodiment illustrated in FIG. 2, the gate dielectric 114 for all of the gates 106/108 in a particular set of gates 105 is provided by a common layer of gate dielectric material. In other embodiments, the gate dielectric 114 for each of the gates 106/108 in a particular set of gates 105 may be provided by separate portions of gate dielectric 114 (e.g., as discussed below with reference to FIGS. 38-42). In some embodiments, the gate dielectric 114 may be a multilayer gate dielectric (e.g., with multiple materials used to improve the interface between the quantum well stack 146 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. The gate dielectric 114-1 may be a same material as the gate dielectric 114-2, or a different material.

The gate 106-1 may include a gate metal 110-1 and a hardmask 116-1. The hardmask 116-1 may be formed of silicon nitride, silicon carbide, or another suitable material. The gate metal 110-1 may be disposed between the hardmask 116-1 and the gate dielectric 114-1, and the gate dielectric 114-1 may be disposed between the gate metal 110-1 and the quantum well stack 146. Only one portion of the hardmask 116-1 is labeled in FIGS. 2 and 3 for ease of illustration. In some embodiments, the hardmask 116-1 may not be present in the quantum dot device 100 (e.g., a hardmask like the hardmask 116-1 may be removed during processing, as discussed below). In some embodiments, the gate metal 110-1 may be a superconductor, such as aluminum, titanium nitride (e.g., deposited via atomic layer deposition), or niobium titanium nitride. The sides of the gate metal 110-1 may be substantially parallel, as shown in FIGS. 2 and 3, and insulating spacers 134-1 may be disposed on the sides of the gate metal 110-1. As illustrated in FIGS. 2 and 3, the spacers 134-1 may be thinner farther from the quantum well stack 146 and thicker closer to the quantum well stack 146. In some embodiments, the spacers 134-1 may have a convex shape. The spacers 134-1 may be formed of any suitable material, such as a carbon-doped oxide, silicon nitride, silicon oxide, or other carbides or nitrides (e.g., silicon carbide, silicon nitride doped with carbon, and silicon oxynitride).

Each of the gates 108-1 may include a gate metal 112-1 and a hardmask 118-1. The hardmask 118-1 may be formed of any of the materials discussed above with reference to the hardmask 116-1. The gate metal 112-1 may be disposed between the hardmask 118-1 and the gate dielectric 114-1, and the gate dielectric 114-1 may be disposed between the gate metal 112-1 and the quantum well stack 146. In the embodiment illustrated in FIGS. 2 and 3, the hardmask 118-1 may extend over the hardmask 116-1 (and over the gate metal 110-1 of the gate 106-1), while in other embodiments, the hardmask 118-1 may not extend over the gate metal 110-1. The gate dielectric 114-1 may be disposed between the gate metal 112-1 and the quantum well stack 146. In some embodiments, the gate metal 112-1 may be a different metal from the gate metal 110-1; in other embodiments, the gate metal 112-1 and the gate metal 110-1 may have the same material composition. In some embodiments, the gate metal 112-1 may be a superconductor, such as aluminum, titanium nitride (e.g., deposited via atomic layer deposition), or niobium titanium nitride. In some embodiments, the hardmask 118-1 may not be present in the quantum dot device 100 (e.g., a hardmask like the hardmask 118-1 may be removed during processing, as discussed below).

The gate 106-2 may include a gate metal 110-2 and a hardmask 116-2. The hardmask 116-2 may be formed of silicon nitride, silicon carbide, or another suitable material. The gate metal 110-2 may be disposed between the hardmask 116-2 and the gate dielectric 114-2, and the gate dielectric 114-2 may be disposed between the gate metal 110-2 and the quantum well stack 146. Only one portion of the hardmask 116-2 is labeled in FIGS. 2 and 3 for ease of illustration. In some embodiments, the gate metal 110-2 may be a superconductor, such as aluminum, titanium nitride (e.g., deposited via atomic layer deposition), or niobium titanium nitride. In some embodiments, the hardmask 116-2 may not be present in the quantum dot device 100 (e.g., a hardmask like the hardmask 116-2 may be removed during processing, as discussed below). The sides of the gate metal 110-2 may be substantially parallel, as shown in FIGS. 2 and 3, and insulating spacers 134-2 may be disposed on the sides of the gate metal 110-2 and the hardmask 116-2. As illustrated in FIG. 2, the spacers 134-2 may be thicker closer to the quantum well stack 146 and thinner farther away from the quantum well stack 146. In some embodiments, the spacers 134-2 may have a convex shape. The spacers 134-2 may be formed of any suitable material, such as a carbon-doped oxide, silicon nitride, silicon oxide, or other carbides or nitrides (e.g., silicon carbide, silicon nitride doped with carbon, and silicon oxynitride). In some embodiments, the gate metal 110-2 may be a different metal from the gate metal 110-1; in other embodiments, the gate metal 110-2 and the gate metal 110-1 may have the same material composition.

Each of the gates 108-2 may include a gate metal 112-2 and a hardmask 118-2. The hardmask 118-2 may be formed of any of the materials discussed above with reference to the hardmask 116-2. The gate metal 112-2 may be disposed between the hardmask 118-2 and the gate dielectric 114-2, and the gate dielectric 114-2 may be disposed between the gate metal 112-2 and the quantum well stack 146. In the embodiment illustrated in FIG. 2, the hardmask 118-2 may extend over the hardmask 116-2 (and over the gate metal 110-2 of the gates 106-2), while in other embodiments, the hardmask 118-2 may not extend over the gate metal 110-2. In some embodiments, the gate metal 112-2 may be a different metal from the gate metal 110-2; in other embodiments, the gate metal 112-2 and the gate metal 110-2 may have the same material composition. In some embodiments, the gate metal 112-2 may be a different metal from the gate metal 112-1; in other embodiments, the gate metal 112-2 and the gate metal 112-1 may have the same material composition. In some embodiments, the gate metal 112-2 may be a superconductor, such as aluminum, titanium nitride (e.g., deposited via atomic layer deposition), or niobium titanium nitride. In some embodiments, the hardmask 118-2 may not be present in the quantum dot device 100 (e.g., a hardmask like the hardmask 118-2 may be removed during processing, as discussed below).

The gate 108-11 may extend between the proximate spacers 134-1 on the sides of the corresponding opening 111-1 in the gate 106-1, as shown. In some embodiments, the gate metal 112-1 of the gate 108-11 may extend between the spacers 134-1 on the sides of the corresponding opening 111-1. Thus, the gate metal 112-1 of the gate 108-11 may have a shape that is substantially complementary to the shape of the spacers 134-1, as shown. Similarly, the gate 108-12 may extend between the proximate spacers 134-1 on the sides of the corresponding opening 111-1. The gates 106-2/108-2 and the dielectric material 114-2 of the second set of gates 105-2 may take the form of any of these embodiments of the gates 106-1/108-1 and the dielectric material 114-1. As illustrated in FIGS. 1-4, in some embodiments, the gates 106-1/108-1 may be mirror images of the gates 106-2/108-2 around the quantum well stack 146. In some embodiments in which the gate dielectric 114 is not a layer shared commonly between the associated gates 106 and 108, but instead is separately deposited on the quantum well stack 146 between the associated spacers 134 (e.g., as discussed below with reference to FIGS. 38-42), the gate dielectric 114 may extend at least partially up the sides of the associated spacers 134, and the gate metal 112 may extend between the portions of the associated gate dielectric 114 on the associated spacers 134.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In some embodiments (e.g., the embodiment illustrated in FIG. 2), the z-height of the gate metal 112 may be greater than the z-height of the gate metal 110. In some embodiments, the x-length 168 of the gate metal 110 in the cross section of FIG. 2 may be between 20 and 40 nanometers (e.g., 30 nanometers). In some embodiments, the x-length 170 of the openings 111 in the gates 106 may be between 40 and 60 nanometers (e.g., 50 nanometers); the y-length 171 of the openings 111 may take any of the values described herein for the x-length 170, for example. In some embodiments, the thickness 172 of the spacers 134 may be between 1 and 10 nanometers (e.g., between 3 and 5 nanometers, between 4 and 6 nanometers, or between 4 and 7 nanometers). The x-length of the gate metal 112 may depend on the dimensions of the gates 106 and the spacers 134, as illustrated in FIG. 2.

During operation of the quantum dot device 100, voltages may be applied to the gates 106-1/108-1 to adjust the potential energy in the quantum well layer 152-1 in the quantum dot formation region 104 to create quantum wells of varying depths in which quantum dots 142-1 may form. Similarly, voltages may be applied to the gates 106-2/108-2 to adjust the potential energy in the quantum well layer 152-2 in the quantum dot formation region 104 to create quantum wells of varying depths in which quantum dots 142-2 may form. Only one quantum dot 142-1 and one quantum dot 142-2 are labeled with a reference numeral in FIG. 2 for ease of illustration, but five are indicated as dotted circles in each quantum well layer 152 of the quantum well stack 146. As noted above, in some embodiments, the set 105-1 and/or the quantum well layer 152-1 may be omitted from the quantum dot device 100. In some embodiments, the set 105-2 and/or the quantum well layer 152-2 may be omitted from the quantum dot device 100.

The spacers 134 may themselves provide "passive" barriers between quantum wells under the gates 106/108 in the associated quantum well layer 152, and the voltages applied to different ones of the gates 106/108 may adjust the potential energy under the gates 106/108 in the quantum well layer; decreasing the potential energy may form quantum wells, while increasing the potential energy may form quantum barriers. The discussion below may generally refer to gates 106/108, quantum dots 142, and quantum well layers 152. This discussion may apply to the gates 106-1/108-1, quantum dots 142-1, and quantum well layer 152-1, respectively; to the gates 106-2/108-2, quantum dots 142-2, and quantum well layer 152-2, respectively; or to both.

The quantum dot formation region 104 may include doped regions 140 that may serve as a reservoir of charge carriers for the quantum dot device 100. In particular, the doped regions 140-1 may be in conductive contact with the quantum well layer 152-1, and the doped regions 140-2 may be in conductive contact with the quantum well layer 152-2. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown by the interface material 141-1 at the surface of the doped regions 140-1 and the interface material 141-2 at the surface of the doped regions 140-2. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 28-29). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in the associated quantum well layer 152 in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106/108 may decrease the potential barrier under the gate 106/108 (thereby forming a potential well in the associated quantum well layer 152 in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 108 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108 and neighboring gates, the differences in potential between various gates 106/108 may be adjusted, and thus the interaction tuned. In some applications, the gates 108 may be used as plunger gates to enable the formation of quantum dots 142 under the gates 108, while the gates 106 may be used as barrier gates to adjust the potential barrier between quantum dots 142 formed under adjacent gates 108.

Conductive vias and lines may make contact with the gates 106/108, and with the doped regions 140, to enable electrical connection to the gates 106/108 and the doped regions 140 to be made in desired locations. As shown in FIG. 3, the gate 106-1 may extend away from the quantum well stack 146, and conductive vias 120-1 may extend through the insulating material 130-2 to contact the gate metal 110-1 of the gate 106-1. The conductive vias 120-1 may extend through the hardmask 116-1 and the hardmask 118-1 to contact the gate metal 110-1 of the gate 106-1. Conductive lines 129-1 may contact the conductive vias 120-1, and may extend "laterally" away from the conductive vias 120-1 to make contact with conductive vias 127-1 that extend through the insulating material 130-1, the insulating material 128, and the insulating material 130-2. The gates 108-1 may extend away from the quantum well stack 146, and conductive vias 122-1 may extend through the insulating material 130-1 to contact the gate metal 112-1 of the gates 108-1. The conductive vias 122-1 may extend through the hardmask 118-1 to contact the gate metal 112-1 of the gates 108-1. Conductive lines 123-1 may contact the conductive vias 122-1, and may extend "laterally" away from the conductive vias 122-1 to make contact with conductive vias 125-1 that extend through the insulating material 130-1, the insulating material 128, and the insulating material 130-2.

The gate 106-2 may extend away from the quantum well stack 146, and conductive vias 120-2 may contact the gate 106-2. The conductive vias 120-2 may extend through the hardmask 116-2 and the hardmask 118-2 to contact the gate metal 110-2 of the gate 106-2. The gates 108-2 may extend away from the quantum well stack 146, and conductive vias 122-2 may contact the gates 108-2. The conductive vias 122-2 may extend through the hardmask 118-2 to contact the gate metal 112-2 of the gates 108-2. The insulating material 130-1 and the insulating material 130-2 may have different material compositions, or the same material composition. Examples of materials that may be used for the insulating materials 130 are discussed below.

Conductive vias 136 may contact the interface material 141 and may thereby make electrical contact with the doped regions 140. In particular, the conductive vias 136-1 may extend through the insulating material 130 and make contact with the doped regions 140-1, and the conductive vias 136-2 may extend through the insulating material 130 and make contact with the doped regions 140-2. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

As illustrated in FIGS. 2 and 3, in some embodiments, the quantum dot formation regions 104 may include recesses 107 that extend down to the interface material 141-1 to make conductive contact with the doped regions 140-1 (and thereby the quantum well layer 152-1). The recesses 107 may be filled with the insulating material 130, and the bottoms of the recesses 107 may be doped to provide the doped regions 140-1.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, 125, and 136 may be electrically isolated from each other by various insulating materials, including the insulating materials 130-1 and 130-2, and the insulating material 128, as shown. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/125/136 may have a width that is 20 nanometers or greater at their widest point (e.g., 30 nanometers), and a pitch of 80 nanometers or greater (e.g., 100 nanometers). In some embodiments, conductive lines (e.g., the conductive lines 123) included in the quantum dot device 100 may have a width that is 100 nanometers or greater, and a pitch of 100 nanometers or greater. The particular arrangement of conductive vias and lines shown in FIGS. 1-4 is simply illustrative, and any electrical routing arrangement may be implemented.

In some embodiments, the quantum dots 142-2 in the quantum well layer 152-2 may be used as "active" quantum dots in the sense that these quantum dots 142-2 act as qubits and are controlled (e.g., by voltages applied to the gates 106-2/108-2) to perform quantum computations. The quantum dots 142-1 in the quantum well layer 152-1 may be used as "read" quantum dots in the sense that these quantum dots 142-1 may sense the quantum state of the quantum dots 142-2 in the same quantum dot formation region 104 by detecting the electric field generated by the charge in the quantum dots 142-2, and may convert the quantum state of the quantum dots 142-2 into electrical signals that may be detected by the gates 106-1/108-1. In some embodiments, each quantum dot 142-2 may be read by its corresponding quantum dot 142-1. Thus, the quantum dot device 100 enables both quantum computation and the ability to read the results of a quantum computation within a single quantum dot formation region, if desired. In other embodiments, one or more of the quantum well layers 152 and associated set of gates 105 may be omitted. In some such embodiments, the quantum dots 142 formed in the remaining quantum well layer(s) 152 may be "read" by other devices (not shown), if appropriate.

The quantum dot devices 100 disclosed herein may be manufactured using any suitable techniques. FIGS. 5-34 illustrate various example stages in the manufacture of the quantum dot device 100 of FIGS. 1-4, in accordance with various embodiments. Although the particular manufacturing operations discussed below with reference to FIGS. 5-34 are illustrated as manufacturing a particular embodiment of the quantum dot device 100, these operations may be applied to manufacture many different embodiments of the quantum dot device 100, as discussed herein. Any of the elements discussed below with reference to FIGS. 5-34 may take the form of any of the embodiments of those elements discussed above (or otherwise disclosed herein). For ease of illustration, not all elements in each of FIGS. 5-34 are expressly labeled with reference numerals, but reference numerals for each element are included among the drawings of FIGS. 5-34.

Figure 5:
FIGS. 5-34 illustrate various example stages in the manufacture of a quantum dot device, in accordance with various embodiments.

FIG. 5 illustrates a cross-sectional view of an assembly 202 including a base 102. The base 102 may include any suitable semiconductor material or materials, or any other suitable structure on which to perform the subsequent operations. In some embodiments, the base 102 may include a semiconductor material. For example, the base 102 may include silicon (e.g., may be formed from a silicon wafer).

Figure 6:
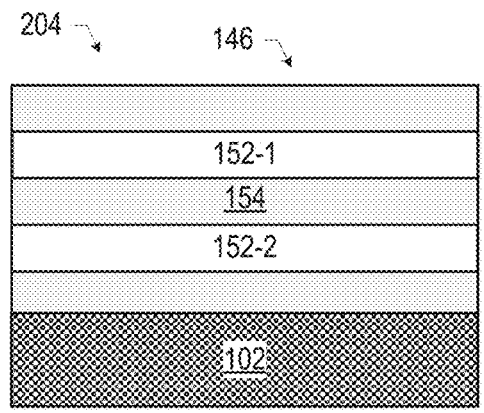

FIG. 6 illustrates a cross-sectional view of an assembly 204 subsequent to providing a quantum well stack 146 on the base 102 of the assembly 202 (FIG. 5). The quantum well stack 146 may include at least one quantum well layer 152. For example, the quantum well stack 146 illustrated in FIG. 6 includes a quantum well layer 152-1, a quantum well layer 152-2, and a barrier layer 154 disposed therebetween. As discussed above, a 2DEG may form in the quantum well layer 152-1 and/or the quantum well layer 152-2 during operation of the quantum dot device 100. Various embodiments of the quantum well stack 146 are discussed below with reference to FIGS. 35 and 36.

Figure 7:
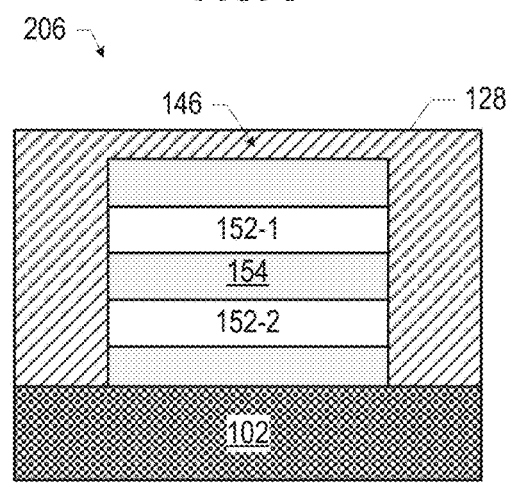

FIG. 7 illustrates a cross-sectional view of an assembly 206 subsequent to etching the quantum well stack 146 of the assembly 204 (FIG. 5) into a desired shape, then providing an insulating material 128 around the etched quantum well stack 146. The size and shape of the quantum well stack 146 after etching may take any suitable form (e.g., the substantially rectangular solid form illustrated in FIGS. 1-4 and FIGS. 7-9). The quantum well stack 146 may be patterned and etched using any suitable technique known in the art. For example, a combination of dry and wet etch chemistry may be used to shape the quantum well stack 146, and the appropriate chemistry may depend on the materials included in the assembly 204, as known in the art. Any suitable material may be used as the insulating material 128 to electrically insulate the quantum well stack 146. As noted above, in some embodiments, the insulating material 128 may be a dielectric material, such as silicon oxide.

Figure 8:
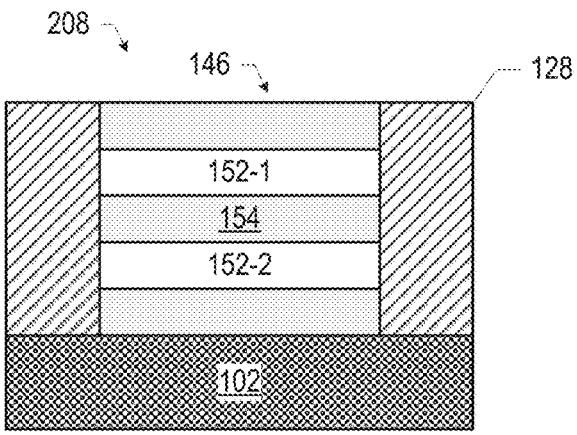

FIG. 8 illustrates a cross-sectional view of an assembly 208 subsequent to planarizing the assembly 206 (FIG. 7) to remove the insulating material 128 above the quantum well stack 146. In some embodiments, the assembly 206 may be planarized into the assembly 208 using a chemical mechanical polishing (CMP) technique.

Figure 9:
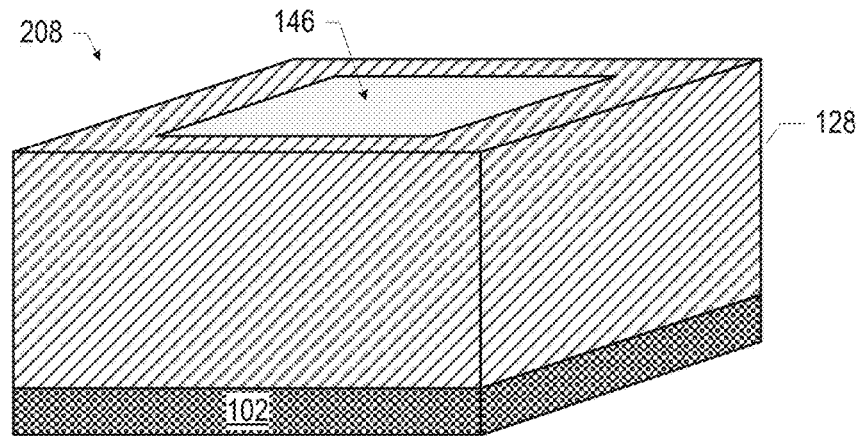
Figure 10:
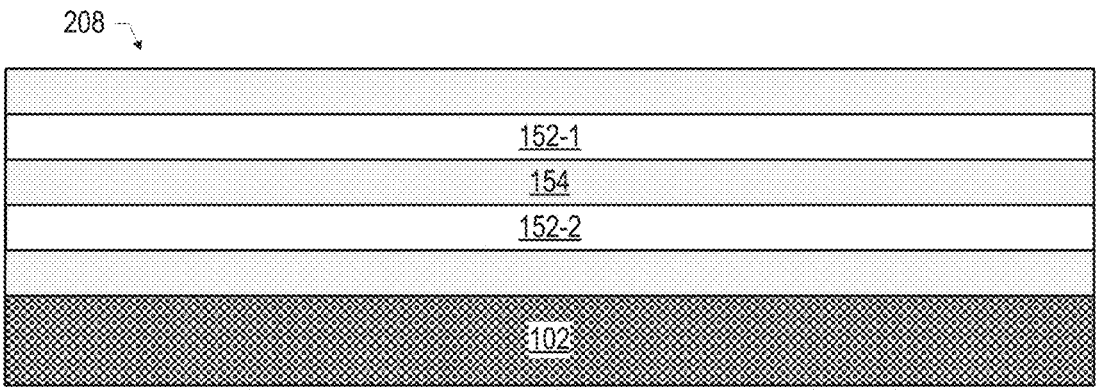

FIG. 9 is a perspective view of at least a portion of the assembly 208, showing the quantum well stack extending from the base 102 and laterally insulated by the insulating material 128. FIG. 10 is another cross-sectional view of the assembly 208, showing a "zoomed-in" version of the cross section of FIG. 8 that omits the insulating material 128 for ease of illustration. The cross-sectional views illustrated in FIGS. 11-13 and 15-21 maintain this zoomed-in perspective, while the cross-sectional views illustrated in FIGS. 22-29 and 31-34 are "zoomed out" to include at least some of the insulating material 128.

Figure 11:
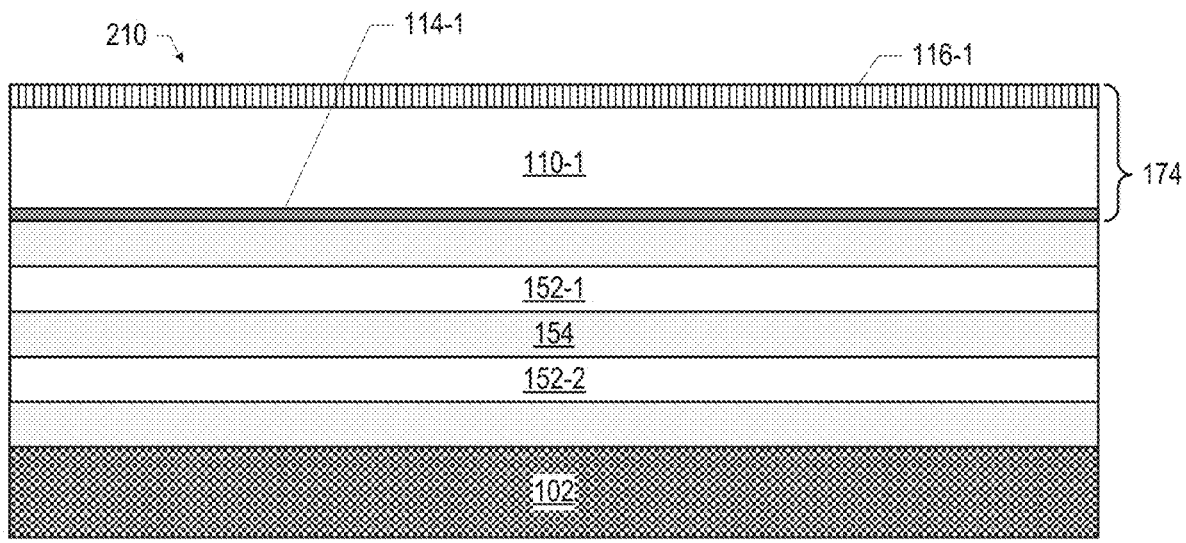

FIG. 11 is a cross-sectional view of an assembly 210 subsequent to forming a gate stack 174 on the quantum well stack 146 of the assembly 208 (FIGS. 8-10). The gate stack 174 may include the gate dielectric 114-1, the gate metal 110-1, and a hardmask 116-1. The hardmask 116-1 may be formed of an electrically insulating material, such as silicon nitride or carbon-doped nitride.

Figure 12:
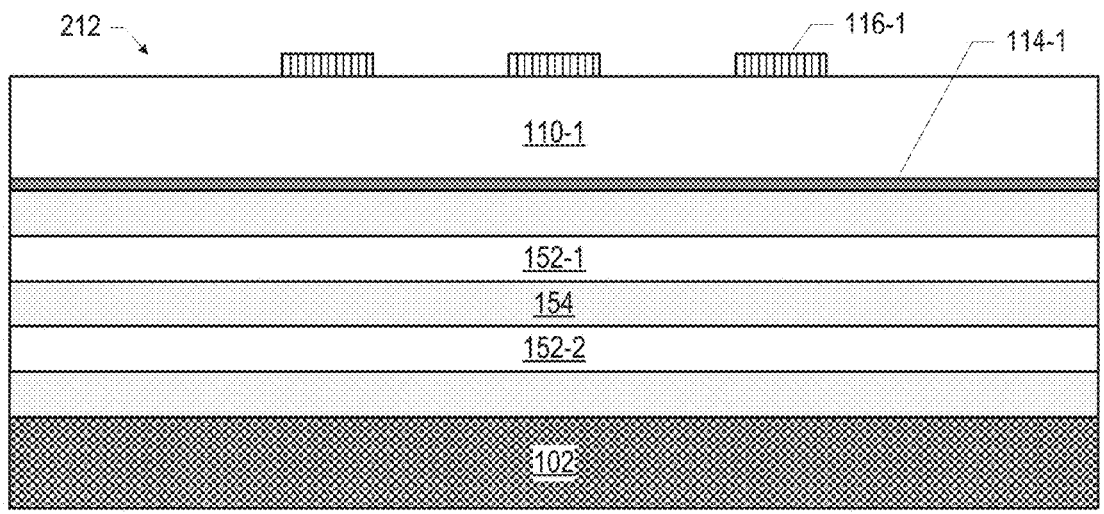

FIG. 12 is a cross-sectional view of an assembly 212 subsequent to patterning the hardmask 116-1 of the assembly 210 (FIG. 11). The pattern applied to the hardmask 116-1 may correspond to the locations for the gate 106-1, as discussed below. The hardmask 116-1 may be patterned by applying a resist, patterning the resist using lithography, and then etching the hardmask (using dry etching or any appropriate technique).

Figure 13:
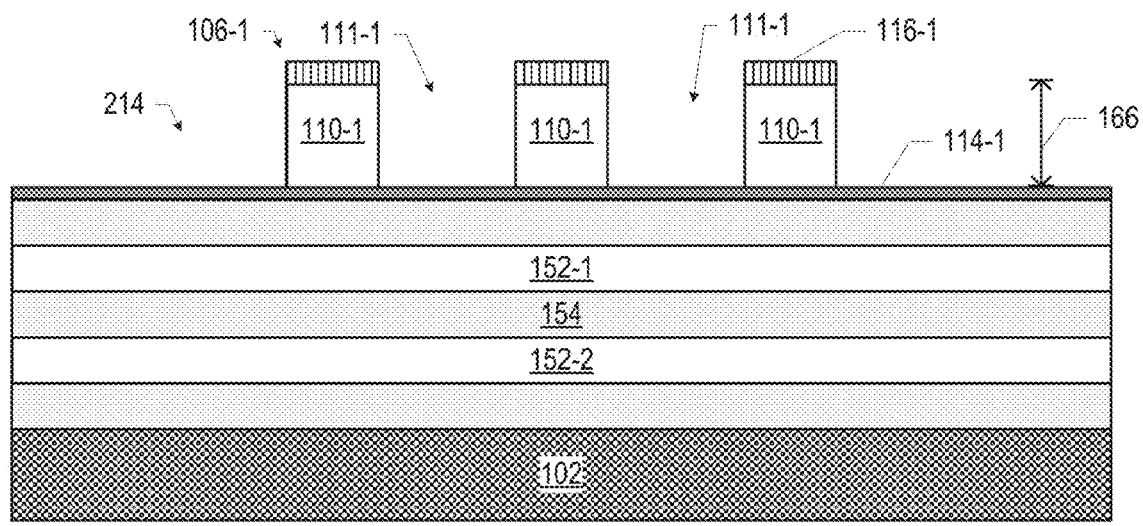
Figure 14:
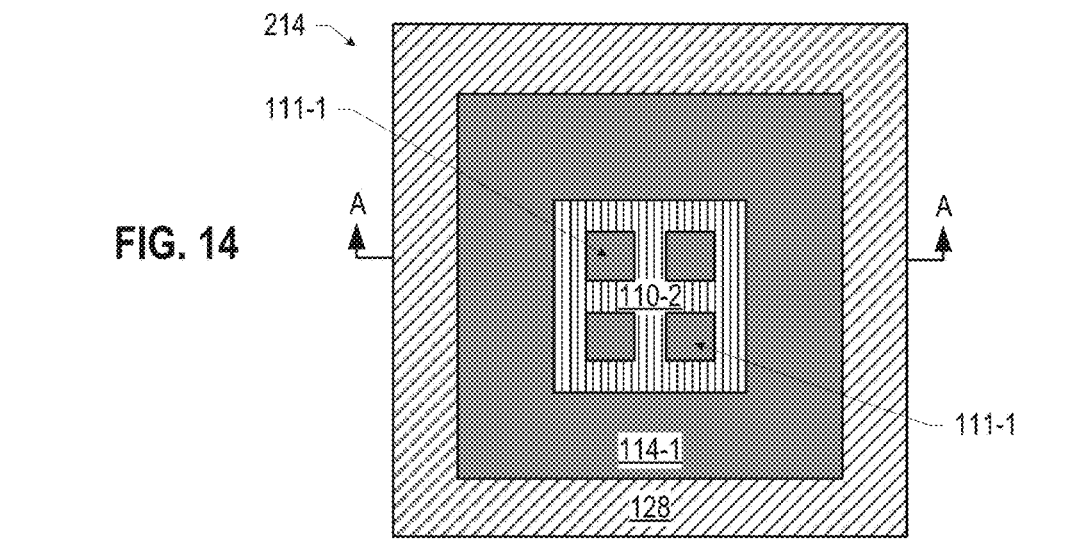

FIG. 13 is a cross-sectional view of an assembly 214 subsequent to etching the assembly 212 (FIG. 12) to remove the gate metal 110-1 that is not protected by the patterned hardmask 116-1 to form the gate 106-1. In some embodiments, as illustrated in FIG. 13, the gate dielectric 114-1 may remain after the etched gate metal 110-1 is etched away; in other embodiments, the gate dielectric 114-1 may also be etched during the etching of the gate metal 110-1. Examples of such embodiments are discussed below with reference to FIGS. 38-42. Etching the gate metal 110-1 may form openings 111-1 in the gate metal 110-1 (and the hardmask 116-1) that extend down to the gate dielectric 114-1. FIG. 14 is a top view of the assembly 214, depicting the openings 111-1 as substantially rectangular in footprint. Although a particular number of particular shapes of the openings 111-1 are illustrated in FIGS. 13 and 14 in a particular arrangement, this is simply an illustrative embodiment and the openings 111-1 may have any desired and appropriate shape (e.g., a footprint that is circular, square, an oval, a polygon, etc.), number, or arrangement (e.g., in a rectangular array, a non-rectangular array, a regular or irregular arrangement, etc.).

Figure 15:
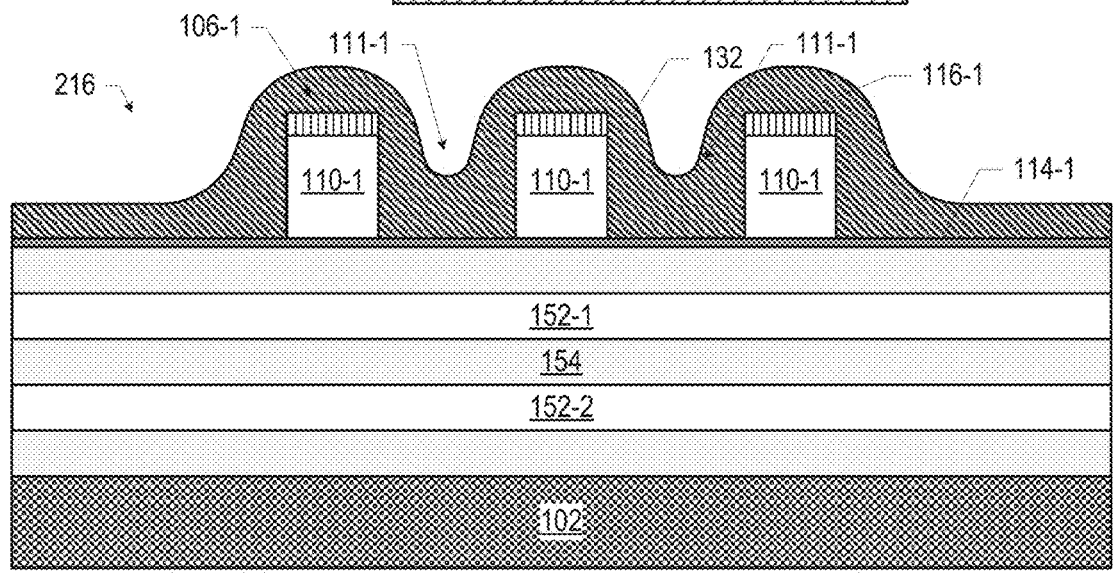

FIG. 15 is a cross-sectional view of an assembly 216 subsequent to providing spacer material 132 on the assembly 214 (FIGS. 13 and 14). The spacer material 132 may include any of the materials discussed above with reference to the spacers 134-1, for example, and may be deposited using any suitable technique. For example, the spacer material 132 may be a nitride material (e.g., silicon nitride) deposited by sputtering. The spacer material 132 may at least partially fill the openings 111-1.

Figure 16:
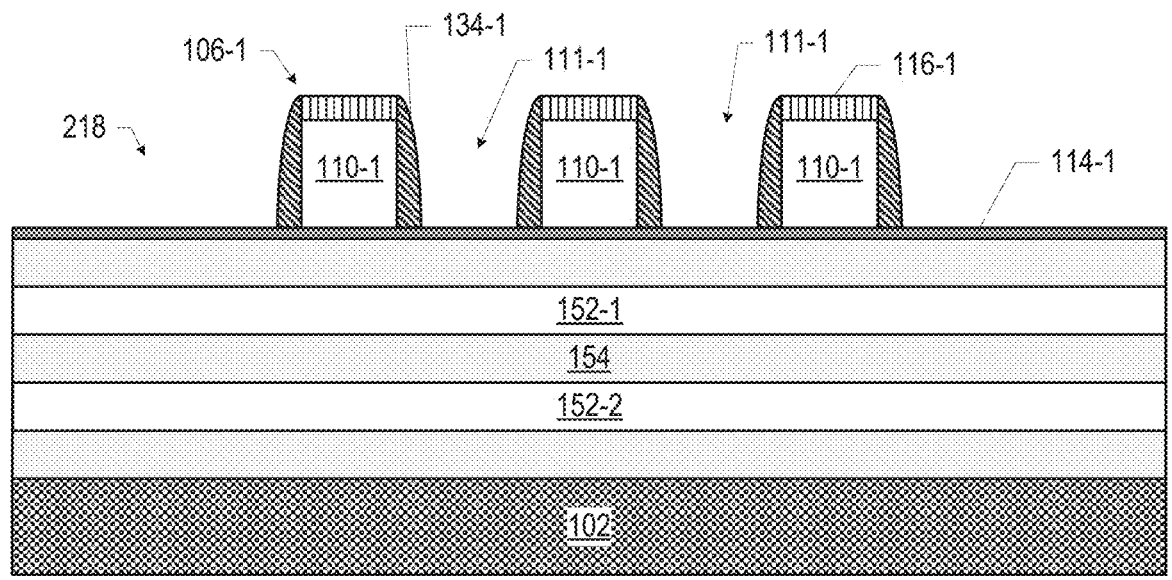

FIG. 16 is a cross-sectional view of an assembly 218 subsequent to etching the spacer material 132 of the assembly 216 (FIG. 15), leaving spacers 134-1 formed of the spacer material 132 on the side faces of the gate 106-1 (e.g., on the sides of the hardmask 116-1 and the gate metal 110-1). The etching of the spacer material 132 may be an anisotropic etch, etching the spacer material 132 "downward" to remove the spacer material 132 on top of the gate 106-1 and in some of the area between the gate metal 110-1 of the gate 106-1 (e.g., at the "bottoms" of the openings 111-1), while leaving the spacers 134-1 on the sides of the gate 106-1. In some embodiments, the anisotropic etch may be a dry etch.

Figure 17:
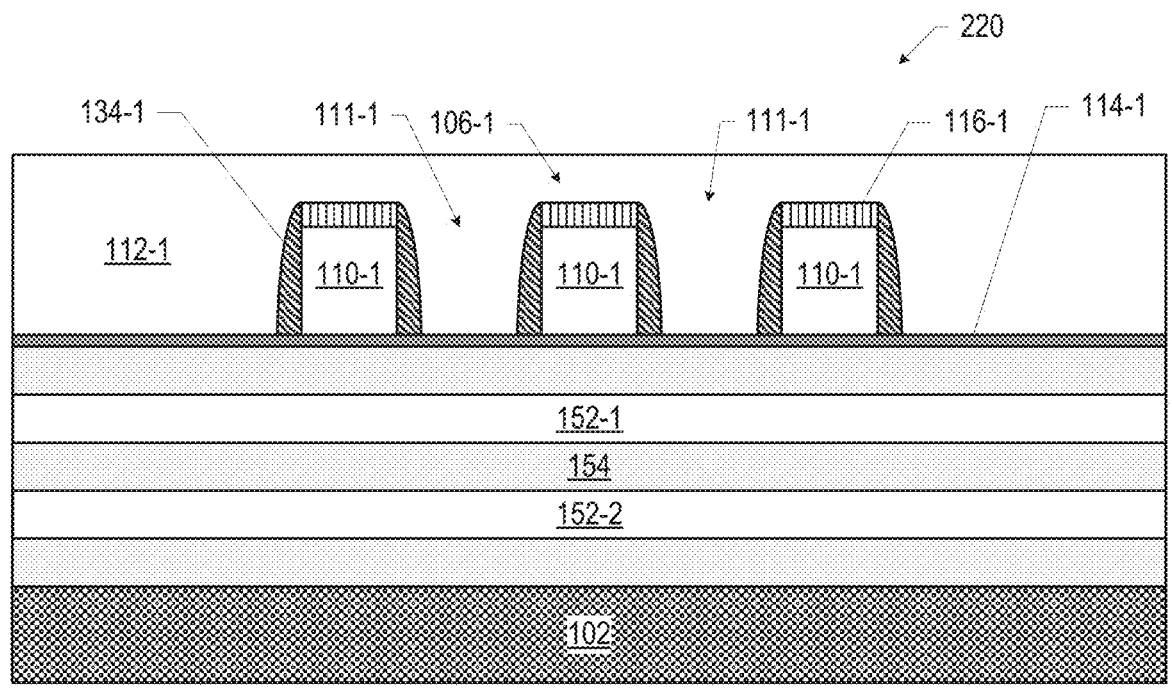

FIG. 17 is a cross-sectional view of an assembly 220 subsequent to providing the gate metal 112-1 on the assembly 218 (FIG. 16). The gate metal 112-1 may fill the openings 111-1 between adjacent portions of the gate 106-1, and may extend over the tops of the gate 106-1 and beyond the outer side faces of the gate 106-1.

Figure 18:
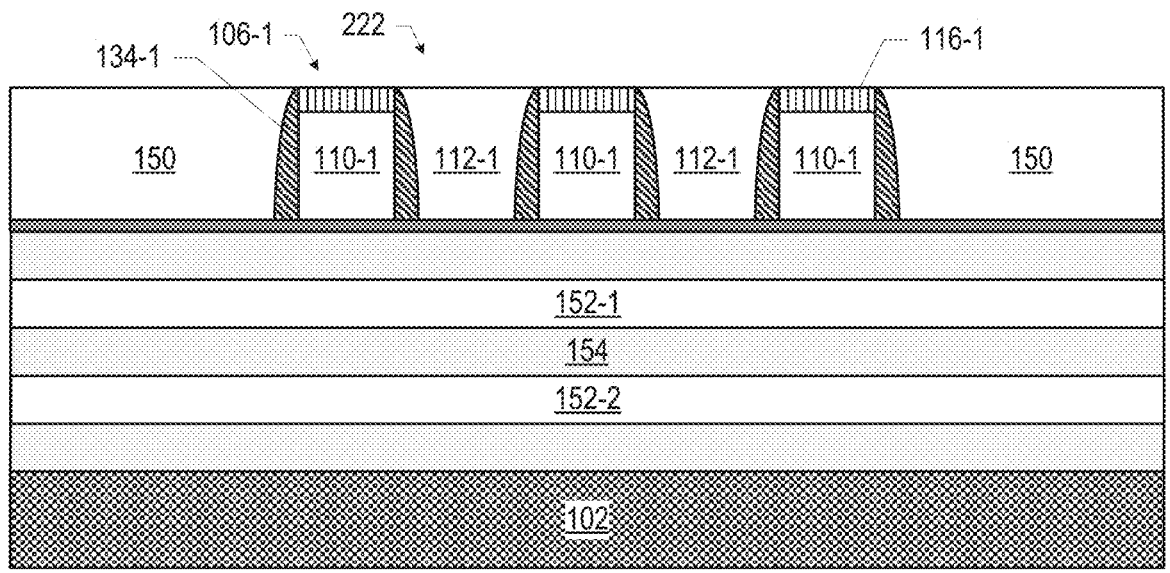

FIG. 18 is a cross-sectional view of an assembly 222 subsequent to planarizing the assembly 220 (FIG. 17) to remove the gate metal 112-1 above the gate 106-1. In some embodiments, the assembly 220 may be planarized to form the assembly 222 using a CMP technique. Some of the remaining gate metal 112-1 may fill the openings 111-1 between adjacent portions of the gate 106-1, while other portions 150 of the remaining gate metal 112-1 may be located "outside" of the gate 106-1.

Figure 19:
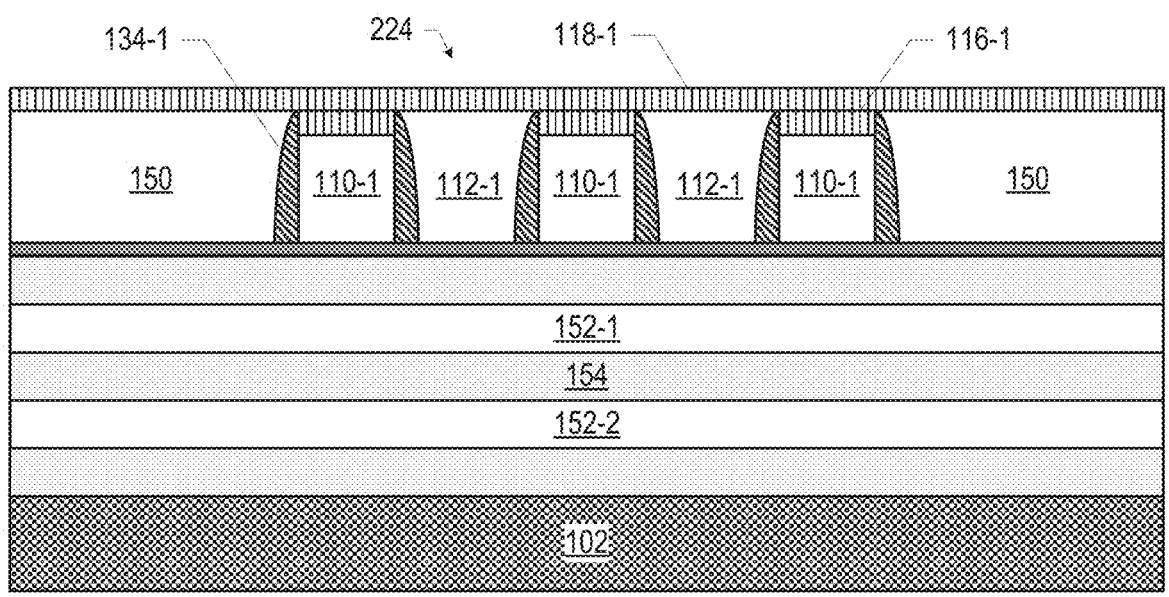

FIG. 19 is a cross-sectional view of an assembly 224 subsequent to providing a hardmask 118-1 on the planarized surface of the assembly 222 (FIG. 18). The hardmask 118-1 may be formed of any of the materials discussed above with reference to the hardmask 116-1, for example.

Figure 20:
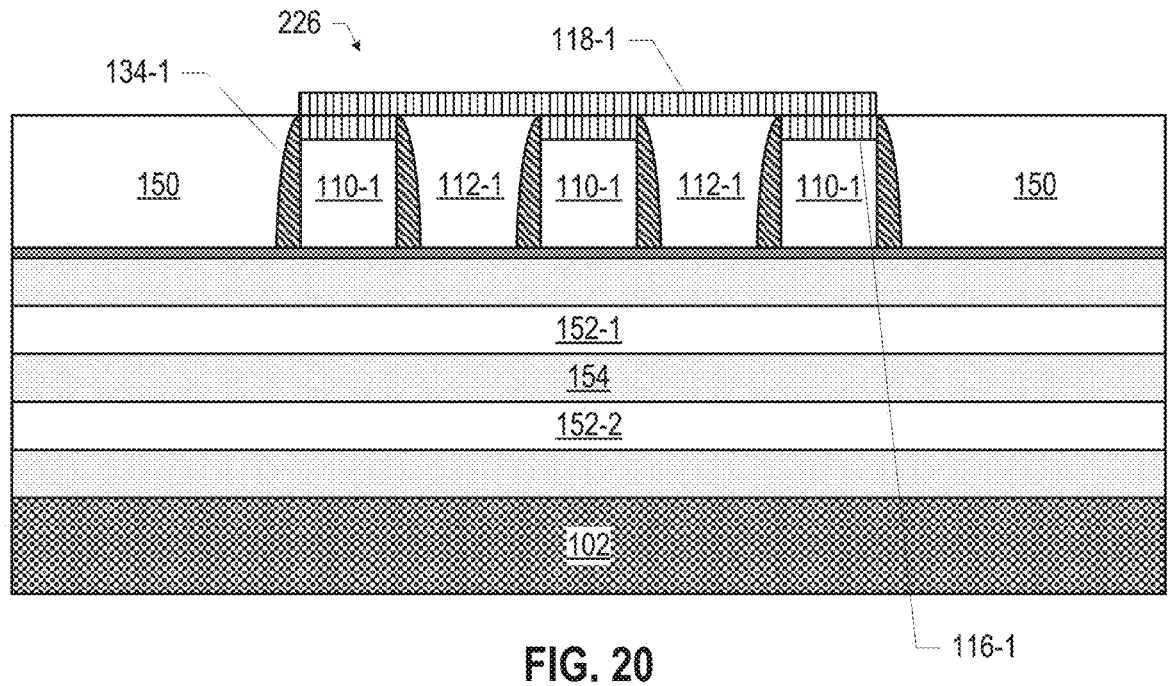

FIG. 20 is a cross-sectional view of an assembly 226 subsequent to patterning the hardmask 118-1 of the assembly 224 (FIG. 19). The pattern applied to the hardmask 118-1 may extend over the hardmask 116-1 (and over the gate metal 110-1 of the gate 106-1, as well as over the locations for the gates 108-1 (as illustrated in FIG. 2). The hardmask 118-1 may be non-coplanar with the hardmask 116-1, as illustrated in FIG. 20. The hardmask 118-1 illustrated in FIG. 20 may thus be a common, continuous portion of hardmask 118-1 that extends over all of the hardmask 116-1; in other embodiments, the hardmask 118-1 may not be disposed over the entirety of the hardmask 116-1. The hardmask 118-1 may be patterned using any of the techniques discussed above with reference to the patterning of the hardmask 116-1, for example.

Figure 21:
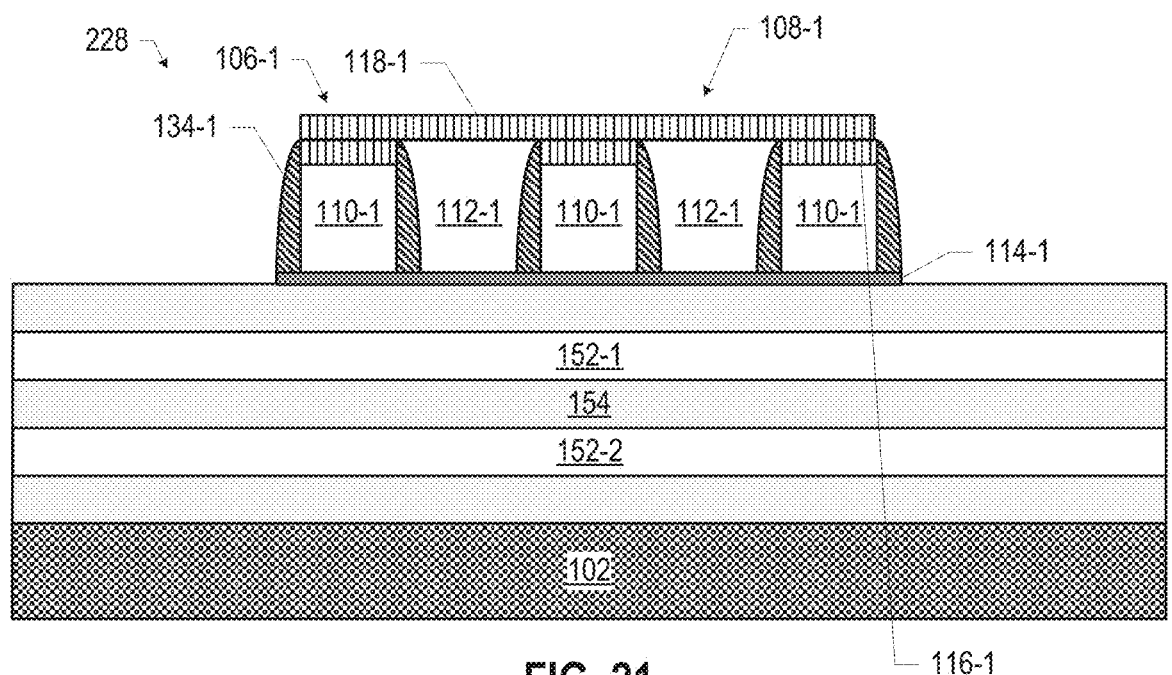

FIG. 21 is a cross-sectional view of an assembly 228 subsequent to etching the assembly 226 (FIG. 20) to remove the portions 150 that are not protected by the patterned hardmask 118-1 to form the gates 108-1. Portions of the hardmask 118-1 may remain on top of the hardmask 116-1, as shown. The operations performed on the assembly 226 may include removing any gate dielectric 114-1 that is "exposed" on the quantum well stack 146, as shown. The excess gate dielectric 114-1 may be removed using any suitable technique, such as chemical etching or silicon bombardment.

Figure 22:
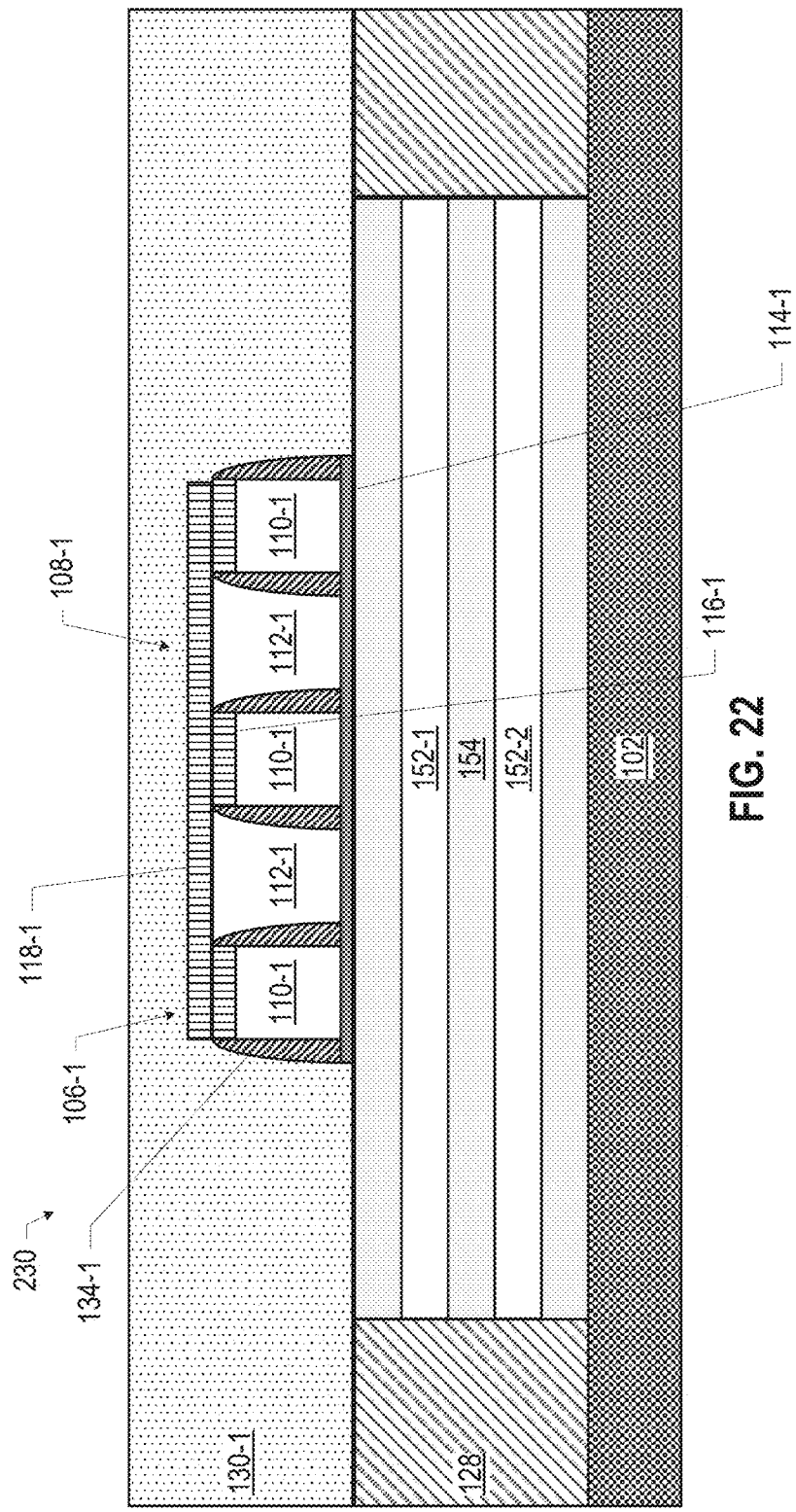

FIG. 22 is a cross-sectional view of an assembly 230 subsequent to providing an insulating material 130-1 on the assembly 228 (FIG. 21). As noted above, FIG. 22 (and FIGS. 23-29 and 31-34) represent a "zoomed out" view, showing the insulating material 128 disposed at the side faces of the quantum well stack 146. The insulating material 130-1 may take any of the forms discussed above. For example, the insulating material 130-1 may be a dielectric material, such as silicon oxide. The insulating material 130-1 may be provided on the assembly 228 using any suitable technique, such as spin coating, chemical vapor deposition (CVD), or plasma-enhanced CVD (PECVD). In some embodiments, the insulating material 130-1 may be polished back after deposition, and before further processing. In some embodiments, the assembly 230 may be planarized to remove the hardmasks 116-1 and 118-1, then additional insulating material 130-1 may optionally be provided on the planarized surface; in such an embodiment, the hardmasks 116-1 and 118-1 would not be present in the quantum dot device 100.

Figure 23:
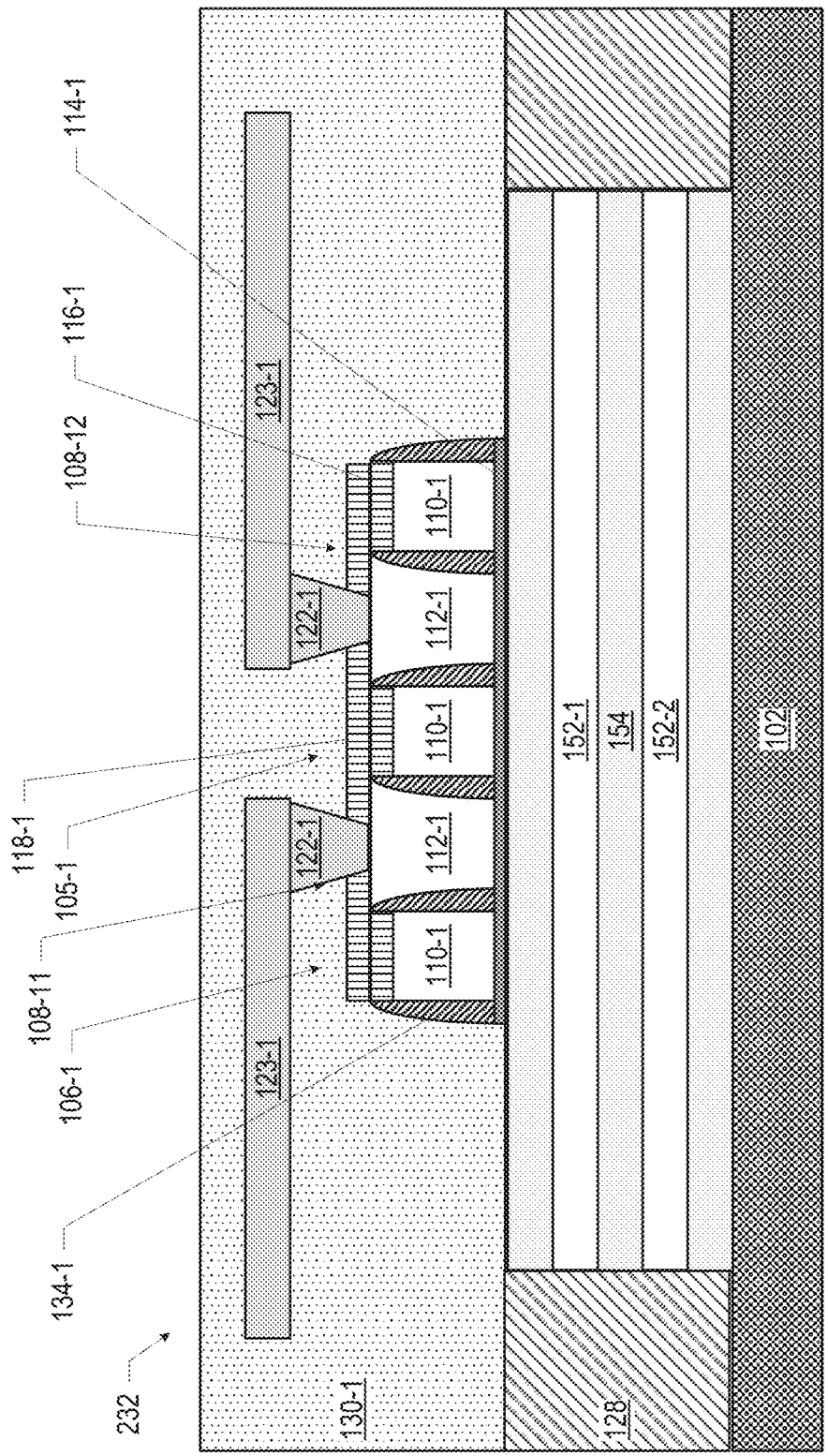

FIG. 23 is a cross-sectional view of an assembly 232 subsequent to forming conductive vias 122-1 and conductive lines 123-1 in electrical contact with the gate metal 112-1 of the gates 108-1 of the assembly 230 (FIG. 22), as well as forming conductive vias 120-1 and conductive lines 129-1 in electrical contact with the gate metal 110-1 of the gate 106-1 (not shown in FIG. 23, but illustrated in FIG. 3). The conductive vias and lines may be formed using any conventional interconnect technique (e.g., depositing the insulating material 130-1, forming cavities for the vias, filling the cavities with conductive material for the vias, depositing additional insulating material 130-1, forming trenches for the lines, filling the trenches with conductive material for the lines, etc.). Generally, conductive vias and lines included in the quantum dot devices 100 disclosed herein may be formed using any suitable additive, subtractive, semi-additive/subtractive, or other known interconnect formation technique.

Figure 24:
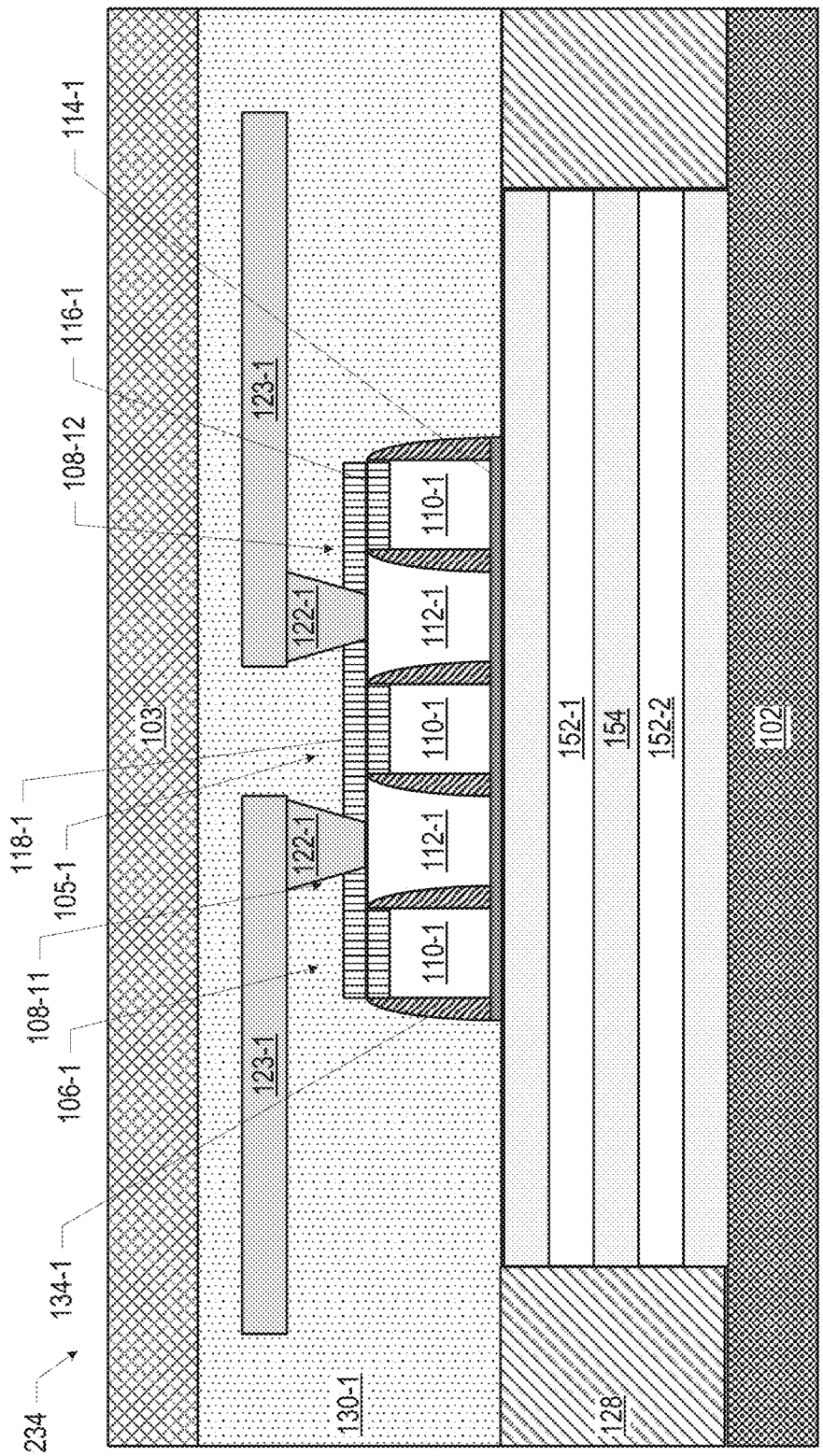

FIG. 24 is a cross-sectional view of an assembly 234 subsequent to attaching a support 103 to the insulating material 130-1 of the assembly 232 (FIG. 23). The support 103 may take any suitable form for providing mechanical support for the operations discussed below. For example, in some embodiments, the support 103 may be a carrier wafer and may be secured to the insulating material 130-1 using an adhesive. In some embodiments, the support 103 may be a mechanical fixture that may be temporarily secured to the insulating material 130-1 (e.g., by clamping or using a fastener), and removed when no longer needed.

Figure 25:
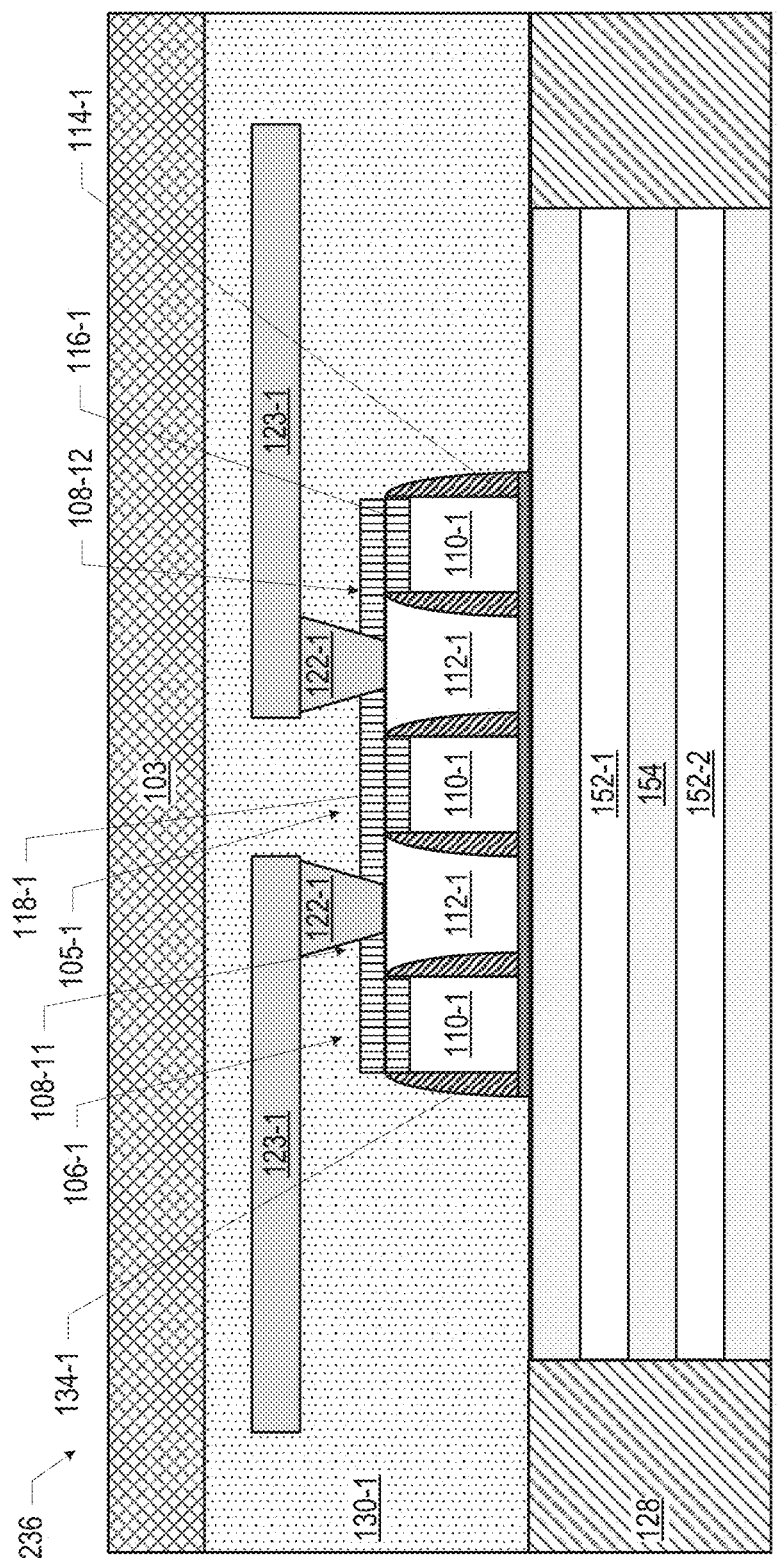

FIG. 25 is a cross-sectional view of an assembly 236 subsequent to removing the base 102 from the assembly 234 (FIG. 24). The quantum well stack 146 may remain secured to the gates 106-1/108-1 and the insulating material 130-1 (which may be mechanically supported by the support 103). Any suitable technique may be used to separate the base 102 from the rest of the assembly 234. For example, in some embodiments, an ion implantation and wafer bonding technique may be used in which the support 103 is adhered to the assembly 232 (as discussed above with reference to FIG. 24) and then the base 102 is polished or etched away. In some embodiments, the base 102 may be mechanically separated from the rest of the assembly 234, and then the "broken" surface of the assembly 236 may be polished or etched.

Figure 26:
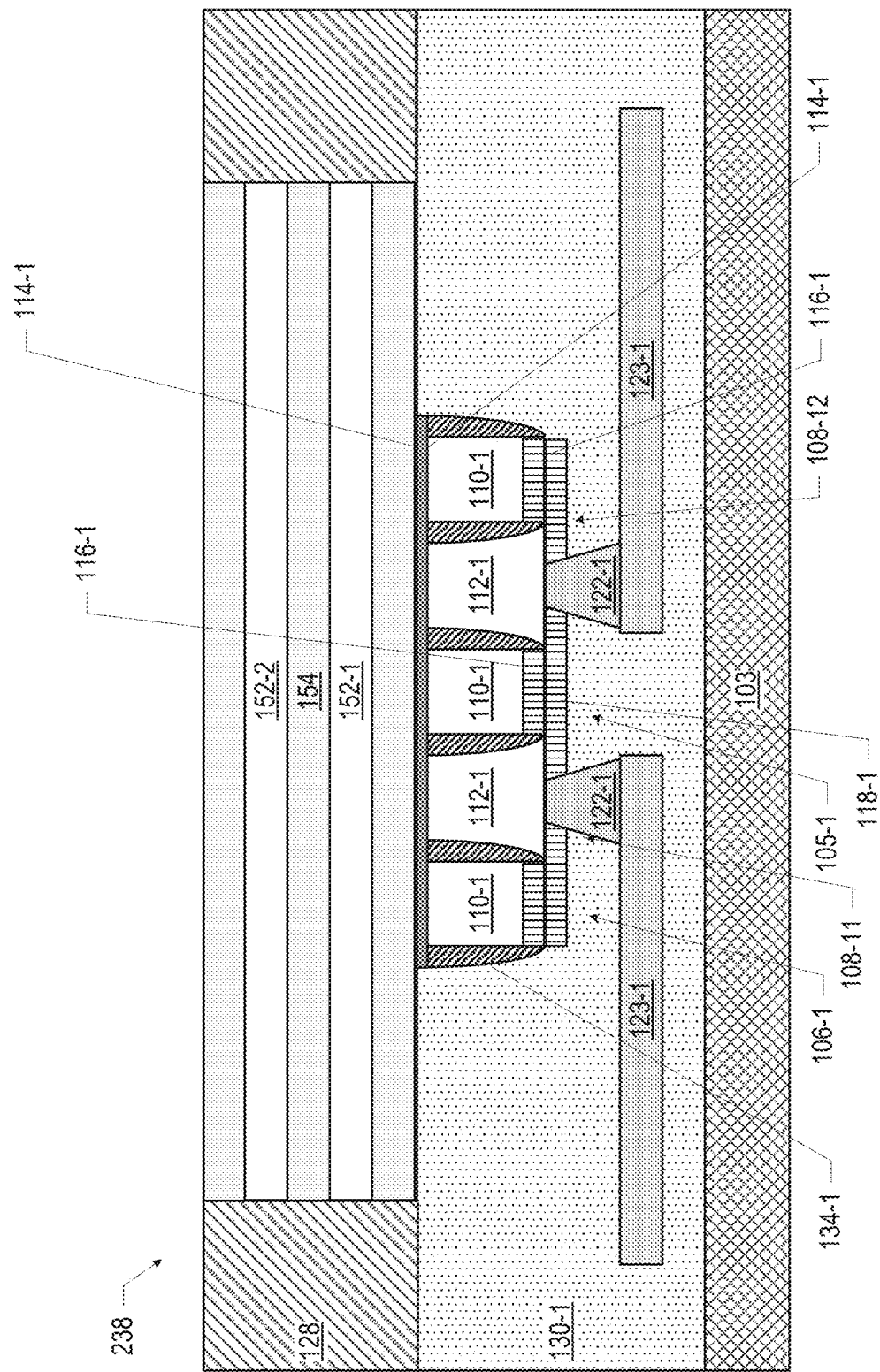

FIG. 26 is a cross-sectional view of an assembly 238 subsequent to turning the assembly 236 (FIG. 25) "upside down" so that further processing may be performed on the exposed quantum well stack 146. In some embodiments, the assembly 236 need not be physically reoriented (as illustrated in FIG. 26) in order for subsequent processing operations to be performed.

Figure 27:
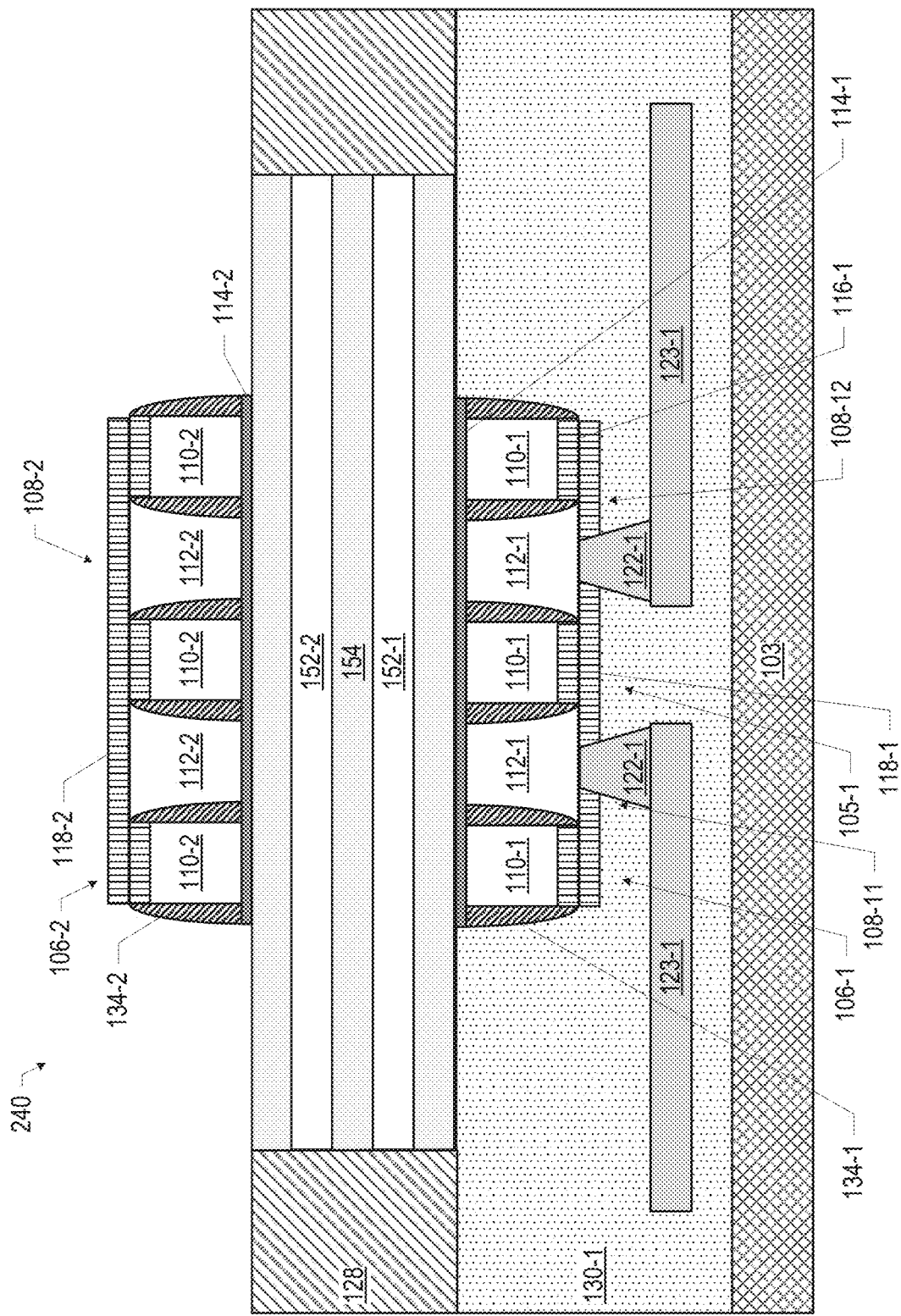

FIG. 27 is a cross-sectional view of an assembly 240 subsequent to forming gates 106-2/108-2 with a gate dielectric 114-2 on the quantum well stack 146 proximate to the quantum well layer 152-2. The gates 106-2/108-2 may be formed using any of the techniques discussed above with reference to the formation of the gates 106-1/108-1 (e.g., discussed above with reference to FIGS. 11-21), or any other suitable technique (such as any of the other techniques discussed herein, including the techniques discussed below with reference to FIGS. 38-42). For example, as shown in FIG. 27, hardmasks 116-2 and 118-2 may be part of the gates 106-2/108-2, analogously to the hardmasks 116-1 and 118-1 of the gates 106-1/108-1.

Figure 28:
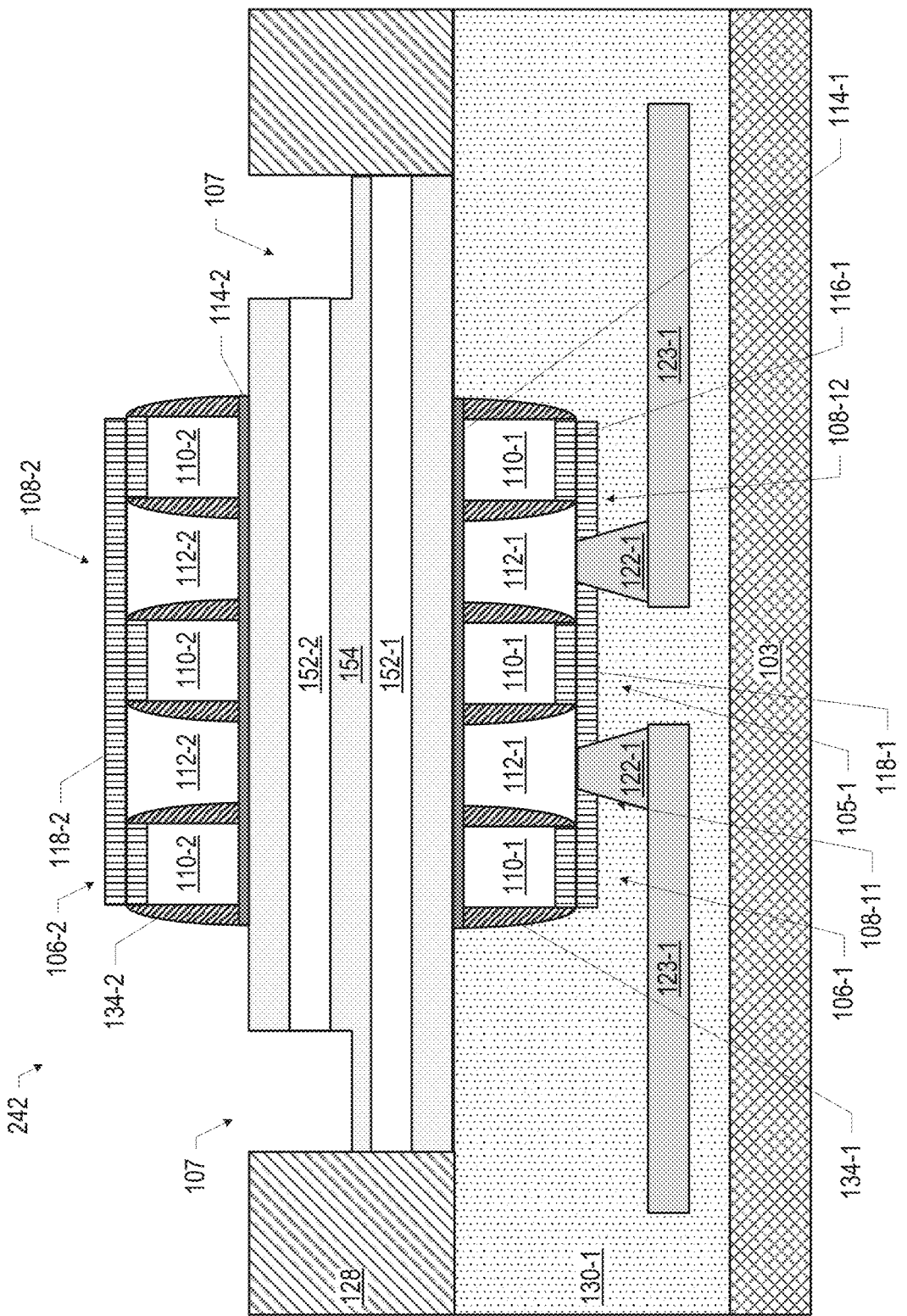

FIG. 28 is a cross-sectional view of an assembly 242 subsequent to forming recesses 107 in the quantum well stack 146 of the assembly 240 (FIG. 27). The recesses 107 may be formed using any of the patterning techniques discussed above with reference to FIG. 7, and as discussed above, may extend down to the barrier layer 154. In some embodiments, the recesses 107 may extend down into the quantum well layer 152-1. In embodiments in which the quantum well stack 146 includes a single quantum well layer 152, the recesses 107 may not be formed.

Figure 29:
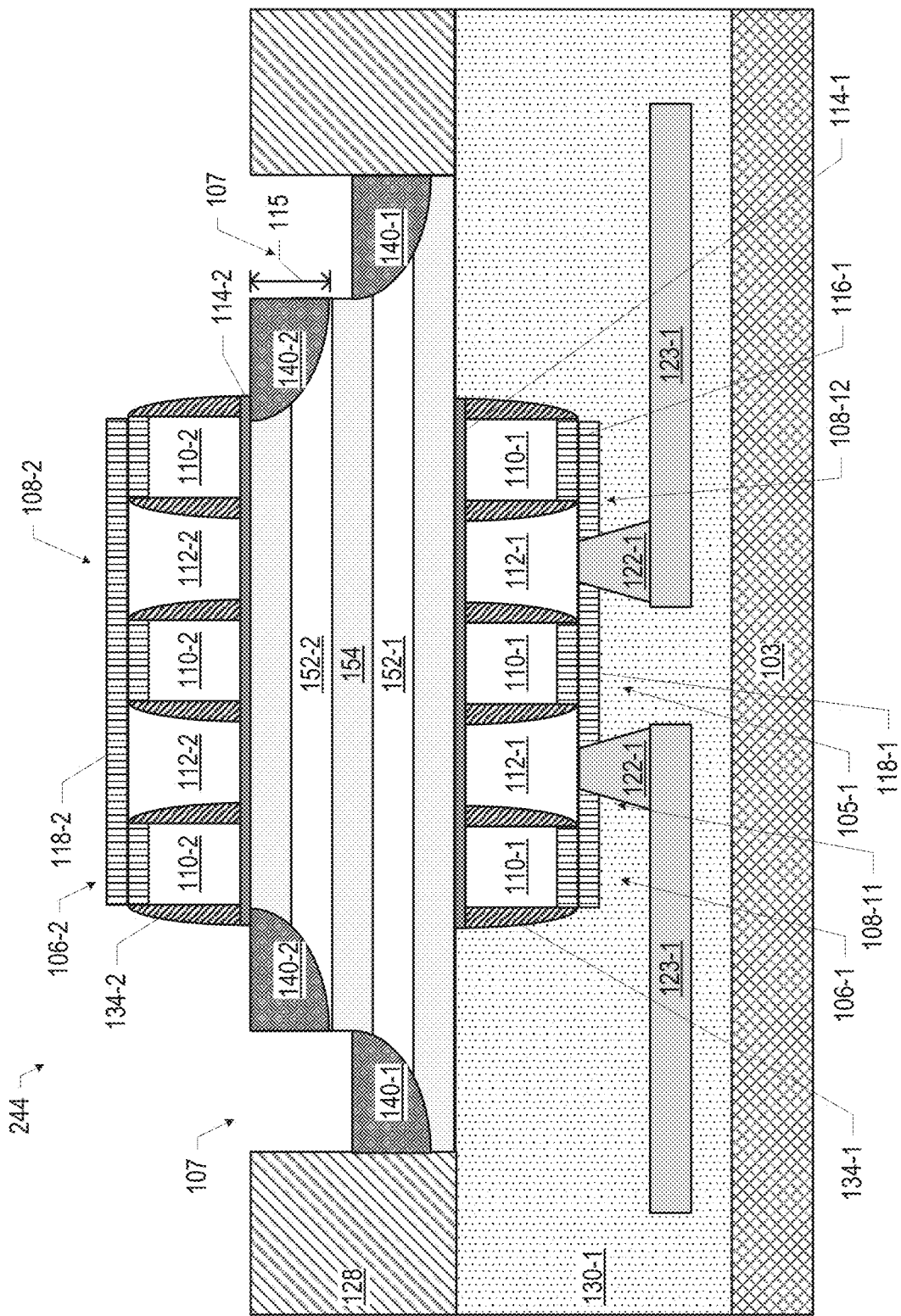
Figure 30:
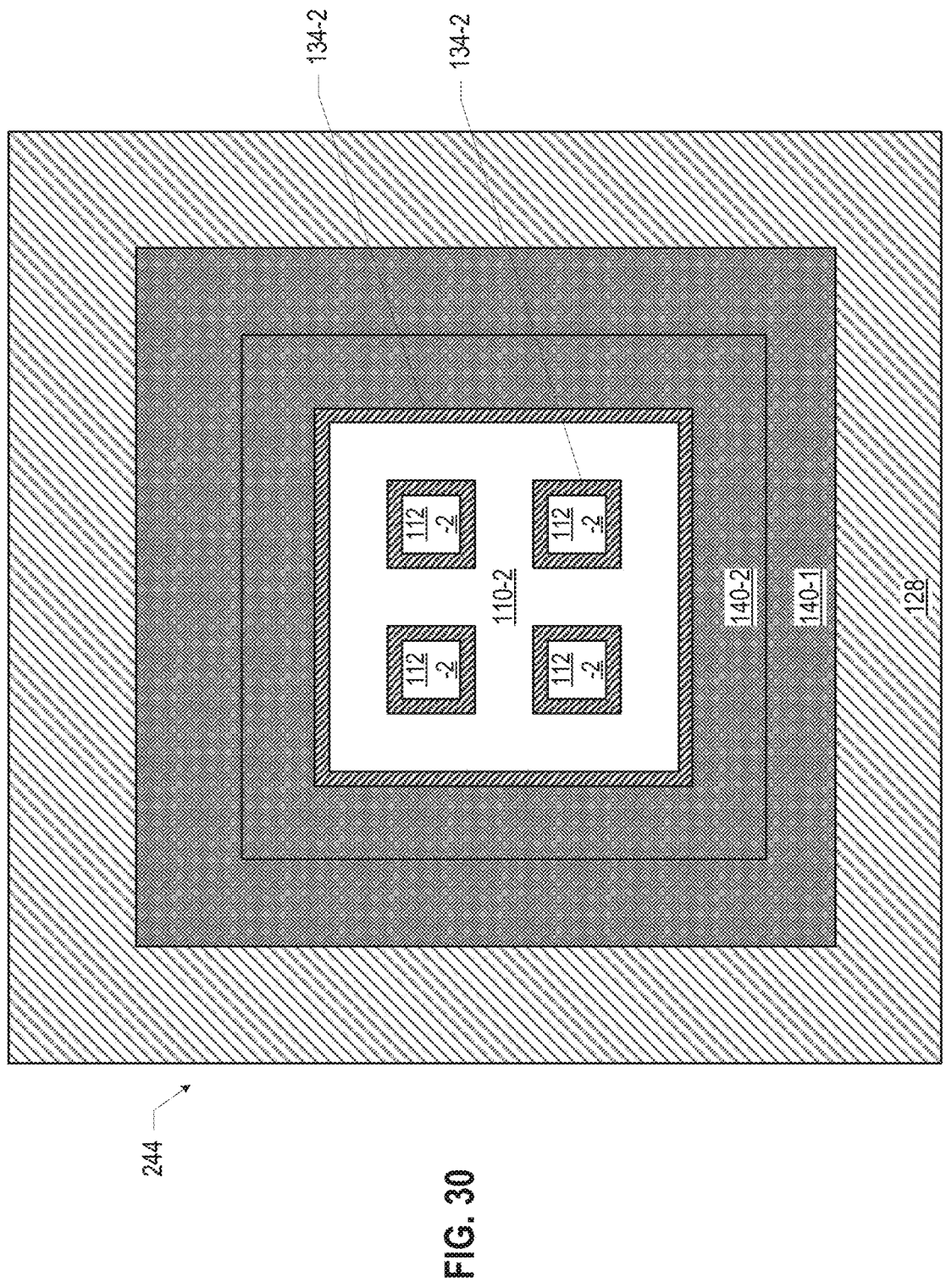

FIG. 29 is a cross-sectional view of an assembly 244 subsequent to doping the quantum well stack 146 of the assembly 242 (FIG. 28) to form doped regions 140-1 at the bottoms of the recesses 107 in the quantum well stack 146, and doped regions 140-2 adjacent to the gates 106-2/108-2. The doped regions 140-1 may be in conductive contact with the quantum well layer 152-1, and the doped regions 140-2 may be in conductive contact with the quantum well layer 152-2. FIG. 30 is a top view of the assembly 244, showing the doped regions 140-1 and 140-2.

The type of dopant used to form the doped regions 140 may depend on the type of quantum dot desired, as discussed above. In some embodiments, the doping may be performed by ion implantation. For example, when a quantum dot 142 is to be an electron-type quantum dot 142, the doped regions 140 may be formed by ion implantation of phosphorous, arsenic, or another n-type material. When a quantum dot 142 is to be a hole-type quantum dot 142, the doped regions 140 may be formed by ion implantation of boron or another p-type material. An annealing process that activates the dopants and causes them to diffuse farther into the quantum well stack 146 may follow the ion implantation process. The depth of the doped regions 140 may take any suitable value; for example, in some embodiments, the doped regions 140 may each have a depth 115 between 500 and 1000 Angstroms.

The spacers 134-2 on the outer faces of the gate 106-2 may provide a doping boundary, limiting diffusion of the dopant from the doped regions 140-2 into the area under the gates 106-2/108-2. As shown, the doped regions 140-2 may extend under the adjacent spacers 134-2. In some embodiments, the doped regions 140-2 may extend past the adjacent spacers 134-2 and under the gate metal 110-2 of the gate 106-2, may extend only to the boundary between the adjacent spacers 134-2 and the adjacent gate metal 110-2, or may terminate under the adjacent spacers 134-2 and not reach the boundary between the adjacent spacers 134-2 and the adjacent gate metal 110-2. Examples of such embodiments are discussed below with reference to FIGS. 43 and 44. The doping concentration of the doped regions 140 may, in some embodiments, be between $10^{17}/cm^3$ and $10^{20}/cm^3$.

Figure 31:
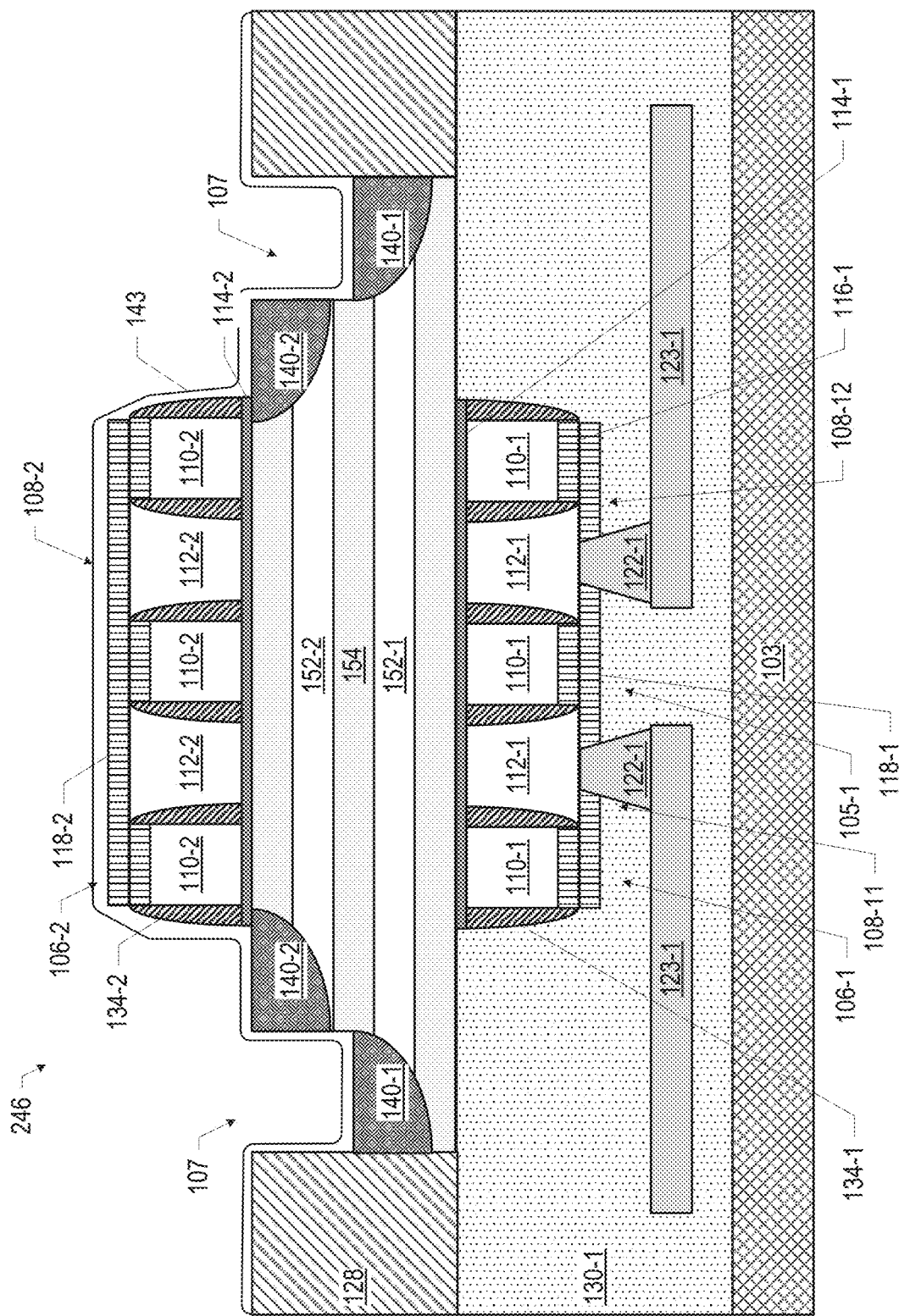

FIG. 31 is a cross-sectional side view of an assembly 246 subsequent to providing a layer of nickel or other material 143 over the assembly 244 (FIGS. 29 and 30). The nickel or other material 143 may be deposited on the assembly 244 using any suitable technique (e.g., a plating technique, chemical vapor deposition, or atomic layer deposition).

Figure 32:
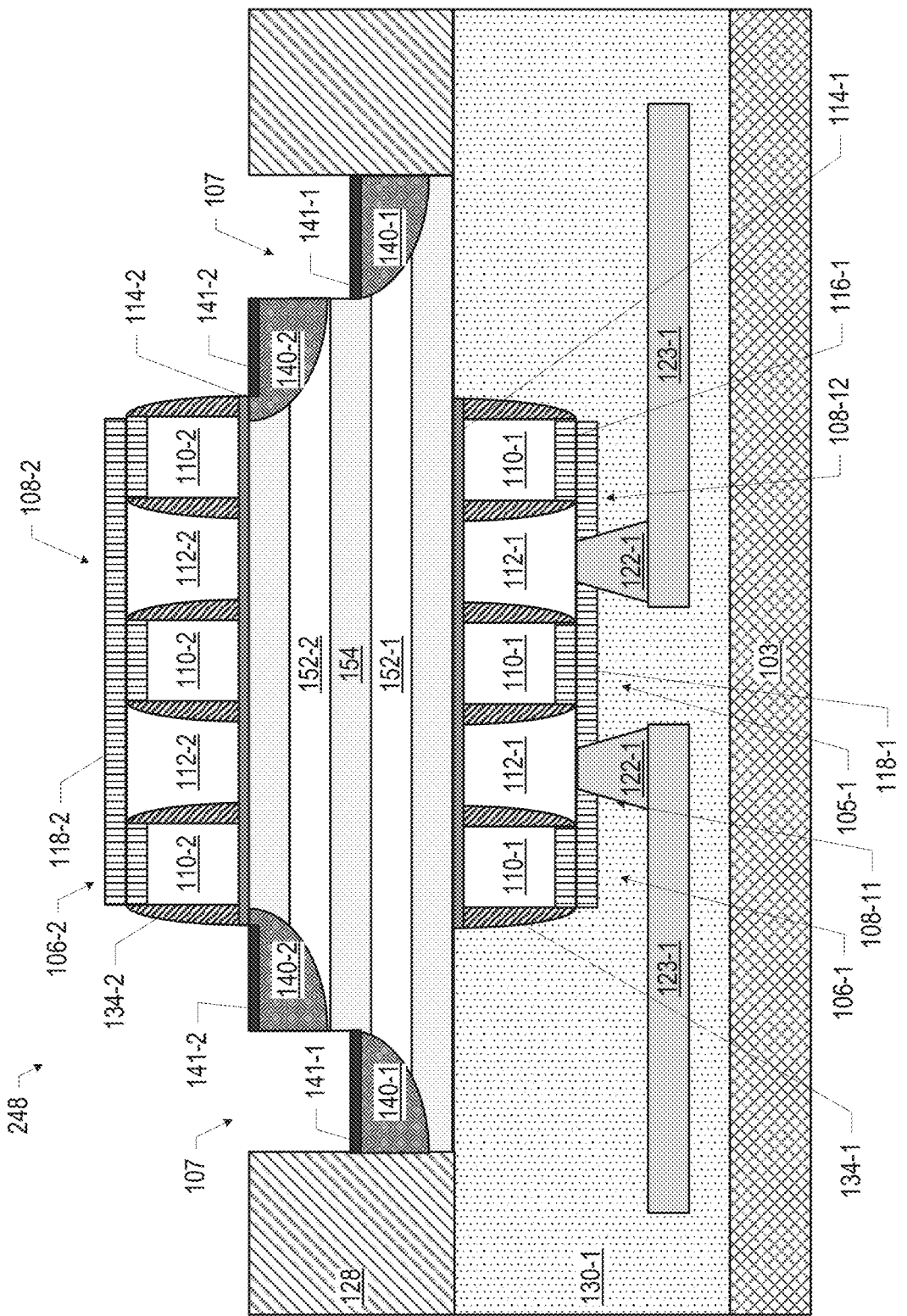

FIG. 32 is a cross-sectional side view of an assembly 248 subsequent to annealing the assembly 246 (FIG. 31) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 31 in order to form other interface materials 141, including titanium, aluminum, molybdenum, cobalt, tungsten, or platinum, for example. More generally, the interface material 141 of the assembly 248 may include any of the materials discussed herein with reference to the interface material 141.

Figure 33:
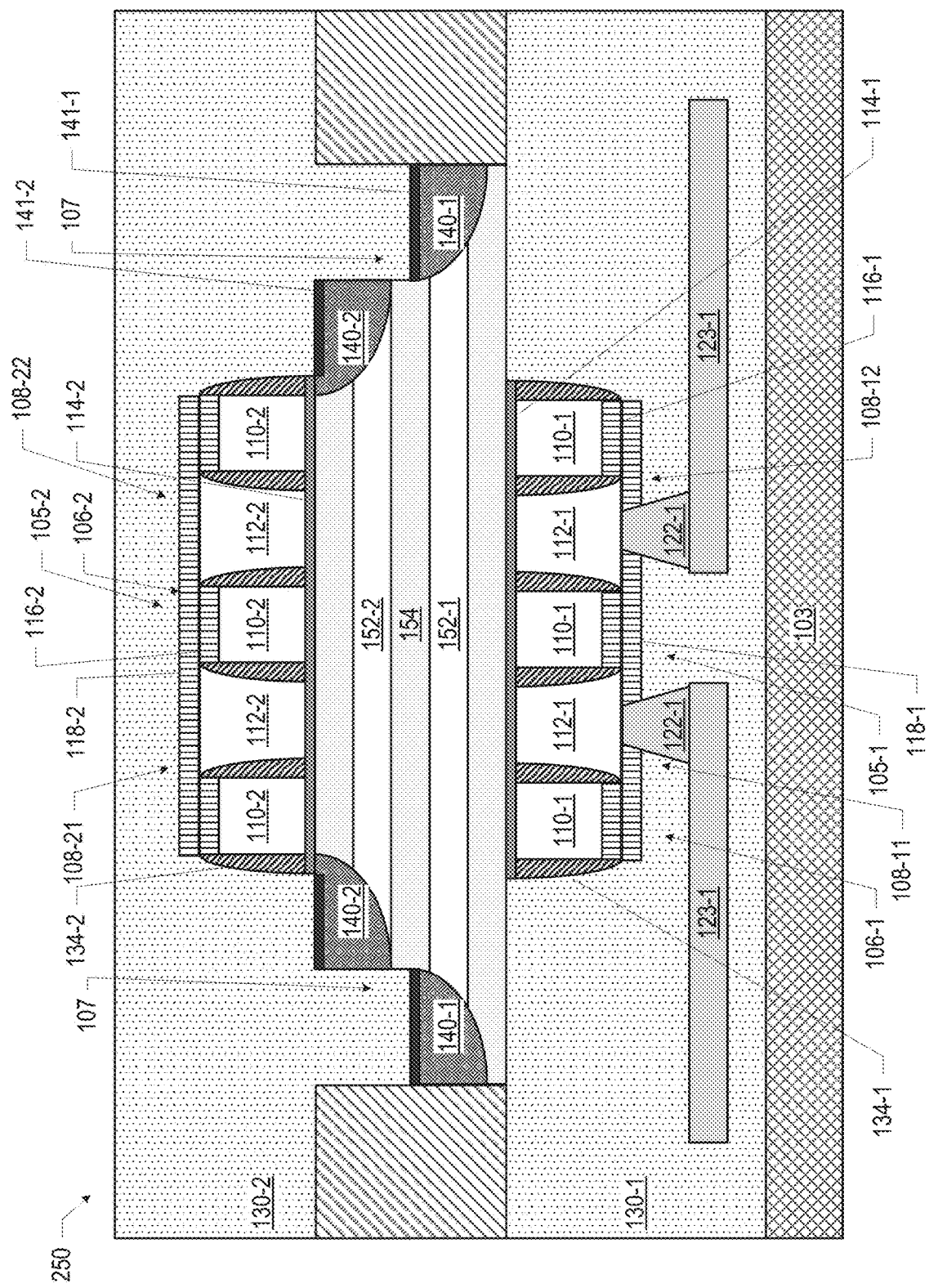

FIG. 33 is a cross-sectional view of an assembly 250 subsequent to providing an insulating material 130-2 on the assembly 248 (FIG. 32). The insulating material 130-2 may take any of the forms discussed above. For example, the insulating material 130-2 may be a dielectric material, such as silicon oxide. The insulating material 130-2 may be provided on the assembly 248 using any suitable technique, such as spin coating, chemical vapor deposition (CVD), or plasma-enhanced CVD (PECVD). In some embodiments, the insulating material 130-2 may be polished back after deposition, and before further processing.

Figure 34:
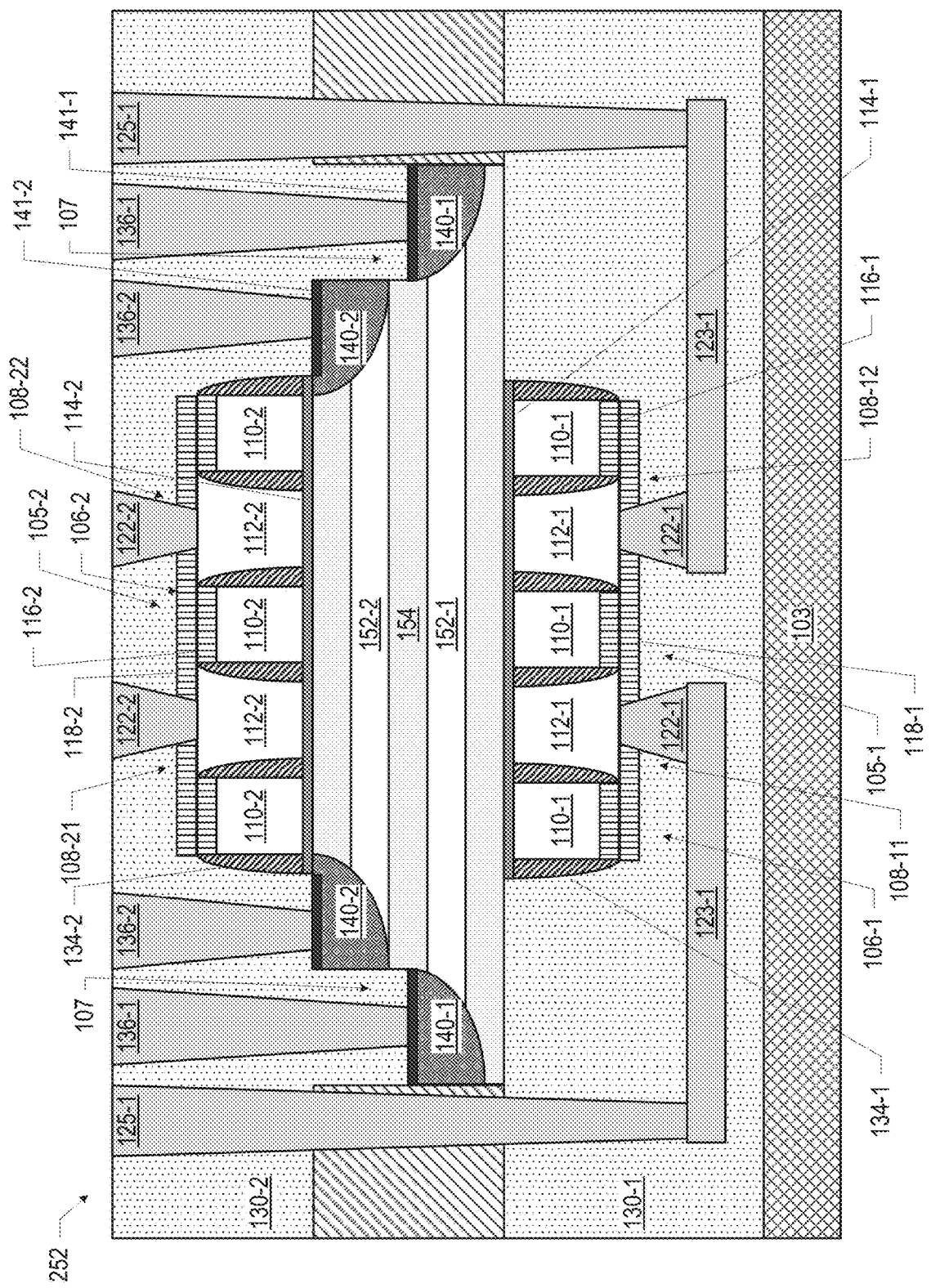

FIG. 34 is a cross-sectional view of an assembly 252 subsequent to forming, in the assembly 250 (FIG. 33), conductive vias 122-2 through the insulating material 130-2 (and the hardmask 118-2) to contact the gate metal 112-2 of the gates 108-2, conductive vias 136-2 through the insulating material 130-2 to contact the interface material 141-2 of the doped regions 140-2, conductive vias 136-1 through the insulating material 130-2 to contact the interface material 141-1 of the doped regions 140-1, and conductive vias 125-1 through the insulating material 130-2, the insulating material 128, and the insulating material 130-1 to contact the conductive lines 123-1 (to make electrical contact with the gate metal 112-1 of the gates 108-1). The assembly 252 may also include conductive vias 120-2 formed through the insulating material 130-2 (and the hardmasks 116-2 and 118-2) to contact the gate metal 110-2 of the gate 106-2, and conductive vias 127-1 formed through the insulating material 130-2, the insulating material 128, and the insulating material 130-1 to contact the conductive lines 129-1 (to make electrical contact with the gate metal 110-1 of the gate 106-1); the conductive vias 120-2 and 127-1 do not appear in the cross-sectional view of FIG. 34, but may take the form illustrated in FIG. 3. Further conductive vias and/or lines may be formed on the assembly 250 using conventional interconnect techniques, if desired. The resulting assembly 252 may take the form of the quantum dot device 100 discussed above with reference to FIGS. 1-4. In some embodiments, the assembly 250 may be planarized to remove the hardmasks 116-2 and 118-2, then additional insulating material 130-2 may be provided on the planarized surface before forming the conductive vias 120, 122, 125, 127, and 136; in such an embodiment, the hardmasks 116-2 and 118-2 would not be present in the quantum dot device 100.

Figure 35:
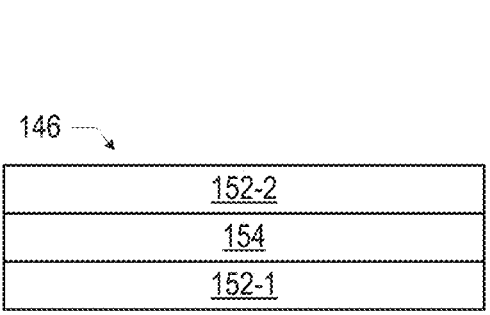
FIGS. 35-36 are cross-sectional views of various examples of quantum well stacks that may be used in a quantum dot device, in accordance with various embodiments.
Figure 36:
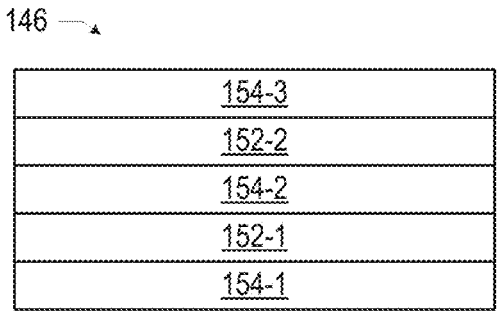

As noted above, a quantum well stack 146 included in a quantum dot device 100 may take any of a number of forms, several of which are illustrated in FIGS. 35-36. Although the quantum well stacks 146 illustrated in FIGS. 35-36 each include two quantum well layers 152, in some embodiments, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIGS. 35-36 to achieve such embodiments, as appropriate.

FIG. 35 is a cross-sectional view of a quantum well stack 146 including a quantum well layer 152-1, a barrier layer 154, and a quantum well layer 152-2. In some embodiments, the quantum well layers 152 of FIG. 35 may be formed of intrinsic silicon, and the gate dielectrics 114 may be formed of silicon oxide; in such an arrangement, during use of the quantum dot device 100, a 2DEG may form in the intrinsic silicon at the interface between the intrinsic silicon and the proximate silicon oxide. Embodiments in which the quantum well layers 152 of FIG. 35 are formed of intrinsic silicon may be particularly advantageous for electron-type quantum dot devices 100. In some embodiments, the quantum well layers 152 of FIG. 35 may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 35 may provide a potential barrier between the quantum well layer 152-1 and the quantum well layer 152-2. In some embodiments in which the quantum well layers 152 of FIG. 35 are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the quantum well stack 146 of FIG. 35 may take any suitable values. For example, in some embodiments, the thickness of the barrier layer 154 (e.g., silicon germanium) may be between 0 and 400 nanometers. In some embodiments, the thickness of the quantum well layers 152 (e.g., silicon or germanium) may be between 5 and 30 nanometers.

The quantum well stack 146 of FIG. 35 may be disposed between the sets of gates 105-1 and 105-2, as discussed above. In some embodiments, the layers of the quantum well stack 146 of FIG. 35 (and FIG. 36) may be grown on the base 102 (and on each other) by epitaxy.

FIG. 36 is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. The quantum well stack 146 may be disposed on the gate dielectric 114-1 such that the barrier layer 154-1 is disposed between the quantum well layer 152-1 and the gate dielectric 114-1. The barrier layer 154-3 may be disposed between the quantum well layer 152-2 and the gate dielectric 114-2. In some embodiments, the barrier layer 154-3 may be formed of a material (e.g., silicon germanium), and when the quantum well stack 146 is being grown on the substrate 144, the barrier layer 154-3 may include a buffer region of that material. This buffer region may trap defects that form in this material as it is grown on the substrate 144, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. When the base 102 is separated from the rest of the assembly 236 during manufacturing of the quantum dot device 100 (e.g., as discussed above with reference to FIG. 25), the quantum well stack 146 may be "broken" in a buffer region of the barrier layer 154-3.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. The barrier layer 154-2 may take the form of any of the embodiments of the barrier layer 154 discussed above with reference to FIG. 35. The thicknesses (i.e., z-heights) of the layers in the quantum well stack 146 of FIG. 36 may take any suitable values. For example, in some embodiments, the thickness of the barrier layers 154-1 and 154-3 (e.g., silicon germanium) may be between 0 and 400 nanometers. In some embodiments, the thickness of the quantum well layers 152 (e.g., silicon or germanium) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

In some embodiments, the quantum dot device 100 may include a gate interface material between the quantum well stack 146 and the gate dielectric 114. The gate interface material may provide an interface between the quantum well stack 146 and the gate dielectric 114 that has a low total interface trap density ($D_{it}$), reducing the likelihood of scattering that may impede the coherence of the quantum dots 142 formed in the quantum dot device 100. The gate interface material may include any suitable material to improve the $D_{it}$ of the gates 106/108 on the quantum well stack 146. In some embodiments, the gate interface material may include silicon. Silicon may be a particularly useful material for the gate interface material when the quantum well stack 146 includes silicon germanium (e.g., as a barrier layer 154), and the gate interface material is disposed on the silicon germanium. In some embodiments in which the gate interface material includes silicon, the silicon may oxidize (e.g., due to air exposure before the gate dielectric 114 is formed) to form a layer of silicon oxide at the interface between the silicon of the gate interface material and the gate dielectric 114. In some embodiments, the gate interface material may include aluminum nitride, aluminum oxynitride, or germanium oxide. In embodiments in which the gate interface material includes germanium oxide, the gate interface material may be formed by forming a layer of germanium, then allowing the layer of germanium to oxidize. In some embodiments, the gate interface material may be a thin layer grown by epitaxy on a quantum well stack 146. For example, in embodiments in which the quantum well stack 146 includes a silicon germanium barrier layer 154 between a quantum well layer and the gate 106/108, the gate interface material (e.g., silicon) may be grown directly on the silicon germanium barrier. In some embodiments, the gate dielectric 114 (e.g., hafnium oxide) may be grown on top of the gate interface material. The interface between the gate interface material and the gate dielectric 114 may have fewer electrical defects than if the gate dielectric 114 were formed directly on the quantum well stack.

Although the etched quantum well stacks 146 have been illustrated in many of the preceding figures as substantially rectangular with parallel sidewalls, this is simply for ease of illustration, and the quantum well stacks 146 may have any suitable shape (e.g., a shape appropriate to the manufacturing processes used to shape the quantum well stacks 146). For example, in some embodiments, the quantum well stacks 146 may be tapered, narrowing as they extend away from the base 102 (FIG. 7). In some embodiments, the quantum well stacks 146 may taper by 3-10 nanometers in x-width for every 100 nanometers in z-height (e.g., 5 nanometers in x-width for every 100 nanometers in z-height).

Figure 37:
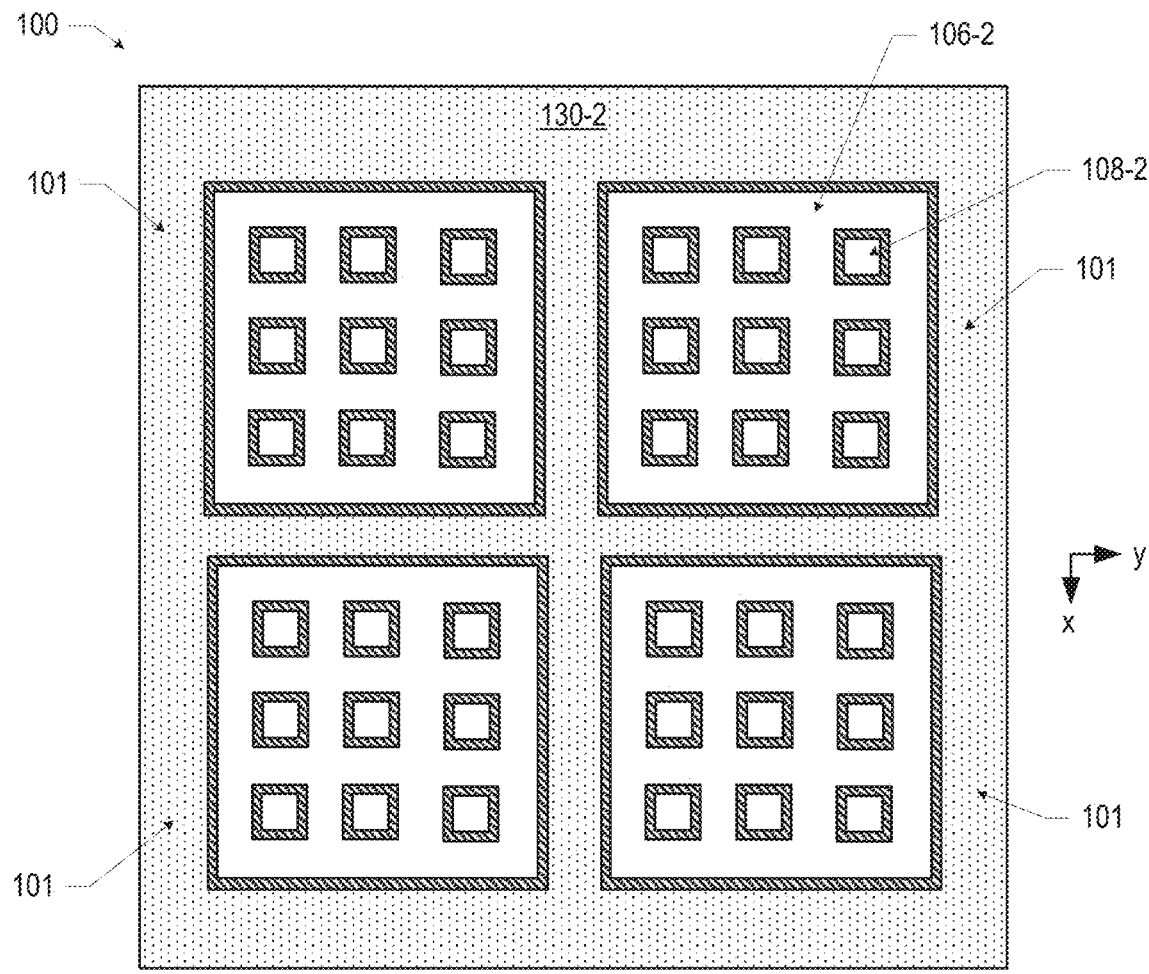
FIG. 37 illustrates an embodiment of a quantum dot device having multiple quantum dot formation regions, in accordance with various embodiments.

Although only a single quantum dot formation region 104 is illustrated in FIGS. 1-4 (and FIGS. 5-34), a quantum dot device 100 may include any number of quantum dot formation regions 104, arranged in any desired manner. For example, multiple quantum dot formation regions 104 may be arranged in a line, or in a rectangular array, or in any desired distribution. For example, FIG. 37 is a top cross-sectional view (analogous to the view of FIG. 1) of a quantum dot device 100 including four quantum dot formation regions 104 arranged in a 2×2 array. Each of the quantum dot formation regions 104 may take the form of any of the quantum dot formation regions disclosed herein (e.g., the quantum dot formation region 104 illustrated in FIG. 1). In particular, a single quantum dot device 100 may include multiple sets of gates 105-1 and/or 105-2, spaced apart. Multiple quantum dot formation regions 104 may be formed in parallel using the techniques discussed above with reference to FIGS. 5-34, for example. In some embodiments, multiple quantum dot formation regions 104 in a quantum dot device 100 may share common elements. For example, in some embodiments, multiple quantum dot formation regions 104 may share a common doped region 140 (located in any suitable location in the quantum dot device 100) to act as a reservoir for multiple quantum well layers 152. As discussed above, the particular number and arrangement of gates 106/108 in the embodiment of FIG. 37 is simply illustrative, and any suitable gate arrangement may be used in a quantum dot formation region 104. In some embodiments, different quantum dot formation regions 104 included in a single quantum dot device 100 may have different structures (e.g., different numbers and arrangements of gates 106/108, or different quantum well stacks 146).

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates 108 may extend beyond the spacers 134 in the x-direction.

As discussed above with reference to FIGS. 1-4, in some embodiments in which the gate dielectric 114 is not a layer shared commonly between the gates 108 and 106, but instead is separately deposited on the quantum well stack 146 between the spacers 134, the gate dielectric 114 may extend at least partially up the sides of the spacers 134, and the gate metal 112 may extend between the portions of gate dielectric 114 on the spacers 134. FIGS. 38-42 illustrate various alternative stages in the manufacture of such an embodiment of a quantum dot device 100, in accordance with various embodiments. In particular, the operations illustrated in FIGS. 38-42 may take the place of the operations illustrated in FIGS. 13-16 with reference to the formation of the gates 106-1/108-1, but the same stages may be used to form the gates 106-1/108-1 instead of or in addition to the gates 106-1/108-1.

Figure 38:
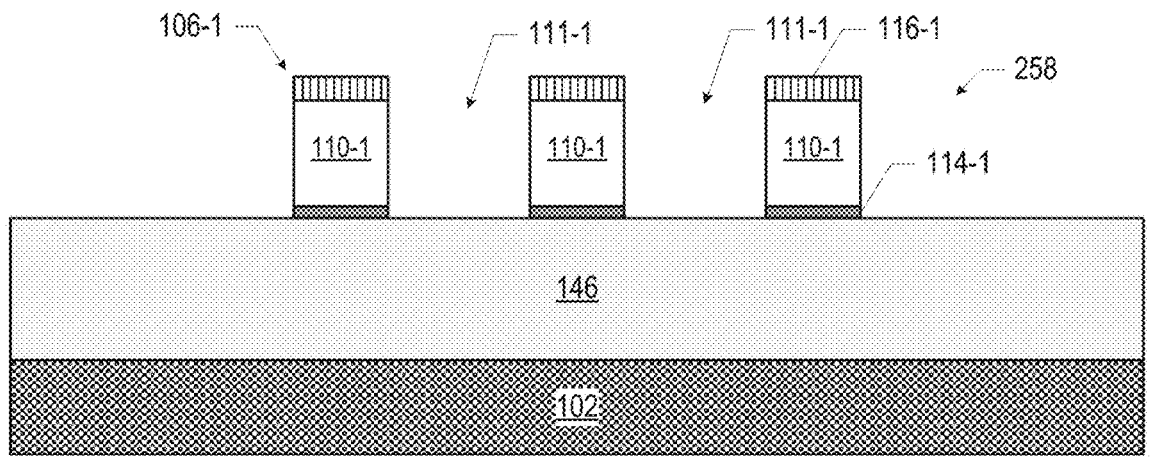

FIG. 38 is a cross-sectional view of an assembly 258 subsequent to etching the assembly 212 (FIG. 12) to remove the gate metal 110-1, and the gate dielectric 114-1 that is not protected by the patterned hardmask 116-1, to form the gate 106-1.

Figure 39:
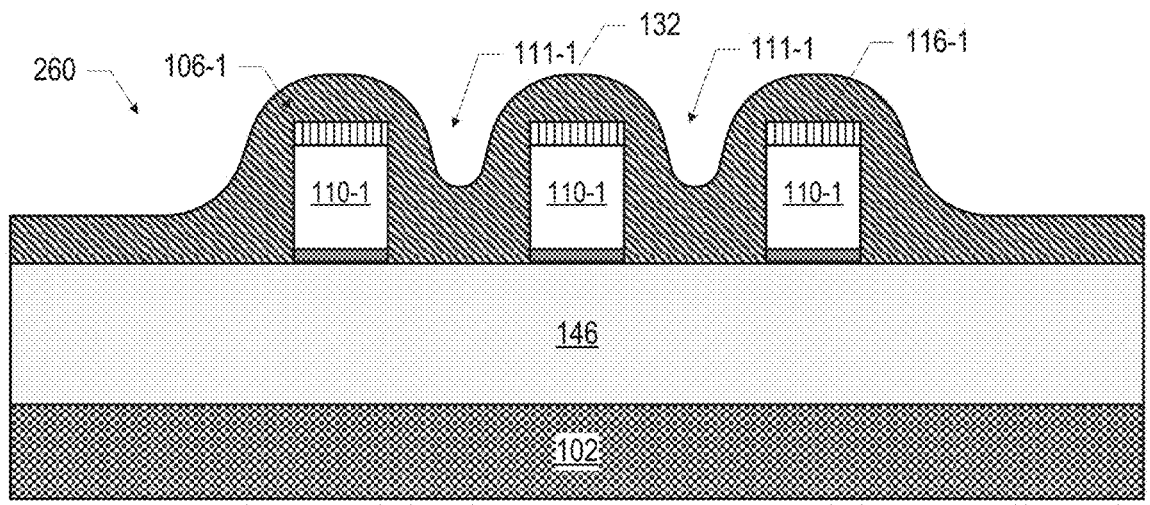

FIG. 39 is a cross-sectional view of an assembly 260 subsequent to providing spacer material 132 on the assembly 258 (FIG. 38). The deposition of the spacer material 132 may take any of the forms discussed above with reference to FIG. 15, for example.

Figure 40:
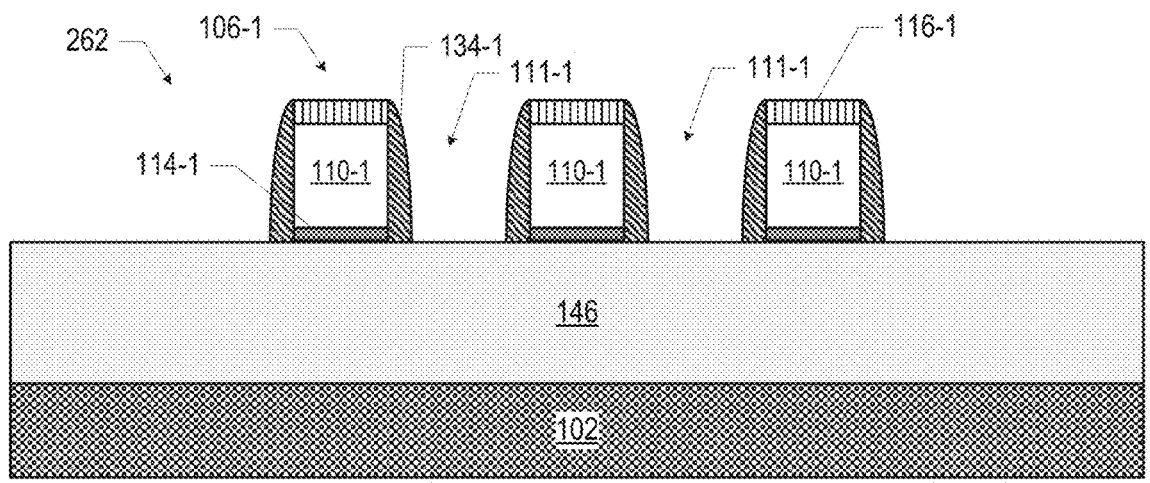

FIG. 40 is a cross-sectional view of an assembly 262 subsequent to etching the spacer material 132 of the assembly 260 (FIG. 39), leaving spacers 134-1 formed of the spacer material 132 on the side faces of the gate 106-1 (e.g., on the sides of the hardmask 116-1, the gate metal 110-1, and the gate dielectric 114-1). The etching of the spacer material 132 may take any of the forms discussed above with reference to FIG. 16, for example.

FIG. 41 is a cross-sectional view of an assembly 264 subsequent to providing a gate dielectric 114-1 on the quantum well stack 146 in the openings 111-1 between portions of the gate 106-1 of the assembly 262 (FIG. 40). In some embodiments, the gate dielectric 114-1 provided between the gates 106-1 of the assembly 262 may be formed by atomic layer deposition (ALD) and, as illustrated in FIG. 41, may cover the exposed quantum well stack 146 in the openings 111-1 and may extend onto the adjacent spacers 134-1.

FIG. 42 is a cross-sectional view of an assembly 266 subsequent to providing the gate metal 112-1 on the assembly 264 (FIG. 41). The gate metal 112-1 may fill the openings 111-1, and may extend over the tops of the gates 106-1, as shown. The provision of the gate metal 112-1 may take any of the forms discussed above with reference to FIG. 17, for example. The assembly 266 may be further processed as discussed above with reference to FIGS. 18-34.

As discussed above with reference to FIG. 30, the outer spacers 134-2 on the gate 106-2 may provide a doping boundary, limiting diffusion of the dopant from the doped regions 140-2 into the area under the gates 106-2/108-2. In some embodiments, the doped regions 140-2 may extend past the outer spacers 134-2 and under the gate 106-2. For example, as illustrated in FIG. 43, the doped region 140-2 may extend past the outer spacers 134-2 and under the gate 106-2 by a distance 182 between 0 and 10 nanometers. In some embodiments, the doped regions 140-2 may not extend past the outer spacers 134-2 toward the gate 106-2, but may instead "terminate" under the outer spacers 134-2. For example, as illustrated in FIG. 44, the doped regions 140-2 may be spaced away from the interface between the outer spacers 134-2 and the gate 106-2 by a distance 184 between 0 and 10 nanometers. The interface material 141-2 is omitted from FIGS. 43 and 44 for ease of illustration.

Any of the quantum dot devices 100 disclosed herein may include one or more magnet lines. As used herein, a "magnet line" refers to a magnetic-field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 45:
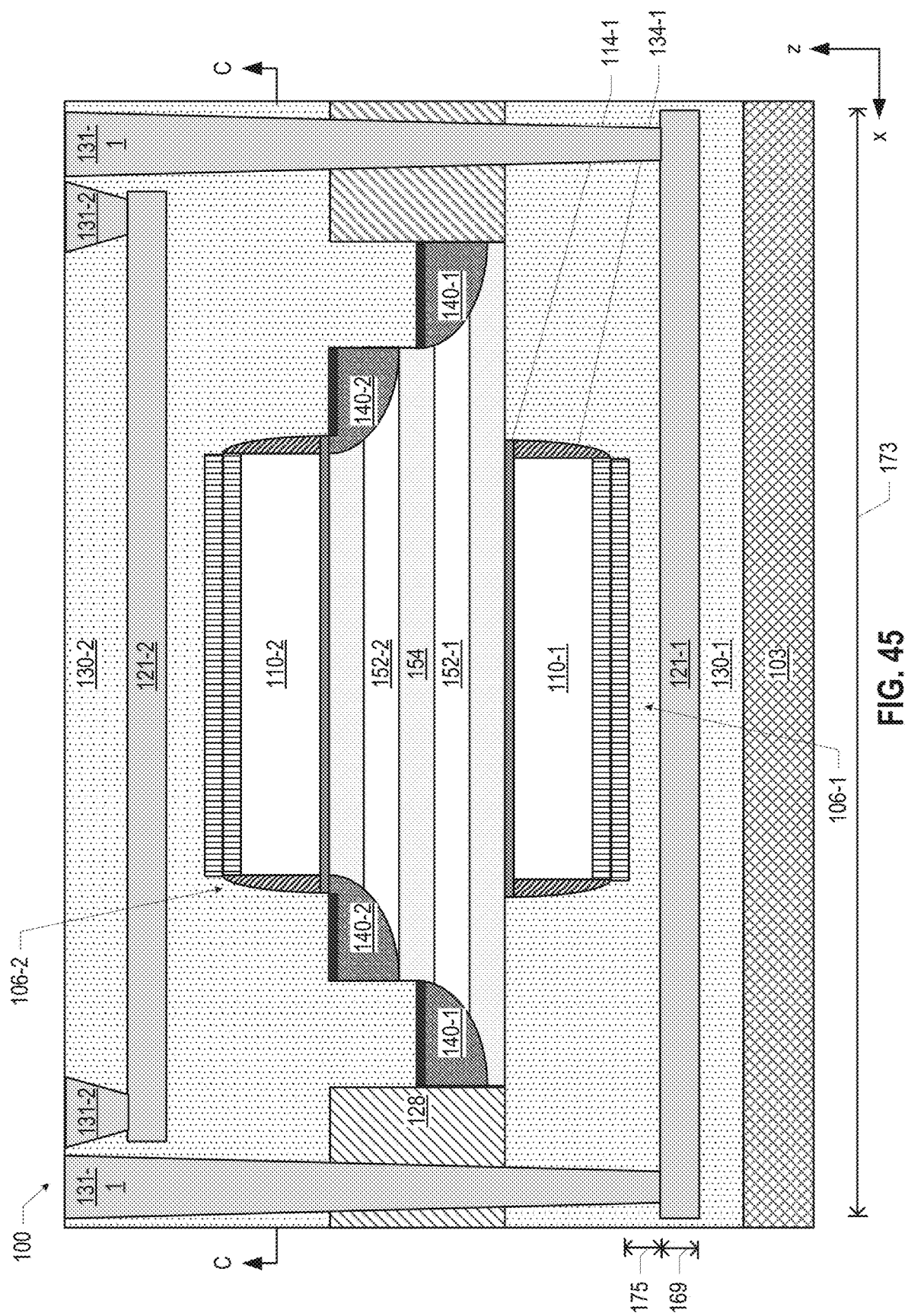
FIGS. 45-46 are cross-sectional views of a quantum dot device including magnet lines, in accordance with various embodiments.
Figure 46:
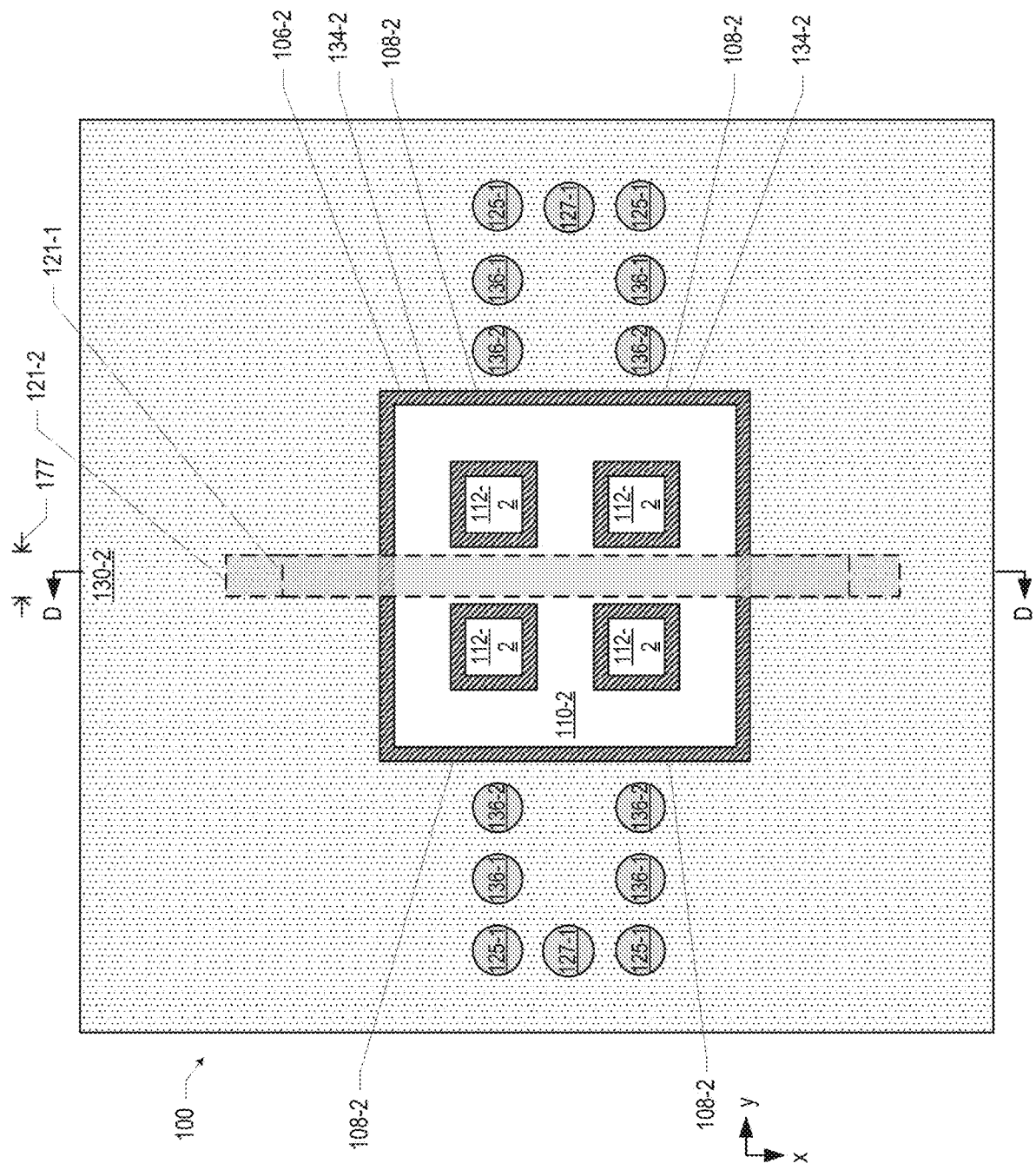

For example, FIGS. 45 and 46 are side and top views, respectively, of a quantum dot device 100 including multiple magnet lines 121. In particular, FIG. 46 illustrates the quantum dot device 100 taken along the section C-C of FIG. 45 (while FIG. 45 illustrates the quantum dot device 100 taken along the section D-D of FIG. 46). A magnet line 121-1 is disposed proximate to the quantum well layer 152-1, and a magnet line 121-2 is disposed proximate to the quantum well layer 152-2.

A magnet line 121 may be formed of a conductive material, and may be used to conduct current pulses that generate magnetic fields to influence the spin states of one or more of the quantum dots 142 that may form in the quantum dot device 100. In some embodiments, a magnet line 121 may conduct a pulse to reset (or "scramble")

nuclear and/or quantum dot spins. In some embodiments, a magnet line 121 may conduct a pulse to initialize an electron in a quantum dot in a particular spin state. In some embodiments, a magnet line 121 may conduct current to provide a continuous, oscillating magnet field to which the spin of a qubit may couple. A magnet line 121 may provide any suitable combination of these embodiments, or any other appropriate functionality.

In some embodiments, a magnet line 121 may be formed of copper. In some embodiments, a magnet line 121 may be formed of a superconductor, such as aluminum. In some embodiments, a magnet line 121 may be spaced apart from proximate gates 106/108 by a distance 175. The distance 175 may take any suitable value (e.g., based on the desired strength of magnetic field interaction with the quantum dots 142); in some embodiments, the distance 175 may be between 25 nanometers and 1 micron (e.g., between 50 nanometers and 200 nanometers). In embodiments in which a quantum dot device 100 includes multiple magnet lines 121, the distances 175 between the multiple magnet lines 121 and proximate gates 106/108 may be the same or different.

In some embodiments, a magnet line 121 may be formed of a magnetic material. For example, a magnetic material (such as cobalt) may be deposited in a trench in the insulating material 130 to provide a permanent magnetic field in the quantum dot device 100.

A magnet line 121 may have any suitable dimensions. For example, the magnet line 121 may have a thickness 169 between 25 and 100 nanometers. A magnet line 121 may have a width 177 between 25 and 100 nanometers. In some embodiments, the width 177 and thickness 169 of a magnet line 121 may be equal to the width and thickness, respectively, of other conductive lines in the quantum dot device 100 used to provide electrical interconnects (e.g., the conductive lines 193 and 196, discussed below with reference to FIG. 47), as known in the art, and may be formed using any processes known for forming conductive lines (e.g., plating in a trench, followed by planarization, or a semi-additive process). A magnet line 121 may have a length 173 that may depend on the number and dimensions of the gates 106/108 that are to form quantum dots 142 with which the magnet line 121 is to interact. The magnet lines 121 illustrated in FIGS. 45 and 46 are substantially linear, but this need not be the case; magnet lines 121 may take any suitable shape. Conductive vias 131 may contact the magnet lines 121.

In some embodiments, a quantum dot device 100 may include one magnet line 121, or no magnet lines 121; in other embodiments, a quantum dot device 100 may include two, three, four, or more magnet lines 121. Magnet lines 121 included in a quantum dot device 100 may be oriented in any desired manner relative to the gates 106/108 or other structural features of the quantum dot device 100; for example, one or more magnet lines 121 may be oriented from left to right according to the perspective of FIG. 46, in addition to or instead of one or more magnet lines 121 oriented up and down according to the perspective of FIG. 46 (as illustrated).

Figure 47:
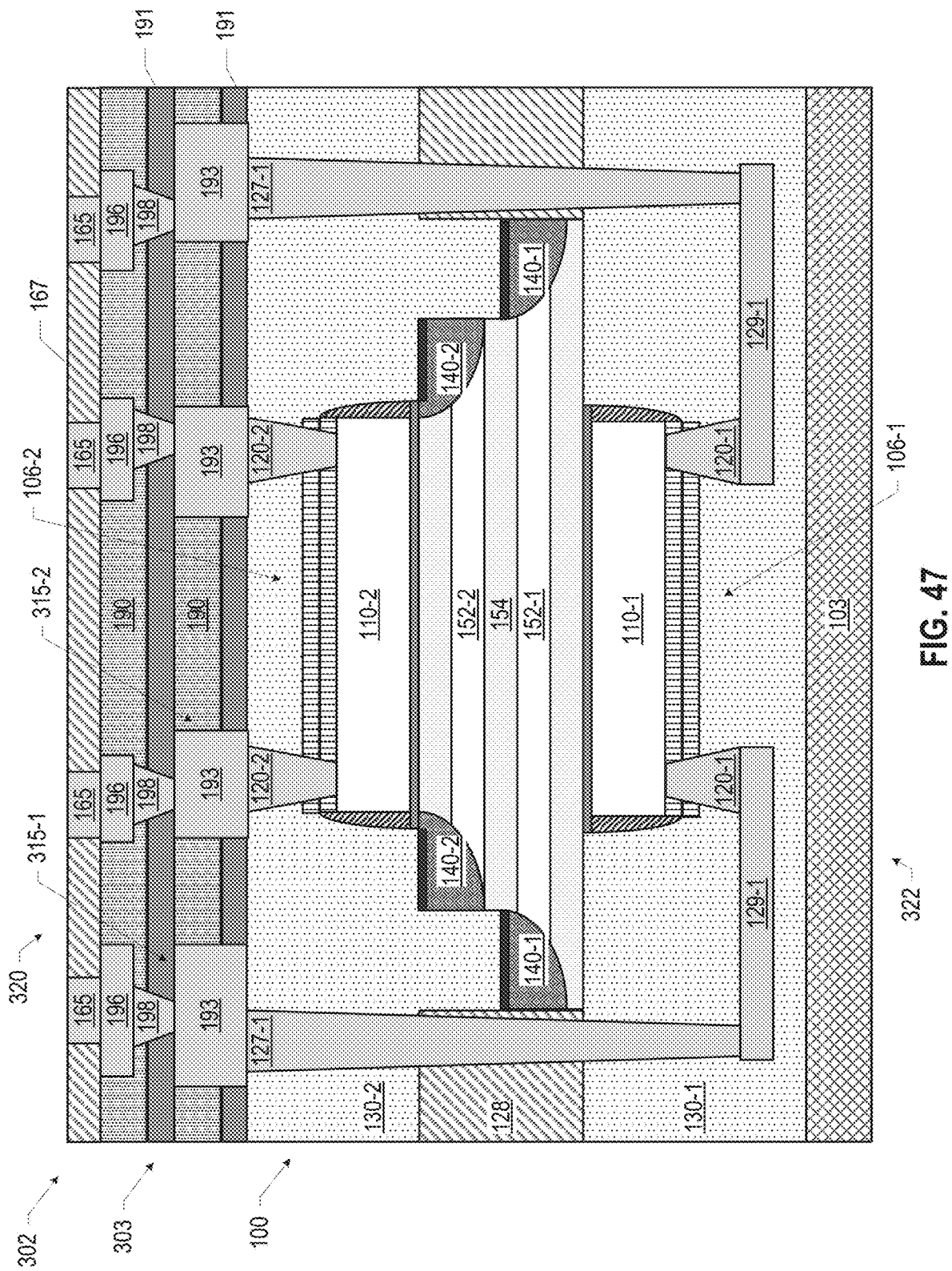
FIG. 47 is a cross-sectional view of a quantum dot device with multiple interconnect layers, in accordance with various embodiments.

In some embodiments, the quantum dot device 100 may be included in a die and coupled to a package substrate to form a quantum dot device package. For example, FIG. 47 is a side cross-sectional view of a die 302 including the quantum dot device 100 of FIG. 3 and conductive pathway layers 303 disposed thereon, while FIG. 48 is a side cross-sectional view of a quantum dot device package 300 in which the die 302 is coupled to a package substrate 304. Details of the quantum dot device 100 are omitted from FIG. 48 for ease of illustration. As noted above, the particular quantum dot device 100 illustrated in FIG. 48 may take the form of the quantum dot device 100 illustrated in FIG. 3, but any of the quantum dot devices 100 disclosed herein may be included in a die (e.g., the die 302) and coupled to a package substrate (e.g., the package substrate 304). In particular, any number of quantum dot formation regions 104, gates 106/108, doped regions 140, and other components discussed herein with reference to the quantum dot device 100 may be included in the die 302.

The die 302 may include a first face 320 and an opposing second face 322. The support 103 may be proximate to the second face 322, and conductive pathways 315 from the gates 106 may extend to conductive contacts 165 disposed at the first face 320. The conductive pathways 315 may include conductive vias, conductive lines, and/or any combination of conductive vias and lines. For example, FIG. 47 illustrates an embodiment in which the conductive pathways 315-1 (extending between the gate 106-1 and associated conductive contacts 165) include the conductive vias 120-1, conductive lines 129-1, conductive vias 127-1, conductive lines 193, conductive vias 198, and conductive lines 196. In the embodiment of FIG. 47, conductive pathways 315-2 (extending between the gate 106-2 and associated conductive contacts 165) include the conductive vias 120-2, conductive lines 193, conductive vias 198, and conductive lines 196. More or fewer structures may be included in the conductive pathways 315, and analogous conductive pathways 315 may be provided between ones of the conductive contacts 165 and the gates 108 and doped regions 140. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 190 and layers of nitride material 191 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 106/108, the doped regions 140, and the quantum well stack 146 (as well as the proximate conductive vias/lines) may be referred to as part of the "device layer" of the quantum dot device 100. The conductive lines 193 may be referred to as a Metal 1 or "M1" interconnect layer, and may couple the structures in the device layer to other interconnect structures. The conductive vias 198 and the conductive lines 196 may be referred to as a Metal 2 or "M2" interconnect layer, and may be formed directly on the M1 interconnect layer.

A solder resist material 167 may be disposed around the conductive contacts 165, and in some embodiments may extend onto the conductive contacts 165. The solder resist material 167 may be a polyimide or similar material, or may be any appropriate type of packaging solder resist material. In some embodiments, the solder resist material 167 may be a liquid or dry film material including photoimageable polymers. In some embodiments, the solder resist material 167 may be non-photoimageable (and openings therein may be formed using laser drilling or masked etch techniques). The conductive contacts 165 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 165 to mechanically and/or electrically couple the die 302 with another component (e.g., a circuit board), as discussed below. The conductive contacts 165 illustrated in FIG. 47 take the form of bond pads, but other first level interconnect structures may be used (e.g., posts) to route electrical signals to/from the die 302, as discussed below.

The combination of the conductive pathways and the proximate insulating material (e.g., the insulating material 130, the oxide material 190, and the nitride material 191) in the die 302 may provide an interlayer dielectric (ILD) stack of the die 302. As noted above, interconnect structures may be arranged within the quantum dot device 100 to route electrical signals according to a wide variety of designs (in particular, the arrangement is not limited to the particular configuration of interconnect structures depicted in FIG. 47 or any of the other accompanying figures, and may include more or fewer interconnect structures). During operation of the quantum dot device 100, electrical signals (such as power and/or input/output (I/O) signals) may be routed to and/or from the gates 106/108 and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313 (discussed below) and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 165, 179, and/or 199 may include aluminum, and the first level interconnects 306 and/or the second level interconnects 308 may include an indium-based solder.

In the quantum dot device package 300 (FIG. 48), first level interconnects 306 may be disposed between the first face 320 of the die 302 and the second face 326 of a package substrate 304. Having first level interconnects 306 disposed between the first face 320 of the die 302 and the second face 326 of the package substrate 304 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first level interconnects 306 may enable the quantum dot device package 300 to have much lower parasitic inductance relative to using wirebonds to couple the die 302 and the package substrate 304, which may result in an improvement in signal integrity for high-speed signals communicated between the die 302 and the package substrate 304.

The package substrate 304 may include a first face 324 and an opposing second face 326. Conductive contacts 199 may be disposed at the first face 324, and conductive contacts 179 may be disposed at the second face 326. Solder resist material 314 may be disposed around the conductive contacts 179, and solder resist material 312 may be disposed around the conductive contacts 199; the solder resist materials 314 and 312 may take any of the forms discussed above with reference to the solder resist material 167. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 199 to various ones of the conductive contacts 179, in any desired manner. The insulating material 310 may be a dielectric material (e.g., an ILD), and may take the form of any of the embodiments of the insulating material 130 disclosed herein, for example. The conductive pathways 313 may include one or more conductive vias 195 and/or one or more conductive lines 197, for example.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other throughholes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 165 of the die 302 may be electrically coupled to the conductive contacts 179 of the package substrate 304 via the first level interconnects 306. In some embodiments, the first level interconnects 306 may include solder bumps or balls (as illustrated in FIG. 48); for example, the first level interconnects 306 may be flip chip (or controlled collapse chip connection, "C4") bumps disposed initially on the die 302 or on the package substrate 304. Second level interconnects 308 (e.g., solder balls or other types of interconnects) may couple the conductive contacts 199 on the first face 324 of the package substrate 304 to another component, such as a circuit board (not shown). Examples of arrangements of electronics packages that may include an embodiment of the quantum dot device package 300 are discussed below with reference to FIG. 50. The die 302 may be brought in contact with the package substrate 304 using a pick-and-place apparatus, for example, and a reflow or thermal compression bonding operation may be used to couple the die 302 to the package substrate 304 via the first level interconnects 306.

The conductive contacts 165, 179, and/or 199 may include multiple layers of material that may be selected to serve different purposes. In some embodiments, the conductive contacts 165, 179, and/or 199 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 165, 179, and/or 199 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first level interconnects 306 include solder, the solder may be a low-temperature solder (e.g., a solder having a melting point below 100 degrees Celsius) so that it can be melted to couple the conductive contacts 165 and the conductive contacts 179 without having to expose the die 302 to higher temperatures and risk damaging the quantum dot device 100. Examples of solders that may be suitable include indium-based solders (e.g., solders including indium alloys). When low-temperature solders are used, however, these solders may not be fully solid during handling of the quantum dot device package 300 (e.g., at room temperature or temperatures between room temperature and 100 degrees Celsius), and thus the solder of the first level interconnects 306 alone may not reliably mechanically couple the die 302 and the package substrate 304 (and thus may not reliably electrically couple the die 302 and the package substrate 304). In some such embodiments, the quantum dot device package 300 may further include a mechanical stabilizer to maintain mechanical coupling between the die 302 and the package substrate 304, even when solder of the first level interconnects 306 is not solid. Examples of mechanical stabilizers may include an underfill material disposed between the die 302 and the package substrate 304, a corner glue disposed between the die 302 and the package substrate 304, an overmold material disposed around the die 302 on the package substrate 304, and/or a mechanical frame to secure the die 302 and the package substrate 304.

FIGS. 49A-B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 54) or other logic that is configured to store information in the memory devices or execute instructions stored in the memory array.

FIG. 50 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 50 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 48), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 50, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 50, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package 300 or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 50 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections).

As noted above, any suitable techniques may be used to manufacture the quantum dot devices 100 disclosed herein. FIG. 51 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum well stack may be provided. The quantum well stack may include a quantum well layer. For example, a quantum well stack 146 may be provided (e.g., on the substrate 144), and may include the quantum well layers 152-1 and/or the quantum well layer 152-2 (e.g., as discussed above with reference to FIGS. 4-5 and 35-36).

At 1004, a first gate may be formed above the quantum well stack. The first gate may include at least two openings spaced apart in a first dimension and at least two openings spaced apart in a second dimension perpendicular to the first dimension. For example, the gate 106-1 and/or the gate 106-2 may be formed, and may include openings 111-1 and 111-2, respectively (e.g., as discussed above with reference to FIGS. 10-15).

At 1006, a plurality of second gates may be formed above the quantum well stack. Individual ones of the second gates are at least partially disposed in corresponding individual ones of the openings. For example, a plurality of gates 108-1 may be formed at least partially in the openings 111-1, and/or a plurality of gates 108-2 may be formed at least partially in the openings 111-2 (e.g., as discussed above with reference to FIGS. 16-20).

A number of techniques are disclosed herein for operating a quantum dot device 100. FIGS. 52-53 are flow diagrams of particular illustrative methods 1020 and 1040, respectively, of operating a quantum dot device, in accordance with various embodiments. Although the operations discussed below with reference to the methods 1020 and 1040 are illustrated in a particular order and depicted once each, these operations may be repeated or performed in a different order (e.g., in parallel), as suitable. Additionally, various operations may be omitted, as suitable. Various operations of the methods 1020 and 1040 may be illustrated with reference to one or more of the embodiments discussed above, but the methods 1020 and 1040 may be used to operate any suitable quantum dot device (including any suitable ones of the embodiments disclosed herein).

Turning to the method 1020 of FIG. 52, at 1022, electrical signals may be applied to a first set of gates disposed proximate to a first face of a quantum well stack to cause a first quantum dot to form in a first quantum well layer in the quantum well stack under the first set of gates. The first set of gates may include at least three first gates and a second gate extending between at least two different pairs of first gates. For example, one or more voltages may be applied to the gates 106-1/108-1 on a quantum well stack 146 to cause at least one quantum dot 142-1 to form in the quantum well layer 152-1.

At 1024, electrical signals may be applied to a second set of gates disposed proximate to a second face of the quantum well stack to cause a second quantum dot to form in a second quantum well layer in the quantum well stack under the second set of gates. The first and second quantum well layers may be spaced apart by a barrier layer, and the first and second faces of the quantum well stack may be opposing faces of the quantum well stack. For example, one or more voltages may be applied to the gates 106-2/108-2 on a quantum well stack 146 to cause at least one quantum dot 142-2 to form in the quantum well layer 152-2.

At 1026, a quantum state of the first quantum dot may be sensed with the second quantum dot. For example, a quantum state of a quantum dot 142-1 in the quantum well layer 152-1 may be sensed by a quantum dot 142-2 in the quantum well layer 152-2. Alternately, at 1022, electrical signals may be applied to the gates 106-2/108-2 to cause at least one quantum dot 142-2 to form in the quantum well layer 152-2; at 1024, electrical signals may be applied to the gates 106-1/108-1 to cause at least one quantum dot 142-1 to form in the quantum well layer 152-1; and, at 1026, a quantum state of a quantum dot 142-2 may be sensed by a quantum dot 142-1.

Turning to the method 1040 of FIG. 53, at 1042, electrical signals may be provided to a plurality of first gates disposed above a quantum well stack. The quantum well stack may include a quantum well layer, at least two of the first gates may be spaced apart in a first dimension above the quantum well stack, at least two of the first gates may be spaced apart in a second dimension above the quantum well stack, and the first and second dimensions may be perpendicular. For example, electrical signals (e.g., voltages) may be provided to the gates 108-1 and/or the gates 108-2; the gates 108-1 may be disposed above the quantum well layer 152-1 and the gates 108-2 may be disposed above the quantum well layer 152-2.

At 1044, electrical signals may be provided to a second gate disposed above the quantum well stack. The second gate may extend between at least two of the first gates spaced apart in the first dimension. The second gate may also extend between at least two of the first gates spaced apart in the second dimension. The electrical signals provided to the plurality of first gates (at 1042) and to the second gate (at 1044) may cause at least one quantum dot to form in the quantum well layer. For example, in some embodiments, quantum dots 142 may form in a quantum well layer 152 below the gates 108 (e.g., when the gates 108 act as "plunger" gates). In some embodiments, a voltage applied to a gate 106 may cause a potential barrier to form in a quantum well layer 152 under the second gate (e.g., when the gate 106 acts as a "barrier" gate).

Figure 54:
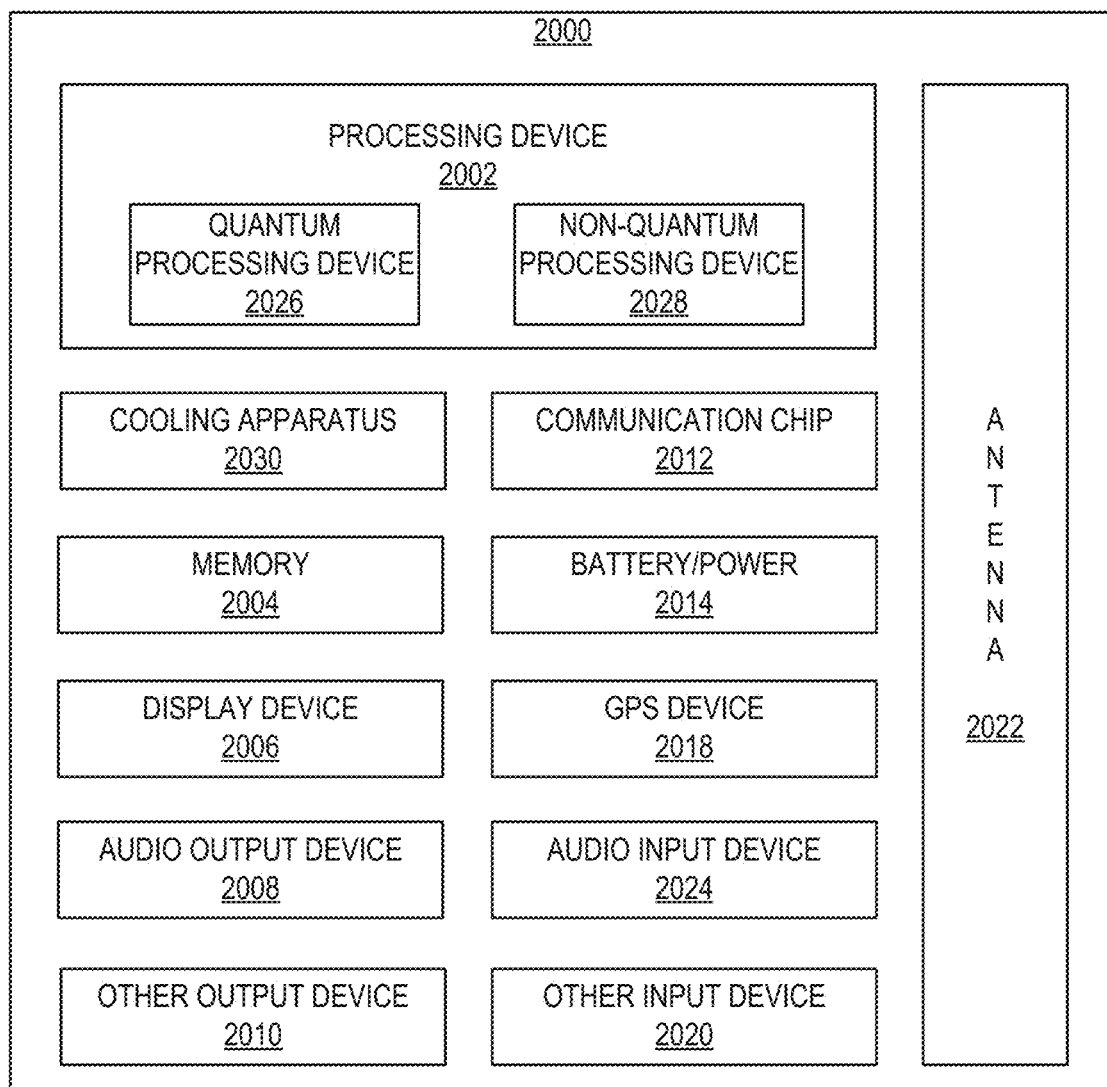
FIG. 54 is a block diagram of an example quantum computing device that may include any of the quantum dot devices disclosed herein, in accordance with various embodiments.

FIG. 54 is a block diagram of an example quantum computing device 2000 that may include any of the quantum dot devices disclosed herein. A number of components are illustrated in FIG. 54 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 54, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Although various ones of the embodiments illustrated in the accompanying drawings may include exactly two quantum well layers 152, this is simply for illustrative purposes, and any of the quantum dot devices 100 (or associated methods or devices) discussed herein may include three or more quantum well layers 152, in accordance with the teachings of the present disclosure. Thus, various ones of the quantum dot devices 100 disclosed herein may be regarded as stacked quantum well structures including two or more quantum well layers 152. For example, a double quantum well structure in a quantum dot device 100 may include two or more quantum well layers 152.

The following paragraphs provide examples of various ones of the embodiments disclosed herein.

Example 1 is a quantum dot device, including: a quantum well stack including a quantum well layer; a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and a second gate disposed above the quantum well stack, wherein the second gate extends between at least two of the first gates spaced apart in the first dimension, and the second gate extends between at least two of the first gates spaced apart in the second dimension.

Example 2 may include the subject matter of Example 1, and may further specify that the plurality of first gates includes at least three first gates.

Example 3 may include the subject matter of any of Examples 1-2, and may further specify that the plurality of first gates are arranged in an n×m array, n is greater than 1, and m is greater than 1.

Example 4 may include the subject matter of any of Examples 1-3, and may further specify that the second gate includes a cross-shaped portion.

Example 5 may include the subject matter of any of Examples 1-4, and may further specify that the second gate includes a perimeter portion extending around the plurality of first gates.

Example 6 may include the subject matter of any of Examples 1-5, and may further specify that the second gate includes a plurality of individual openings in which individual ones of the first gates are disposed.

Example 7 may include the subject matter of any of Examples 1-6, and may further specify that the quantum well layer is a first quantum well layer, the quantum well stack includes a second quantum well layer, and the quantum dot device further includes a plurality of third gates disposed below the quantum well stack, wherein the second quantum well layer is disposed between the plurality of third gates and the first quantum well layer.

Example 8 may include the subject matter of Example 7, and may further specify that at least two of the third gates are spaced apart in the first dimension below the quantum well stack, and at least two of the third gates are spaced apart in the second dimension below the quantum well stack.

Example 9 may include the subject matter of Example 8, and may further include a fourth gate disposed below the quantum well stack, wherein the fourth gate extends between at least two of the third gates spaced apart in the first dimension, and the fourth gate extends between at least two of the third gates spaced apart in the second dimension.

Example 10 may include the subject matter of Example 9, and may further specify that the second gate and the fourth gate have a same shape.

Example 11 may include the subject matter of any of Examples 8-10, and may further specify that an arrangement of the third gates below the quantum well stack is a same arrangement as an arrangement of the first gates above the quantum well stack.

Example 12 may include the subject matter of any of Examples 8-11, and may further specify that individual ones of the first gates above the quantum well stack correspond to individual ones of the third gates below the quantum well stack.

Example 13 may include the subject matter of any of Examples 8-12, and may further specify that an arrangement of the third gates is a mirror image of an arrangement of the first gates around the quantum well stack.

Example 14 may include the subject matter of any of Examples 7-13, and may further specify that a barrier layer is disposed between the first and second quantum well layers.

Example 15 may include the subject matter of Example 14, and may further specify that the barrier layer is formed of silicon germanium.

Example 16 may include the subject matter of any of Examples 7-15, and may further include: an insulating material disposed above the quantum well stack; first and second conductive pathways that extend through the insulating material to conductively contact the first quantum well layer; and third and fourth conductive pathways that extend through the insulating material to conductively contact the second quantum well layer.

Example 17 may include the subject matter of Example 16, and may further specify that the first and second conductive pathways conductively contact the first quantum well layer via first doped regions in the quantum well stack, and the third and fourth conductive pathways contact the second quantum well layer via second doped regions in the quantum well stack.

Example 18 may include the subject matter of any of Examples 1-17, and may further specify that the quantum well layer is formed of silicon or germanium.

Example 19 may include the subject matter of Example 18, and may further specify that the quantum well stack includes a barrier layer including silicon germanium.

Example 20 may include the subject matter of any of Examples 1-19, and may further include: an insulating material disposed above the quantum well stack; and first and second conductive pathways that extend through the insulating material to conductively contact the quantum well layer.

Example 21 may include the subject matter of any of Examples 1-20, and may further specify that first and second conductive pathways conductively contact the first quantum well layer via first doped regions in the quantum well stack.

Example 22 may include the subject matter of any of Examples 1-21, and may further include spacers disposed between individual first gates and proximate portions of the second gate.

Example 23 may include the subject matter of any of Examples 1-22, and may further include spacer material disposed around individual ones of the first gates.

Example 24 is a method of operating a quantum dot device, including: applying electrical signals to a first set of gates disposed proximate to a first face of a quantum well stack to cause a first quantum dot to form in a first quantum well layer in the quantum well stack under the first set of gates, wherein the first set of gates includes at least three first gates and a second gate extending between at least two different pairs of first gates; applying electrical signals to a second set of gates disposed proximate to a second face of the quantum well stack to cause a second quantum dot to form in a second quantum well layer in the quantum well stack under the second gate, wherein the first and second quantum well layers are spaced apart by a barrier layer, and the first and second faces of the quantum well stack are opposing faces of the quantum well stack; and sensing a quantum state of the first quantum dot with the second quantum dot.

Example 25 may include the subject matter of Example 24, and may further specify that sensing the quantum state of the first quantum dot with the second quantum dot comprises sensing a spin state of the first quantum dot with the second quantum dot.

Example 26 may include the subject matter of any of Examples 24-25, and may further include applying the electrical signals to the first set of gates to cause a third quantum dot to form in the first quantum well layer.

Example 27 may include the subject matter of Example 26, and may further include applying the electrical signals to the first set of gates to provide a potential barrier between the first quantum dot and the third quantum dot.

Example 28 is a method of manufacturing a quantum dot device, including: providing a quantum well stack; forming a first gate above the quantum well stack, wherein the first gate includes at least two openings spaced apart in a first dimension and at least two openings spaced apart in a second dimension perpendicular to the first dimension; and forming a plurality of second gates above the quantum well stack, wherein individual ones of the second gates are at least partially disposed in corresponding individual ones of the openings.

Example 29 may include the subject matter of Example 28, and may further specify that the first gate and the plurality of second gates are formed above a first face of the quantum well stack, and the method further includes forming a set of gates above a second face of the quantum well stack, wherein the second face of the quantum well stack is opposite to the first face of the quantum well stack.

Example 30 may include the subject matter of any of Examples 28-29, and may further specify that providing the quantum well stack includes providing the quantum well stack on a support, and the method further includes, after forming the first gate and the plurality of second gates, separating the quantum well stack from the support.

Example 31 may include the subject matter of any of Examples 28-30, and may further include: removing at least some of the quantum well stack to form a recess; and providing a dopant in the quantum well stack proximate to the recess.

Example 32 may include the subject matter of any of Examples 28-31, and may further specify that insulating material is disposed around a periphery of the quantum dot device, and the method further includes forming conductive pathways to the first gate and the plurality of second gates, wherein the conductive pathways extend from the first gate and the plurality of second gates to the insulating material disposed around the periphery.

Example 33 is a quantum computing device, including: a quantum processing device, wherein the quantum processing device includes a quantum well stack including an active quantum well layer and a read quantum well layer spaced apart by a barrier layer, a first set of gates to control formation of quantum dots in the active quantum well layer, and a second set of gates to control formation of quantum dots in the read quantum well layer, and wherein the first set of gates includes at least three first gates and a second gate extending between at least two different pairs of first gates; a non-quantum processing device, coupled to the quantum processing device, to control voltages applied to the first set of gates and the second set of gates; and a memory device to store data generated by the read quantum well layer during operation of the quantum processing device.

Example 34 may include the subject matter of Example 33, and may further include a cooling apparatus to maintain the temperature of the quantum processing device below 5 degrees Kelvin.

Example 35 may include the subject matter of Example 34, and may further specify that the cooling apparatus includes a dilution refrigerator.

Example 36 may include the subject matter of Example 34, and may further specify that the cooling apparatus includes a liquid helium refrigerator.

Example 37 may include the subject matter of any of Examples 33-36, and may further specify that the memory device is to store instructions for a quantum computing algorithm to be executed by the quantum processing device.

Example 38 may include the subject matter of any of Examples 33-37, and may further specify that the first set of gates and the second set of gates each include a plurality of gates arranged in a two-dimensional array.

The invention claimed is:

1. A device, comprising:
    a quantum well stack of a quantum dot device, the quantum well stack including a quantum well layer;
    a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and
    a second gate disposed above the quantum well stack, wherein the second gate extends between at least two of the first gates spaced apart in the first dimension, and the second gate extends between at least two of the first gates spaced apart in the second dimension.

2. The device of claim 1, wherein the plurality of first gates includes at least three first gates.

3. The device of claim 1, wherein the plurality of first gates are arranged in an nxm array, n is greater than 1, and m is greater than 1.

4. The device of claim 1, wherein the second gate includes a cross-shaped portion.

5. The device of claim 1, wherein the second gate includes a perimeter portion extending around the plurality of first gates.

6. The device of claim 1, wherein the second gate includes a plurality of individual openings in which individual ones of the first gates are disposed.

7. The device of claim 1, wherein the quantum well layer is a first quantum well layer, the quantum well stack includes a second quantum well layer, and the device further includes:
a plurality of third gates disposed below the quantum well stack, wherein the second quantum well layer is disposed between the plurality of third gates and the first quantum well layer.

8. The device of claim 7, wherein at least two of the third gates are spaced apart in the first dimension below the quantum well stack, and at least two of the third gates are spaced apart in the second dimension below the quantum well stack.

9. The device of claim 8, further comprising:
a fourth gate disposed below the quantum well stack, wherein the fourth gate extends between at least two of the third gates spaced apart in the first dimension, and the fourth gate extends between at least two of the third gates spaced apart in the second dimension.

10. The device of claim 8, wherein individual ones of the first gates above the quantum well stack correspond to individual ones of the third gates below the quantum well stack.

11. The device of claim 8, wherein an arrangement of the third gates is a mirror image of an arrangement of the first gates around the quantum well stack.

12. The device of claim 7, wherein a barrier layer is disposed between the first and second quantum well layers.

13. The device of claim 12, wherein the barrier layer is formed of silicon germanium.

14. The device of claim 1, further comprising:
an insulating material disposed above the quantum well stack; and
first and second conductive pathways that extend through the insulating material to conductively contact the quantum well layer.

15. The device of claim 1, wherein first and second conductive pathways conductively contact the first quantum well layer via first doped regions in the quantum well stack.

16. The device of claim 1, further comprising:
spacer material disposed around individual ones of the first gates.

17. A method of manufacturing a quantum dot device, comprising:
providing a quantum well stack;
forming a first gate above the quantum well stack, wherein the first gate includes at least two openings spaced apart in a first dimension and at least two openings spaced apart in a second dimension perpendicular to the first dimension; and
forming a plurality of second gates above the quantum well stack, wherein individual ones of the second gates are at least partially disposed in corresponding individual ones of the openings.

18. The method of claim 17, wherein the first gate and the plurality of second gates are formed above a first face of the quantum well stack, and the method further comprises:
forming a set of gates above a second face of the quantum well stack, wherein the second face of the quantum well stack is opposite to the first face of the quantum well stack.

19. A quantum computing device, comprising:
a quantum processing device, wherein the quantum processing device includes a quantum well stack including an active quantum well layer and a read quantum well layer spaced apart by a barrier layer, a first set of gates to control formation of quantum dots in the active quantum well layer, and a second set of gates to control formation of quantum dots in the read quantum well layer, and wherein the first set of gates includes at least three first gates and a second gate extending between at least two different pairs of first gates;
a non-quantum processing device, coupled to the quantum processing device, to control voltages applied to the first set of gates and the second set of gates; and
a memory device to store data generated by the read quantum well layer during operation of the quantum processing device.

20. The quantum computing device of claim 19, wherein the first set of gates and the second set of gates each include a plurality of gates arranged in a two-dimensional array.

* * * * *